(12) United States Patent
Ogawa et al.

(10) Patent No.: US 9,157,789 B2
(45) Date of Patent: Oct. 13, 2015

(54) ELECTROMAGNETIC WAVE DETECTOR AND ELECTROMAGNETIC WAVE DETECTOR ARRAY

(71) Applicant: Mitsubishi Electric Corporation, Chiyoda-ku (JP)

(72) Inventors: Shimpei Ogawa, Chiyoda-ku (JP); Daisuke Fujisawa, Chiyoda-ku (JP); Tomohiro Maegawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/259,324

(22) Filed: Apr. 23, 2014

(65) Prior Publication Data

US 2014/0319357 A1    Oct. 30, 2014

(30) Foreign Application Priority Data

| Apr. 26, 2013 | (JP) | 2013-094455 |
| Apr. 26, 2013 | (JP) | 2013-094483 |
| Jul. 29, 2013 | (JP) | 2013-156307 |
| Jul. 29, 2013 | (JP) | 2013-156310 |
| Mar. 7, 2014 | (JP) | 2014-044900 |

(51) Int. Cl.
| G01J 5/20 | (2006.01) |
| G01J 1/02 | (2006.01) |
| G01J 1/04 | (2006.01) |
| G01J 5/04 | (2006.01) |
| G01J 5/08 | (2006.01) |
| G02B 5/00 | (2006.01) |
| H01L 27/12 | (2006.01) |
| H01L 31/108 | (2006.01) |
| G02B 5/18 | (2006.01) |

(52) U.S. Cl.
CPC .................. *G01J 1/0204* (2013.01); *G01J 1/04* (2013.01); *G01J 1/0429* (2013.01); *G01J 5/046* (2013.01); *G01J 5/0825* (2013.01); *G01J 5/0853* (2013.01); *G01J 5/0881* (2013.01); *G01J 5/20* (2013.01); *G02B 5/008* (2013.01); *H01L 27/12* (2013.01); *H01L 31/1085* (2013.01); *G02B 5/1809* (2013.01)

(58) Field of Classification Search
CPC ........................................................ G01J 5/20
See application file for complete search history.

(56) References Cited

U.S. PATENT DOCUMENTS

| 8,653,431 | B2 | 2/2014 | Ogawa |
| 2011/0116168 | A1* | 5/2011 | Nikoobakht .................. 359/585 |
| 2013/0234006 | A1 | 9/2013 | Ogawa |
| 2013/0294729 | A1* | 11/2013 | Layton et al. .................... 385/40 |
| 2014/0056551 | A1* | 2/2014 | Liu et al. .......................... 385/2 |

FOREIGN PATENT DOCUMENTS

| JP | 2013-502735 | 1/2013 |
| WO | WO 2011/023603 A2 | 3/2011 |

* cited by examiner

*Primary Examiner* — David Porta
*Assistant Examiner* — Hugh H Maupin
(74) *Attorney, Agent, or Firm* — Oblon, McClelland, Maier & Neustadt, L.L.P.

(57) ABSTRACT

An electromagnetic wave detector that detects incident light by converting the incident light into an electric signal includes a flat metal layer formed on a supporting substrate, an intermediate layer formed on the metal layer, a graphene layer formed on the intermediate layer, isolated metals periodically formed on the graphene layer, and electrodes arranged oppositely on both sides of the isolated metals. Depending on a size of a planar shape of each of the isolated metals, light having a predetermined wavelength at which surface plasmon occurs is determined out of the incident light, and the light having the predetermined wavelength is absorbed to detect a change in the electric signal generated in the graphene layer.

20 Claims, 41 Drawing Sheets

In Normal Space          Optical Absorption Rate: a few %

In Resonator

Absorpting all the localized light

Fig. 5
Ellipsis
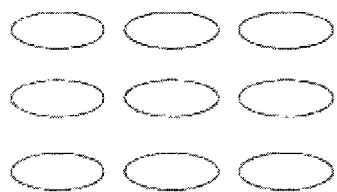
Rectangle
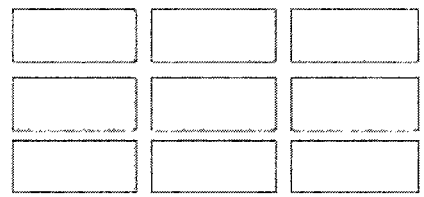
Triangle
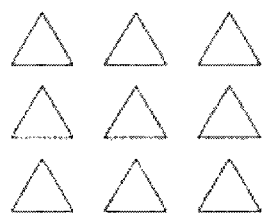
Fig. 6
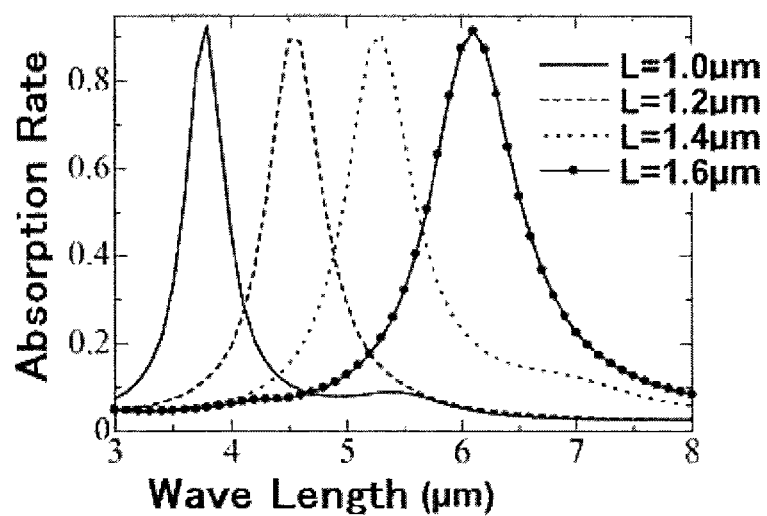

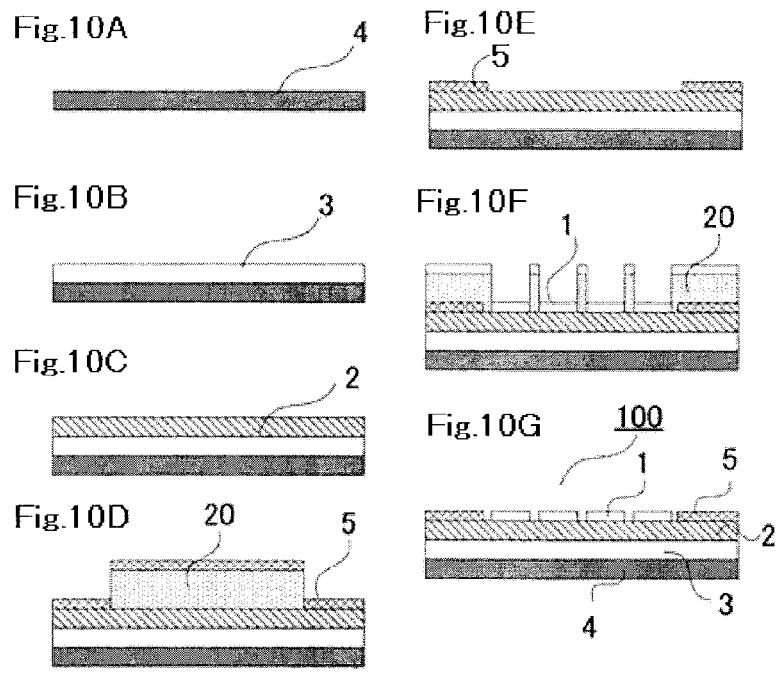
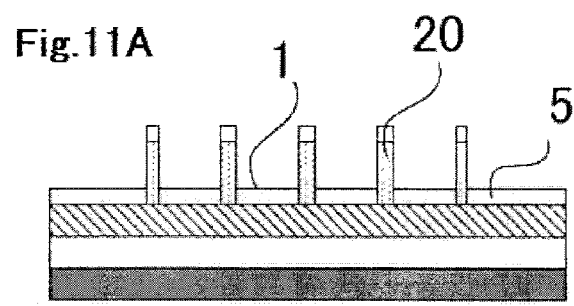
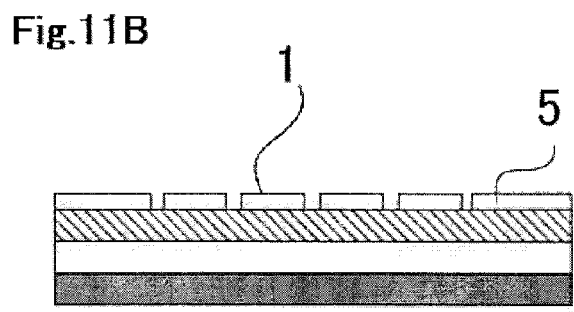

20

1   5

Fig. 40
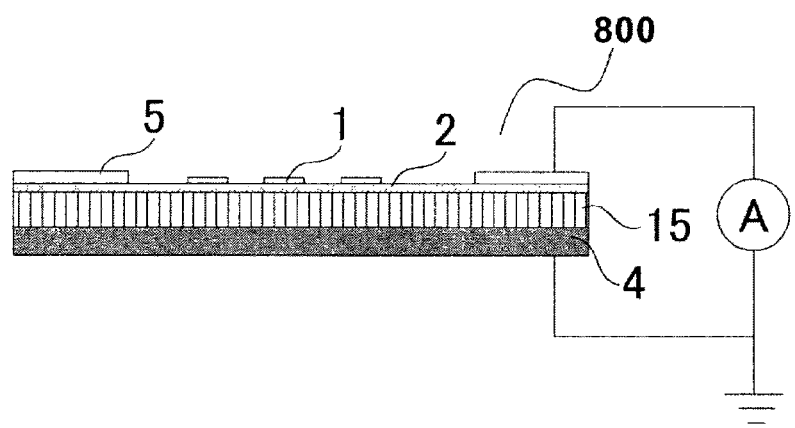
Fig.41A
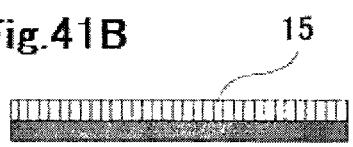
Fig.41B
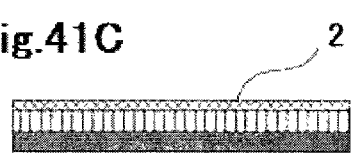
Fig.41C
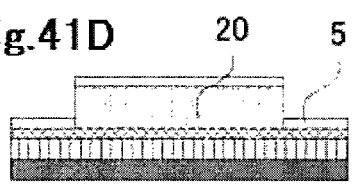
Fig.41D
Fig.41E
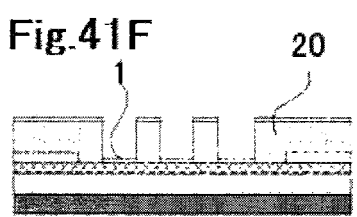
Fig.41F
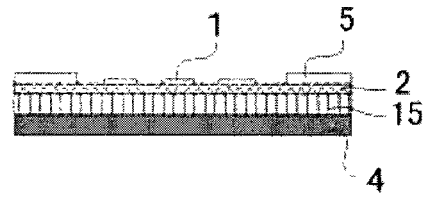
Fig.41G In Normal Space    Optical Absorption Rate: a few %

In Resonator

Absorpting all the localized light

ELECTROMAGNETIC WAVE DETECTOR AND ELECTROMAGNETIC WAVE DETECTOR ARRAY

BACKGROUND OF THE INVENTION

1. Field of the Invention

The present invention relates to an electromagnetic wave detector and an electromagnetic wave detector array, and more particularly to an electromagnetic wave detector and an electromagnetic wave detector array using single or multi-layer graphene as a photodetecting layer.

2. Description of Related Art

In conventional electromagnetic wave detectors, semiconductor materials are used for photodetecting layers. However, because the semiconductor material has a band gap, only light having larger energy than the band gap can be detected, and therefore, the semiconductor cannot be said to be optimum for an electromagnetic wave detector. Therefore, attention has been focused on graphene as a next-generation light detection material. Graphene is a monoatomic layer of a two-dimensional carbon crystal, and single-layer graphene has a very small thickness of 0.34 nm which is equivalent to one carbon atom. Graphene has a carbon atom in each chain arranged in a hexagon shape, and is reported to be able to increase carrier mobility to ten thousand $cm^2/Vs$ or more. Researches and developments of using graphene for wirings of transistor channel layers and LSI are also being progressed. By utilizing such unique electric properties of graphene, there has been recently proposed the use of graphene, not only as materials of high-speed devices, LSI wirings, and electrodes, but also as materials of photodetecting layers of electromagnetic wave detectors.

For example, JP 2013-502735 A discloses an electromagnetic wave detector that has a graphene channel layer deposited on a gate oxide film on a substrate, and has source and drain contact regions formed on both ends on the graphene. It is described that the graphene of the photodetecting layer of the electromagnetic wave detector is zero or a very small band gap material, and can detect light in a broad bandwidth. Further, it is described that a carrier 1 of graphene in a high electric field is ten times to a hundred times of the carrier transfer rate in a conventional semiconductor.

However, because a photoabsorbing layer formed of only graphene has a very low optical absorption rate of a few percent, the photoabsorbing layer cannot effectively acquire optical information as an electromagnetic wave detector. Further, the conventional electromagnetic wave detector using graphene does not have a function of detecting polarization of incident light. Therefore, in order to detect specific polarization, it has been necessary to provide a polarization filter or the like on a light incident surface.

SUMMARY OF THE INVENTION

Therefore, an object of the present invention is to provide an electromagnetic wave detector that highly-efficiently absorbs light having a desired wavelength, increases detection efficiency of light having a specific wavelength, can be miniaturized, and has high detection efficiency of polarization.

The present invention provides an electromagnetic wave detector that detects incident light by converting the incident light into an electric signal. The electromagnetic wave detector includes a flat metal layer formed on a supporting substrate, an intermediate layer formed on the metal layer, a graphene layer formed on the intermediate layer, isolated metals periodically formed on the graphene layer, and electrodes arranged oppositely on both sides of the isolated metals. Depending on a size of a planar shape of each of the isolated metals, light having a predetermined wavelength at which a surface plasmon occurs is determined out of the incident light, and the light having the predetermined wavelength is absorbed to detect a change in the electric signal generated in the graphene layer.

The present invention also provides an electromagnetic wave detector that detects incident light by converting the incident light into an electric signal. The electromagnetic wave detector includes a flat metal layer formed on a supporting substrate, an intermediate layer formed on the metal layer, isolated metals periodically formed on the intermediate layer, electrodes arranged oppositely on both sides of the isolated metals, and a graphene layer formed on the intermediate layer so as to cover the isolated metals and the electrodes. Depending on a size of a planar shape of each isolated metal, light having a predetermined wavelength at which a surface plasmon occurs is determined out of the incident light, and the light having the predetermined wavelength is absorbed to detect a change in the electric signal generated in the graphene layer.

By using the electromagnetic wave detector according to the present invention, by isolated metals—graphene—an intermediate layer—a metal layer, or by graphene—isolated metals—an intermediate layer—a metal layer, there is formed a cavity in which a specific surface plasmon mode or a resonance mode is localized near the graphene, and an electromagnetic field of a specific wavelength is concentrated in the graphene. Therefore, resonance sandwiching the graphene is generated, the optical absorption rate increases, and high-sensitivity photodetection becomes possible.

BRIEF DESCRIPTION OF THE DRAWINGS

FIG. 5 is a top view for explaining shapes of isolated metals of the electromagnetic wave detector according to Embodiment 1 of the present invention;

FIG. 6 shows electromagnetic wave absorption characteristics of the electromagnetic wave detector according to Embodiment 1 of the present invention;

FIGS. 10A to 10G are sectional views of a manufacturing process of the electromagnetic wave detector according to Embodiment 1 of the present invention;

FIGS. 11A and 11B are sectional views of the manufacturing process of the electromagnetic wave detector according to Embodiment 1 of the present invention;

FIG. 40 is a sectional view of an electromagnetic wave detector according to Embodiment 18 of the present invention;

FIGS. 41A to 41G are sectional views of a manufacturing process of the electromagnetic wave detector according to Embodiment 18 of the present invention;

DETAILED DESCRIPTION OF THE PREFERRED EMBODIMENTS

In the embodiments of the present invention, detectors of an electromagnetic wave in the infrared wavelength region will be described as examples of an electromagnetic wave detector. However, the present invention is also effective as a detector of wavelength regions other than infrared rays, for example, visible, near infrared, and terahertz (THz) wavelength regions, and microwave regions. Further, light in the present invention is also described as an electromagnetic wave. Graphene may be transition metal dichalcogenide ($MX_2$) such as molybdenum disulfide ($MoS_2$) having a two-dimensional characteristic substantially equivalent to that of graphene. In this case, a transition metal is M (=Nb, Ta, Ti, Mo, etc.), and chalcogenide is X (=S, Se, Te).

Graphene is a very thin monoatomic layer. Therefore, even when graphene is present below or above periodic isolated metals, graphene has an equivalent effect in the performance of a detector. Therefore, in Embodiment 1, there will be described a case where graphene is present only below the periodic isolated metal. When graphene is present above the periodic isolated metals, graphene has absorption characteristics equivalent to those in Embodiments 4 and 24, for example. Therefore, a detailed description of the absorption characteristics will be omitted in Embodiments 4 and 24.

In each embodiment, the same element will be indicated with the same reference symbol, and a description thereof will be omitted.

Hereinafter, in Embodiments 1 to 20, a case where the isolated metals forma two-dimensional periodic structure will be described. In Embodiments 21 to 40, a case where the isolated metals form a one-dimensional periodic structure will be described.

Embodiment 1

Figure 1:
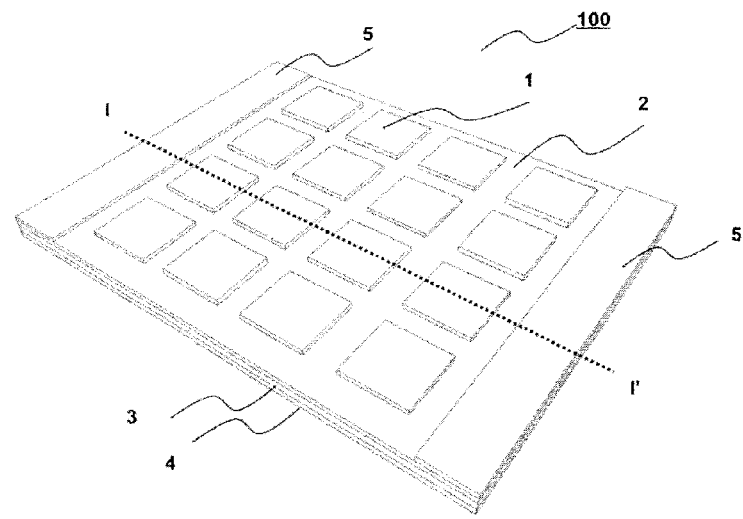
FIG. 1 is a perspective view of an electromagnetic wave detector according to Embodiment 1 of the present invention.
Figure 2:
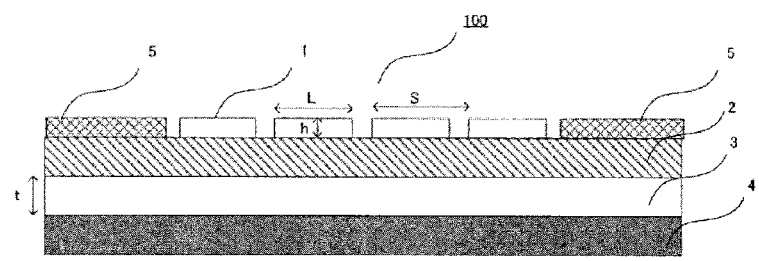
FIG. 2 is a sectional view of the electromagnetic wave detector according to Embodiment 1 of the present invention.
Figure 3:
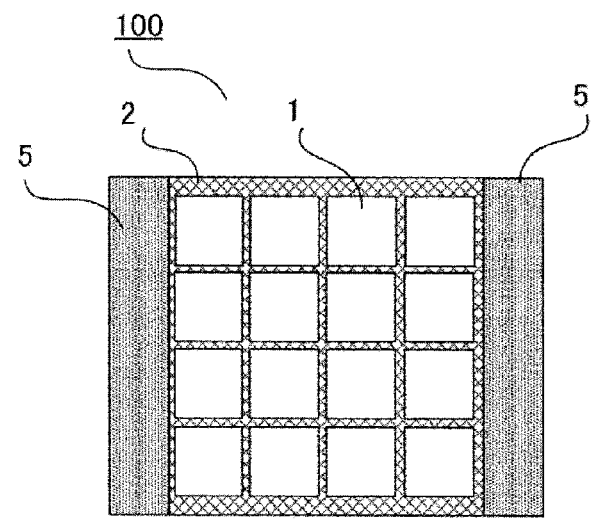
FIG. 3 is a top view of an incident surface of the electromagnetic wave detector according to Embodiment 1 of the present invention.

FIG. 1 is a perspective view of an electromagnetic wave detector according to Embodiment 1 of the present invention, the whole electromagnetic wave detector being denoted by 100. FIG. 2 is a sectional view of the electromagnetic wave detector taken along I-I' in FIG. 1. FIG. 3 is a top view of the electromagnetic wave detector in FIG. 2 when viewed from an upper surface (also referred to as a "surface" or an "incident surface").

As shown in FIGS. 1 to 3, and particularly, in FIG. 2, in the electromagnetic wave detector 100, a metal layer 4 is formed on a substrate (not shown), an insulating layer 3 having a thickness t is provided on an upper surface of the metal layer 4, and a graphene layer 2 is provided on an upper surface of the insulating layer 3. On the graphene layer 2, isolated metals 1 are arranged in a matrix form, each isolated metal 1 in a square shape having a length L in one side and a thickness h, so that periods of the isolated metals 1 in two orthogonal directions respectively become S. On the other hand, two electrodes 5 are arranged on the graphene layer 2 at opposite positions with the isolated metals 1 therebetween. The shape of the electrode 5 is not particularly limited as long as the electrode 5 has a size and a thickness capable of outputting electric signals.

The graphene layer 2 may be a single layer or two or more layers. When a lamination number of the graphene layer 2 is increased, the optical absorption rate increases. Two arbitrary laminated layers may have a laminate structure in which orientations of lattice vectors do not coincide in a hexagonal lattice, that is, crystal orientations are displaced, or a laminate structure in which lattice vectors completely coincide with each other.

The substrate on which the metal layer 4 is formed may be a semiconductor substrate or the like as long as it can hold the electromagnetic wave detector according to the present invention. Alternatively, a high-resistance silicon substrate having an insulation property, or a substrate having an increased insulation property by forming a thermal oxide film may be used as appropriate.

Although the number and the arrangement of the isolated metals 1 are represented by 4×4 in FIGS. 1 to 3 for the sake of the description, for example, the number and the arrangement are not limited to 4×4, and may be appropriately selected. The isolated metals 1 may be arranged in a square lattice, a triangular lattice, or a hexagonal lattice in a two-dimensional matrix form, or may be arranged one dimensionally. Here, the arrangement in the square lattice shape will be described as a representative example.

The isolated metals 1 and the metal layer 4 are made of metal. Particularly, it is preferable that the isolated metals 1 and the metal layer 4 are formed of metal that can easily generate surface plasmon resonance, or formed of metal having high reflectance in a target waveform in the infrared wavelength region and the like. For example, the isolated metals 1 and the metal layer 4 are formed of Au, Ag, Cu, Al, Ni, Cr, or the like. That is, materials having a negative dielectric constant are preferable. However, when a metal with a large loss is used, wavelength selectivity, that is, monochromaticity may be degraded, such as spread of a half-value width in the absorption rate characteristics. Accordingly, a kind of metal is appropriately selected depending on a half-value width of a required detection wavelength. On the contrary, by using a metal with a large loss, it is possible to provide broad absorption, such as detection of a broad wavelength region.

Preferably, the insulating layer 3 is formed of an insulating material such as silicon oxide ($SiO_2$), silicon nitride (SiN), aluminum oxide, nickel oxide, and silicon. A similar effect can be obtained by use of a semiconductor material such as Si and GaAs.

Next, an operation principle of the electromagnetic wave detector 100 according to Embodiment 1 of the present invention will be described. When light (an electromagnetic wave) is incident to the electromagnetic wave detector 100, light having a resonance wavelength that is resonant in a pattern of the isolated metals 1 periodically formed on the incident surface is selected out of the incident light. Further, out of the light of the selected wavelength, light in a waveguide mode guided to the insulating layer 3 is further selected.

Next, resonance occurs in the insulating layer 3 sandwiched between the isolated metals 1 and the metal layer 4. Light having a resonance wavelength is also selected here. In this case, because the insulating layer 3 is very thin as compared with a wavelength of the incident light, resonance in a thickness direction of the insulating layer 3 does not become dominant. Consequently, practically, resonance in the in-plane direction of the isolated metals 1 (a direction parallel to the surface of the insulating layer 3) becomes dominant. Here, because the isolated metals 1 have square shapes, resonance in a direction along one side of the squares becomes dominant. Further, because the graphene layer 2 is a monoatomic layer, its effect as a structure to the incident electromagnetic wave is weak, and an influence to the optical resonance phenomenon can be ignored. Resonance is particularly strong in an edge portion of the isolated metal 1. Therefore, regarding the absorption characteristics, a similar effect can be obtained in the case of the present embodiment in which the graphene layer 2 is below the isolated metals 1 and in the case of other embodiments in which the graphene layer 2 is above the isolated metals 1.

The above-described resonance occurs on the incident surface side of the electromagnetic wave detector 100. This is particularly referred to as pseudo surface plasmon resonance, in view of the surface plasmon resonance, plasmon resonance, or resonance on a metal surface other than a visible region to a near infrared wavelength region as wavelength regions in which surface plasmon polariton generally occurs. However, in recent years, handling these resonance phenomena as surface plasmon or plasmon regardless of a wavelength region has become the mainstream. Similarly, in a sense that a specific wavelength is controlled by a structure equal to or smaller than a normal wavelength, these resonance phenomena are also referred to as a metamaterial or a plasmonic metamaterial. However, essentially, absorptions occur by specific resonance formed by the surface of the isolated metals 1 and by the isolated metals 1 and the metal layer 4, as described above. Therefore, these names are not distinguished herein, and are handled as the same from a phenomenon aspect. Herein, these resonances are referred to as surface plasmon resonance, plasmon resonance, or simply resonance.

Figure 4A:
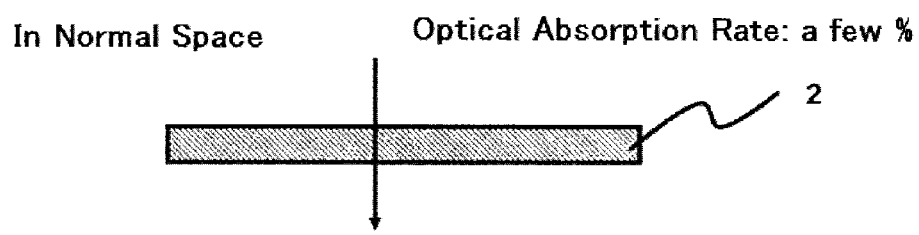
FIG. 4A is a view for explaining light absorption in graphene in normal electromagnetic wave incidence according to Embodiment 1 of the present invention.
Figure 4B:
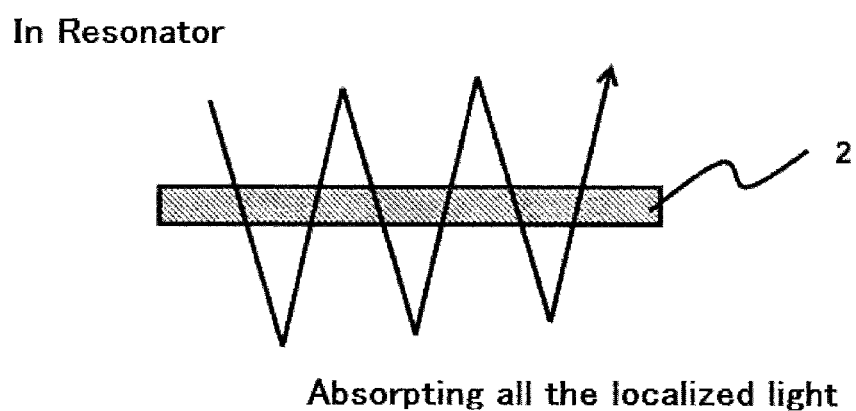
FIG. 4B is a view for explaining light absorption in graphene in a resonator according to Embodiment 1 of the present invention.

As described above, light is strongly localized on the periphery of the isolated metals 1, based on plasmon resonance in a specific wavelength. In this case, because the graphene layer 2 below the isolated metals 1 is arranged in the resonator, the graphene layer 2 can finally absorb all the localized light. As indicated by an analysis result described later, the light near the isolated metals 1 is localized by substantially 100 percent. Accordingly, the optical absorption rate of the graphene layer in the normal light incidence as shown in FIG. 4A is normally 2.3%, whereas the electromagnetic wave is repeatedly made incident to the graphene layer 2 in the resonator, as shown in FIG. 4B. Therefore, in the graphene layer 2 set in the resonator, all (100%) of the localized light can be finally absorbed. Consequently, sensitivity increases based on substantial increase in an output photocurrent. In the operating state of the detector, the detector detects the photocurrent generated by the electromagnetic wave incidence to the graphene layer 2. At this time, the detector operates when the electrodes 5 on both ends of a photocurrent generation path of the graphene layer 2 are either with or without an external bias. Normally, detection efficiency of a generated carrier can be increased by application of bias.

An electric circuit for taking out a change in the photocurrent of the external bias and the like is connected to the graphene layer 2 via the electrode 5. As a reading method of an electric signal, for example, when a voltage is applied between the two-terminal electrodes 5, the amount of conducted current changes based on an electric signal which is a change in resistance value in the graphene layer 2. By detecting the change in the current amount, the incident electromagnetic wave can be detected. A change amount of a voltage value may be measured by adding a circuit for passing a constant current between the two-terminal electrodes 5.

Further, an electric signal may be taken out by forming a transistor structure obtained by combining the metal layer 4 as a gate terminal with the two-terminal electrodes 5. A further larger electric field can be generated in the graphene layer 2 by applying a voltage to the metal layer 4, and a carrier generated by the incidence of an electromagnetic wave can be detected highly efficiently. Further, a potential change of the graphene layer 2 due to the incidence of the electromagnetic wave may be taken out by the electrode 5 provided with only one terminal.

In the embodiments described below, to simplify the detection method, detection of an electric resistance between the two-terminal electrodes 5 as shown in FIG. 1 will be described as a representative example. However, other detection method can also be used.

Next, the film thickness h of the isolated metal 1 will be described. When the film thickness h of the isolated metal 1 becomes large, resonance also occurs in the thickness direction. Therefore, resonance also occurs in a height direction. Accordingly, incidence angle dependence of detection efficiency becomes large. As a result, light other than a vertical incidence is not absorbed in a specific wavelength, and there is a tendency that a detection output is lowered. That is, it is preferable to make the film thickness h as small as possible by satisfying at least h<L (a length of one side of the isolated metal 1).

A lower limit of the film thickness h will be described.

$$\delta = (2/\mu\sigma\bar{\omega})^{1/2}$$

where, $\mu$ and $\sigma$ are a transmission factor and electric conductivity of the isolated metal 1, respectively, and
$\bar{\omega}$ is an angular frequency of an electromagnetic wave having a detection wavelength For the detection wavelength, when the film thickness h is about two times or more than a skin depth $\delta$ (from about a few 10 nm to about a few 100 nm in the infrared wavelength region, although the thickness changes depending on a wavelength) expressed by the above equation, it can be generally said that leakage of incident light is sufficiently small. Therefore, a minimum film thickness of the film thickness h must satisfy the above condition. As indicated by the following analysis, in the infrared wavelength region, sufficient absorption occurs when the film thickness h is about a few 10 nm to 100 nm or more, and the film thickness h of about 200 nm is sufficient. Thus, when the film thickness of the isolated metal 1 is small, the surface plasmon resonance occurs mainly in the in-plane direction of the isolated metal 1, and a wavelength of the absorbed incident light is determined by the size of the isolated metal 1.

On the other hand, when the film thickness h becomes large and becomes larger than ¼ of L, resonance also occurs in a film thickness direction (a direction perpendicular to the in-plane direction), and the incidence angle dependence of the absorption characteristics becomes large. Further, because a resonance direction is not at one position, a problem occurs in that the absorption wavelength becomes a multi-wavelength.

As described above, when the film thickness of the isolated metal 1 is very small, the absorption wavelength is determined mainly by resonance in the in-plane direction. As a result, the incidence angle dependence of the absorption wavelength becomes small. Consequently, even when the incidence angle changes, little change occurs in the absorption characteristics such as the absorption wavelength and the absorption rate.

For example, when the film thickness of the isolated metal 1 is 500 nm and relatively large, but is equal to or smaller than ¼ of the wavelength of incident light, the incidence angle dependence of the absorption wavelength occurs but the wavelength of the absorption light and radiation light is not affected on the other hand. Therefore, when light is perpendicularly incident to the electromagnetic wave detector 100, the film thickness of the isolated metal 1 may be relatively large as long as the film thickness of the isolated metal 1 is under the condition of ¼ or smaller of the wavelength of the incident light.

Similarly, for the insulating layer 3, in order to avoid the occurrence of resonance in a film thickness direction (a direction perpendicular to the surface of the insulating layer 3), it is preferable that the optical length of target light in the insulating layer is smaller than ¼ of L. For example, in the infrared wavelength region, the film thickness t of the insulating layer is preferably equal to or smaller than 200 nm. The optical length is a wavelength of light in a substance, determined by a refractive index or a dielectric constant. In order to form a cavity between the isolated metal 1 and the metal layer 4, the cavity needs to be larger than about two times the value determined from the evanescent wavelength (a skin depth) of metal.

On the other hand, the metal layer 4 needs to have a thickness in which the incident light and the radiation light cannot be transmitted. As described above, the film thickness of the metal layer 4 is preferably about two times or more of the skin depth of the wavelengths of such light.

In the multilayer structure that has an insulating layer (the insulating layer 3, for example) sandwiched between a periodic pattern of metal layers (the isolated metals 1, for example) and a flat metal layer (the metal layer 4, for example), the surface plasmon resonance and a waveguide mode in the insulating layer occur simultaneously. The waveguide mode in the insulating layer is a mode of light that is resonant inside the insulating layer. Therefore, the surface plasmon resonance is determined not by the period of the metal layer but by the size of the metal layer. That is, in the case of the multilayer structure according to Embodiment 1 of the present invention, a size (a dimension in a plane parallel to the surface) of the metal layer (the isolated metals 1, for example) determines a wavelength of the absorption light. Similarly to the case where the metal layer is a square, a similar effect can also be obtained when the metal layer is circular.

The size of the isolated metal 1 refers to a dimension of the isolated metal 1, in a plane parallel to the surface. When a shape in a plane parallel to the surface (the electromagnetic wave incidence surface) of the isolated metal 1 is circular, a diameter of this circle is referred to as the length of one side. It can also be said that in other regular polygon, the absorption wavelength can be controlled by an area occupied by the upper metal layer 1, that is, a filling rate, in the same period.

In an ellipse, absorption is different depending on polarization corresponding to a large diameter and a short diameter. In a rectangle, absorption is different depending on polarization corresponding to a large side and a short side. That is, absorption is determined by a polarization angle, depending on a main length of the isolated metal 1 in a direction of an electric field and a resonance direction of the electric field. Therefore, when an asymmetrical shape (a shape of a graphic in which sizes in two orthogonal directions are different) is used, polarization dependence occurs in the absorption and radiation characteristics. That is, polarization can be detected together with the wavelength.

Further, resonance is generated in the in-plane direction of the metal layer (the isolated metal 1, for example), by sufficiently decreasing the film thickness of the metal layer (the isolated metal 1, for example) relative to the wavelength of the target light, and also by using the waveguide mode in the insulating layer 3 having a small thickness. Therefore, the influence of resonance in a depth direction (a thickness direction) is small. Consequently, it is possible to absorb or detect a wavelength of incident light having small incidence angle dependence and having a larger incidence angle.

When the isolated metal has a point-symmetrical shape relative to a center point such as a circle and a square, there is no polarization dependence in an absorption wave and a radiation wave. However, when the isolated metal has an asymmetrical shape such as an ellipsis (upper left), a rectangle (upper right), and a triangle (lower left) as shown in FIG. 5, polarization dependence occurs. Further, when the isolated metals 1 are arrayed in only one dimensional direction, polarization dependence also occurs in an absorption wave and a radiation wave. By using such structures, it becomes possible to detect incident light having a specific polarization angle, and a polarization detection electromagnetic wave detector can be configured.

As described above, in the electromagnetic wave detector 100 according to Embodiment 1 of the present invention, the wavelength (the absorption wavelength) of the light which is absorbed out of the incident light is determined by a three-layer structure of the isolated metals 1, the insulating layer 3, and the metal layer 4.

FIG. 6 is a graph showing absorption characteristics of the electromagnetic wave detector 100 according to Embodiment 1 of the present invention. The horizontal axis shows a wavelength of incident light, and the vertical axis shows an absorption rate. In the electromagnetic wave detector 100 used for the electromagnetic field analysis, a planar shape of each isolated metal 1 is a square and has a thickness of 50 nm, and a thickness of the metal layer 4 is 200 nm. Materials of both the isolated metals 1 and the metal layer 4 are Au. The insulating layer 3 is formed of silicon oxide ($SiO_2$) having a thickness of 100 nm. An absorption rate was obtained by electromagnetic field analysis for cases where the period S of the isolated metals 1 was 2.0 μm, and the length L of one side of the isolated metal 1 was 1.0 μm, 1.2 μm, 1.4 μm, and 1.6 μm (a broken line).

As can be seen from FIG. 6, absorption wavelengths are about 3.8 μm, 4.6 μm, 5.4 μm, and 6.1 μm from the left respectively. That is, when L is increased, the absorption wavelength proportionally increases. Because the period S is constant at 2.0 μm, the absorption (radiation) wavelength does not depend on the period. An absorption wavelength λab and the length L of one side of the isolated metal 1 are in substantially a proportional relation. That is, it can be understood that the following relation is established.

$\lambda ab \infty L$

Figure 7:
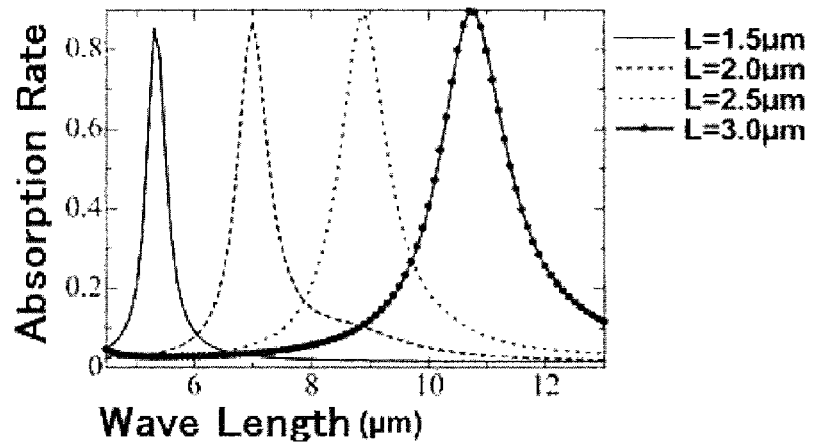
FIG. 7 shows electromagnetic wave absorption characteristics of the electromagnetic wave detector according to Embodiment 1 of the present invention.

Similarly to FIG. 6, FIG. 7 is a graph showing absorption characteristics of the electromagnetic wave detector 100 according to Embodiment 1 of the present invention. The horizontal axis shows a wavelength of incident light, and the vertical axis shows an absorption rate. In the electromagnetic wave detector 100 used for the electromagnetic field analysis, a planar shape of each isolated metal 1 is a square and has a thickness of 50 nm, and a thickness of the metal layer 4 is 200 nm. Materials of both the isolated metals 1 and the metal layer 4 are Au. The insulating layer 3 is formed of silicon oxide ($SiO_2$) having a thickness of 100 nm. An absorption rate was obtained by electromagnetic field analysis for cases where the period S of the isolated metals 1 was 4.0 μm, and the length L of one side of the isolated metal 1 was 1.5 μm, 2.0 μm, 2.5 μm, and 3.0 μm. Because the metal layer 4 has a thickness in which an incident electromagnetic wave cannot be transmitted, absorption characteristics are not affected in the configuration below the metal layer 4.

As can be seen from FIG. 7, absorption wavelengths are about 5.3 μm, 7.1 μm, 8.9 μm, and 10.7 μm, respectively. That is, when L is increased, the absorption wavelength proportionally increases. Because the period S is constant at 4.0 μm, the wavelength of the absorption wave does not depend on the period, and is substantially proportional to the length of one side of the isolated metal 1. That is, it can be understood that the following relation is established.

$\lambda ab \infty L$

Such a relation is substantially the same as that shown in FIG. 6, and it can be understood that when the period is changed, the light having the wavelength determined by the size of the isolated metal 1 is also absorbed. It can also be understood that the relation between λab and L changes little when the period is changed. From the above, when n is a positive real number, the following relation is obtained: $\lambda ab \approx n \times L$.

Figure 8:
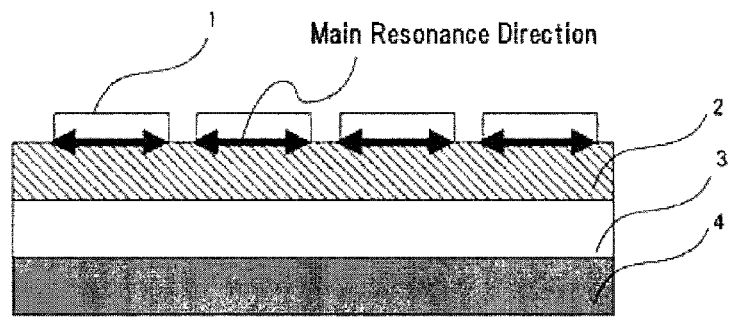
FIG. 8 is a view for explaining surface plasmon resonance according to Embodiment 1 of the present invention.
Figure 9:
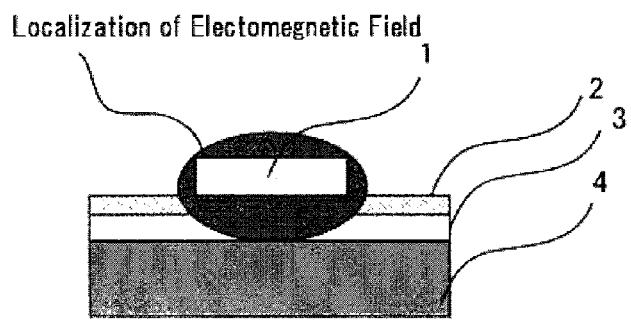
FIG. 9 is a view for explaining surface plasmon resonance according to Embodiment 1 of the present invention.

As described above, with the structure of the present invention, it can be understood that the absorption wavelength can be selected by changing a size of the isolated metal 1 in a wide wavelength region of middle infrared to long wavelength infrared regions. This verifies that main resonance occurs in the planar direction of the isolated metals 1 as shown in FIG. 8, and that the electromagnetic field is localized near the isolated metals 1 as shown in FIG. 9. However, the period S is set smaller than the absorption wavelength. This is because in the incident electromagnetic wave having a wavelength smaller than the period S, light may be reflected by refraction, and absorption does not occur or becomes small. That is, in the structure of the present invention, sufficient absorption can be obtained when the following relations are satisfied.

$\lambda ab \approx n \times L$ $\lambda ab > S$

As described above, when the isolated metals 1 arranged in a constant period are used, the absorption wavelength becomes larger than the period. Therefore, it becomes possible to minimize the value of the number of period×the period that is necessary to achieve sufficient absorption. That is, the size of the electromagnetic wave detector 100 can be minimized.

In the electromagnetic wave detector 100, the film thicknesses of the isolated metals 1 and the insulating layer 3 are set to a small level where resonance in the film thickness direction will not occur. However, when these film thicknesses are set large as described above, the surface plasmon resonance occurs also in the film thickness direction of the isolated metals 1 and in the film thickness direction of the insulating layer 3, in addition to the resonance in the in-plane direction of the isolated metals 1, and the resonance becomes three-dimensional. As a result, a change also occurs in the resonance wavelength, and the absorption wavelength changes. On the other hand, when the film thicknesses of the isolated metals 1 and the like are increased, incidence angle dependence of the absorption wavelength occurs. Therefore, for example, when the incidence angle dependence can be ignored as in the case where the incidence angle of the incident light is always in a perpendicular direction, the resonance wavelength can be changed by increasing the film thicknesses of the isolated metals 1 and the insulating layer 3.

As described above, in the electromagnetic wave detector 100 according to Embodiment 1 of the present invention, the light having the wavelength determined by the size of the isolated metals 1 can be absorbed by the incidence surface. That is, by controlling the size of the isolated metals 1, it becomes possible to freely determine an absorption spectrum, and detection of an arbitrary electromagnetic wave becomes possible.

Next, a manufacturing method of the electromagnetic wave detector 100 according to Embodiment 1 of the present invention will be described with reference to FIGS. 10A to 10G. FIGS. 10A to 10G are sectional views of a manufacturing process of the electromagnetic wave detector 100. FIGS. 10A to 10G are sectional views of a manufacturing process of the electromagnetic wave detector 100, taken along I-I' in FIG. 1. The manufacturing method includes the following steps 1 to 7.

Step 1: As shown in FIG. 10A, the flat metal layer 4 made of Au, Ag, Cu, Al, Ni, Cr, or the like is formed. The metal layer 4 may be formed on a flat substrate of Si or the like, or the metal layer 4 may be independently formed. After the metal layer 4 is formed on a flat substrate of Si or the like, the metal layer 4 may be formed independently by removing the substrate. A portion that is not used as the electromagnetic wave detector may be patterned in an arbitrary shape.

Step 2: As shown in FIG. 10B, the insulating layer 3 made of silicon oxide ($SiO_2$), silicon nitride (SiN), aluminum oxide, nickel oxide, or silicon, for example, is formed on the metal layer 4. In this case, the surface of the insulating layer 3 is preferably formed flat and parallel to the surface of the metal layer 4. A flattening step such as CMP polishing and heat treatment may be implemented.

Step 3: As shown in FIG. 10C, the graphene layer 2 is deposited on the insulating layer 3. In this case, the graphene layer 2 may be film-formed by a method such as epitaxial growth, or the graphene layer film-formed in advance may be bonded to the insulating layer 3.

Step 4: As shown in FIG. 10D, a photoresist 20 is formed on the graphene layer 2 by using a method such as photoengraving and EB drawing, and the electrode 5 made of Au, Ag, Cu, Al, Ni, Cr, or the like is deposited on the photoresist 20.

Step 5: As shown in FIG. 10E, the electrodes 5 are formed by lifting off the photoresist 20. In this case, preferably, the electrodes 5 are electrically connected to the graphene layer 2 in a satisfactory state. For this purpose, it is preferable to perform post-processing such as lamp annealing, and pre-processing such as sputter etching and wet processing.

Step 6: As shown in FIG. 10F, the photoresist 20 is formed on the graphene layer 2 by using the method such as photoengraving and EB drawing, and the metal layer 1 made of Au, Ag, Cu, Al, Ni, Cr, or the like is deposited on the photoresist 20.

Step 7: As shown in FIG. 10G, the isolated metals 1 are formed by lifting off the photoresist 20.

The electromagnetic wave detector 100 shown in FIG. 1 and FIG. 2 is completed by the above steps.

Figure 12A:
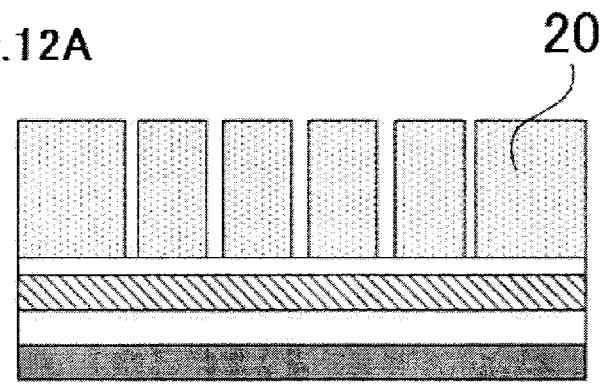
FIGS. 12A and 12B are sectional views of the manufacturing process of the electromagnetic wave detector according to Embodiment 1 of the present invention.
Figure 12B:
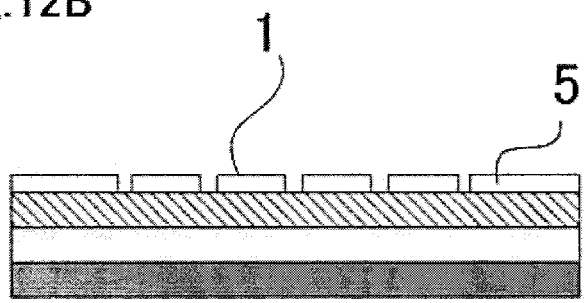

In the present invention, it is sufficient as long as the insulating layer 3 and the graphene layer 2 are formed on the metal layer 4, and the electrodes 5 and the isolated metals 1 are arranged on the graphene layer 2. The manufacturing method is not limited to the steps 1 to 7. For example, as shown in FIGS. 11A and 11B, a metal is deposited on the photoresist 20 which is formed on the graphene layer 2 (FIG. 11A), and the electrodes 5 and the isolated metals 1 may be simultaneously formed by lifting-off (FIG. 11B). Further, as shown in FIGS. 12A and 12B, a metal is deposited on the graphene layer 2, and a resist pattern 23 is formed on the metal (FIG. 12A). The metal is etched by using the photoresist 20 as a mask, and then the electrodes 5 and the isolated metals 1 may be simultaneously formed by removing the photoresist 20 (FIG. 12B).

In the electromagnetic wave detector 100 according to Embodiment 1 of the present invention, by the incidence of light on the isolated metals 1, only the light having a specific wavelength determined by the shape of the isolated metals 1 can be confined around the isolated metals 1. Such light having the specific wavelength is absorbed by the graphene layer 2, and the absorption rate of the light becomes substantially 100% based on light absorption characteristics of the graphene. As a result, the electric resistance value changes. By detecting the change in the electric resistance value with the electrodes 5, the intensity of the incident light having an arbitrary wavelength can be taken out as an electric signal.

Together with the electromagnetic wave detector 100, an output amplifier circuit that uses graphene may be provided in an adjacent part or a lower layer part of the electromagnetic wave detector 100. With this provision, as compared with a transistor made of a generally-used Si semiconductor material, the output amplifier circuit can be configured by a transistor that can operate at a higher speed, and a high-performance electromagnetic wave detector can be realized.

By using graphene for transistors of peripheral circuits such as a reading circuit, high-speed reading and simplification of a manufacturing process become possible.

Embodiment 2

Figure 13A:
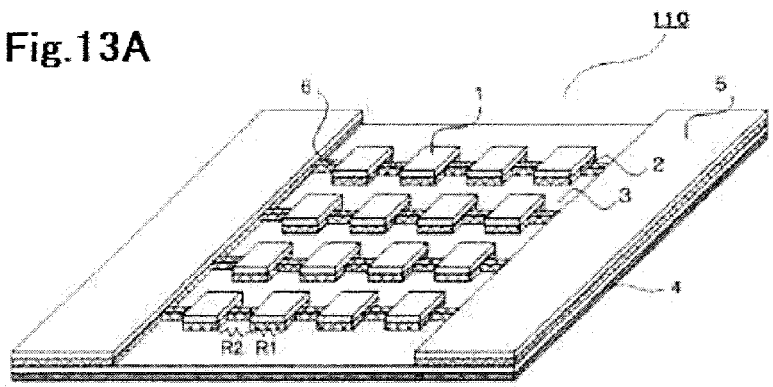
FIGS. 13A and 13B are perspective views of an electromagnetic wave detector according to Embodiment 2 of the present invention.

FIG. 13A is a perspective view of an electromagnetic wave detector 110 according to Embodiment 2 of the present invention. The electromagnetic wave detector 110 is different from the electromagnetic wave detector 100 according to Embodiment 1 in that the graphene layer 2 is not arranged in a sheet shape, but the graphene layer 2 is partly processed to be used as a graphene connection wiring 6. That is, the graphene layer 2 is provided in only lower parts of the isolated metals 1 and the electrodes 5, and in portions of the graphene connection wirings 6 that connect the isolated metals 1 and the electrodes 5.

Figure 13B:
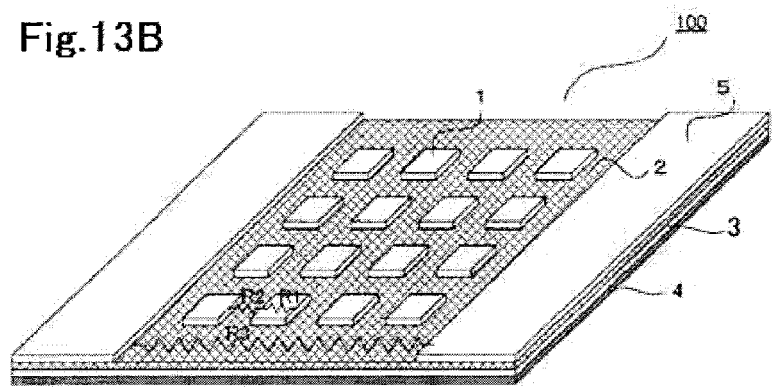

The electromagnetic wave detector 110 shown in FIG. 13A can be obtained by forming the isolated metals 1, and then removing a part of the graphene layer 2 by a photoengraving step, for example. FIG. 13B is a conceptual view about the electric resistance value that is observed between two electrodes 5, in the electromagnetic wave detector 100 according to Embodiment 1.

In the electromagnetic wave detector 100 according to Embodiment 1 shown in FIG. 13B, a resistance value of the graphene layer 2 arranged below the isolated metals 1 is denoted by R1, a resistance value between the isolated metal 1 and the isolated metal 1 is denoted by R2, and a resistance value of a portion where the isolated metals 1 are not arranged is denoted by R3. At this time, when one isolated metal 1 is arranged, a resistance value between the electrodes 5 can be expressed as follows.

$$R = \frac{(R1+R2)R3}{R3+R2+R1}$$

Because only the electric resistance value of the graphene layer 2 near the isolated metals 1 changes according to the light intensity of a specific wavelength, only the term of R1 can be detected as an electric signal. A resistance value change amount for the change in the light intensity (unit W) is as follows.

$$\frac{dR}{dW} = \left(\frac{R3}{R1+R2+R3}\right)^2 \frac{dR1}{dW}$$

On the other hand, in the electromagnetic wave detector 110 according to Embodiment 2 shown in FIG. 13A, when a resistance value of the graphene layer 2 arranged below the isolated metals 1 is denoted by R1 and a resistance value of the graphene connection wiring 6 between the isolated metals 1 is denoted by R2, a resistance value between the electrodes 5 when one isolated metal 1 is arranged can be expressed as follows.

$$R=R1+R2$$

Therefore, the following relation is obtained.

$$\frac{dR}{dW} = \frac{dR1}{dW}$$

That is, the electromagnetic wave detector 110 according to Embodiment 2 shown in FIG. 13A has stronger electric signal intensity for the light intensity of a specific wavelength, and the electromagnetic wave detector 110 with high sensitivity can be obtained.

In Embodiment 2, a shape of the graphene connection wiring 6 is sufficient as long as the graphene layers 2 arranged below the electrodes 5 and the isolated metals 1 are connected to each other, and is not limited to the shape shown in FIG. 13A. For example, the graphene connection wirings 6 that connect between the graphene layers 2 in a longitudinal direction (from the lower left to the upper right direction in FIG. 13A) may be arranged, or the graphene connection wirings 6 that connect between the graphene layers 2 in an oblique direction may be arranged.

In Embodiment 2, the graphene connection wirings 6 are formed by processing the graphene layer 2. However, it is sufficient as long as the graphene layers 2 arranged below the electrodes 5 and the isolated metals 1 are connected to each other. A wiring layer other than the graphene layer 2 may be separately formed.

Figure 14:
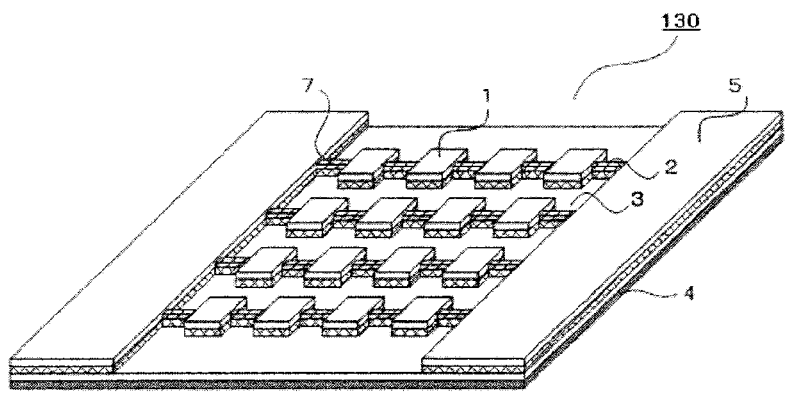
FIG. 14 is a perspective view of an electromagnetic wave detector according to Embodiment 2 of the present invention.

FIG. 14 is a perspective view of another electromagnetic wave detector according to Embodiment 2 of the present invention, the whole electromagnetic wave detector being denoted by 130. In the electromagnetic wave detector 130, a graphene connection wiring protection film 7 is provided on the graphene connection wiring 6. The graphene connection wiring protection film 7 is made of a silicon nitride film or a silicon oxide film, for example.

By providing the graphene connection wiring protection film 7 in this manner, the graphene connection wiring 6 can be stably formed. In addition, the graphene connection wiring 6 can be protected from a physical influence from the surrounding. Therefore, the electromagnetic wave detector 130 in a satisfactory state can be obtained.

Embodiment 3

Figure 15:
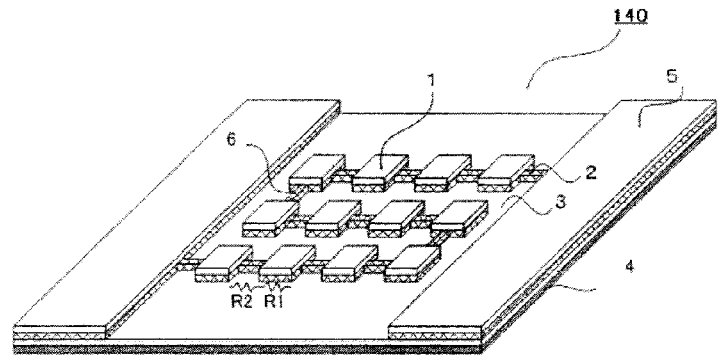
FIG. 15 is a perspective view of an electromagnetic wave detector according to Embodiment 3 of the present invention.

FIG. 15 is a perspective view of an electromagnetic wave detector according to Embodiment 3 of the present invention, the whole electromagnetic wave detector being denoted by 140. In the electromagnetic wave detector 140, the isolated metals 1 are connected in series by the graphene connection wiring 6 between two electrodes 5. In the electromagnetic wave detector 140 shown in FIG. 15, when a resistance value of the graphene layer 2 arranged below the isolated metals 1 is denoted by R1 and a resistance value of the graphene connection wiring 6 between the isolated metal 1 and the isolated metal 1 is denoted by R2, a resistance value R between the electrodes 5 when n isolated metals 1 are connected in series can be expressed as follows.

$$R=n\times R1+n\times R2$$

Therefore, the following relation is obtained.

$$\frac{dR}{dW} = n\frac{dR1}{dW}$$

That is, in the electromagnetic wave detector 140 shown in FIG. 15, stronger electric signal intensity for the light intensity of a specific wavelength can be obtained, and the electromagnetic wave detector 140 with high sensitivity can be obtained.

Embodiment 4

Figure 16:
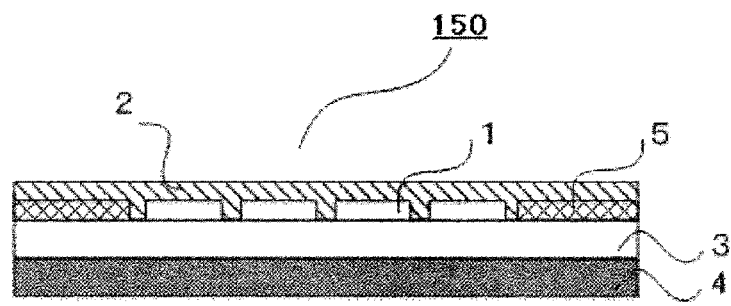
FIG. 16 is a sectional view of an electromagnetic wave detector according to Embodiment 4 of the present invention.

FIG. 16 is a sectional view of an electromagnetic wave detector according to Embodiment 4 of the present invention, the whole electromagnetic wave detector being denoted by 150. The electromagnetic wave detector 150 is different from the electromagnetic wave detector 100 in that the graphene layer 2 is arranged above the isolated metals 1 and the electrodes 5 while the electromagnetic wave detector 100 has the graphene layer 2 arranged below the isolated metals 1 and the electrodes 5. The electromagnetic wave detector 150 according to Embodiment 4 is obtained by forming the metal layer 4, the insulating layer 3, the electrodes 5, and the isolated metals 1, and then forming the graphene layer 2 by epitaxial growth, for example. Alternatively, graphene may be formed by transferring in advance the graphene that is film-formed by CVD on a copper foil or the like. Optical characteristics of the electromagnetic wave detector 150 are equivalent to those already described in Embodiment 1, and therefore will not be described herein.

The graphene layer 2 has a possibility of generating a defect as the process proceeds such as the photoengraving step and etching steps of dry etching and wet etching. However, in the manufacturing process according to Embodiment 4, the formation of such a defect can be ignored because the graphene layer 2 is formed last. That is, there is no constraint such as a need for avoiding an additional step of protecting the graphene layer 2 with the resist and the like and a step of not causing damage to the graphene layer 2. Therefore, there is an effect that the preparation becomes simple, and the graphene layer 2 can be maintained in high quality.

Further, the graphene layer 2 can be formed as a high-quality film by epitaxial growth utilizing an atom structure of a metal film surface. Further, the electromagnetic wave detector 150 having satisfactory characteristics can be obtained, and the electromagnetic wave detector 150 that obtains an electric signal for light intensity of a specific wavelength can be obtained.

Figure 17:
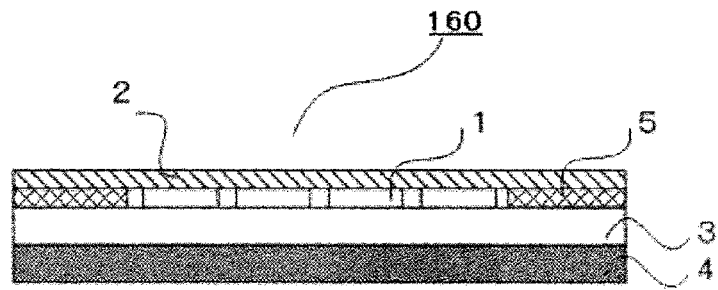
FIG. 17 is a sectional view of an electromagnetic wave detector according to Embodiment 4 of the present invention.

FIG. 17 is a sectional view of another electromagnetic wave detector according to Embodiment 4 of the present invention, the whole electromagnetic wave detector being denoted by 160. The electromagnetic wave detector 160 is manufactured by forming the metal layer 4, the insulating layer 3, the electrodes 5, and the isolated metals 1, and then bonding the separately-prepared graphene layer 2 to the isolated metals 1. At this time, preferably, the graphene layer 2 and the electrodes 5 are satisfactorily electrically connected. Preferably, post-processing such as lamp annealing and pre-processing such as sputter etching and wet processing are performed.

Preferably, the interval between the isolated metals 1 and the graphene layer 2 is small. This is because when the interval between the isolated metals 1 and the graphene layer 2 is smaller, confined light can be efficiently absorbed. However, when the sensitivity is sufficient, the graphene layer 2 and the isolated metals 1 do not need to be in complete contact with each other.

Figure 18:
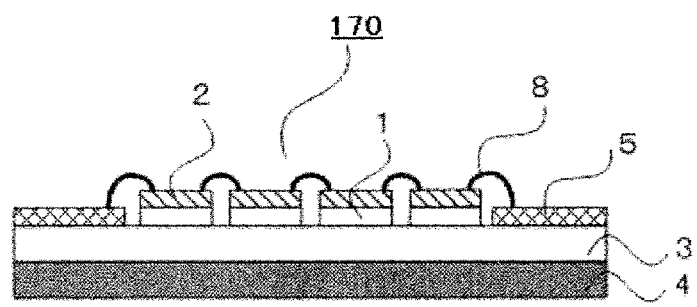
FIG. 18 is a sectional view of an electromagnetic wave detector according to Embodiment 4 of the present invention.

FIG. 18 is a sectional view of another electromagnetic wave detector according to Embodiment 4 of the present invention, the whole electromagnetic wave detector being denoted by 170. In the electromagnetic wave detector 170, electric connection between the electrode 5 and the graphene layer 2 on the isolated metal 1, and electric connection between the graphene layers 2 on the isolated metals 1 are performed by a connection wiring 8 other than the graphene layer 2 such as a metal film and a wire bond.

Embodiment 5

Figure 19:
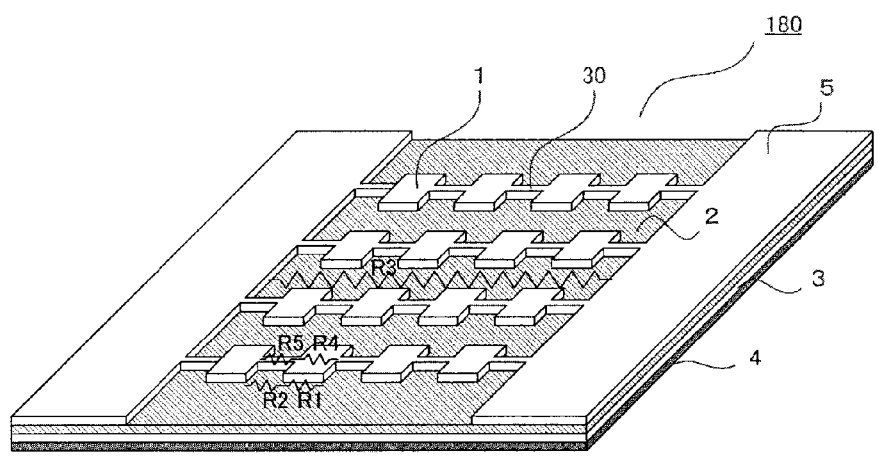
FIG. 19 is a perspective view of an electromagnetic wave detector according to Embodiment 5 of the present invention.

FIG. 19 is a perspective view of an electromagnetic wave detector according to Embodiment 5 of the present invention, the whole electromagnetic wave detector being denoted by 180. The electromagnetic wave detector 180 is different from the electromagnetic wave detector 100 in that the electromagnetic wave detector 180 has a metal pattern 30 of connection between the isolated metal 1 and the electrodes 5.

In the electromagnetic wave detector 180, below the metal pattern 30, the isolated metal 1 is processed to prevent deterioration of crystallinity generated in the graphene layer 2.

In the electromagnetic wave detector 180, a resistance value of the graphene layer 2 arranged below the isolated metals 1 is denoted by R1, a resistance value of the graphene connection wiring 6 between the isolated metal 1 and the isolated metal 1 is denoted by R2, a resistance value of a portion in which the isolated metal 1 is not arranged is denoted by R3, a resistance value of the isolated metal 1 is denoted by R4, and a resistance value between the isolated metals 1 is denoted by R5. At this time, when one isolated metal 1 is arranged, a resistance value between the electrodes 5 can be expressed as follows.

$$R = \frac{(R1+R2)R3(R4+R5)}{R3(R4+R5)+(R1+R2)}$$
$$= \frac{(R4+R5)+(R1+R2)R3}{R3(R4+R5)+}$$
$$(R1+R2)(R4+R5+R3)$$

Because the sheet resistance of the graphene layer 2 is sufficiently small as compared with the sheet resistance of the isolated metal, the following approximation is established.

$$R \cong \frac{(R1+R2)R3(R4+R5)}{(R1+R2+R3)(R4+R5)}$$
$$= \frac{(R1+R2)R3}{R3+R2+R1}$$

Because only the electric resistance value of the graphene layer 2 near the isolated metals 1 changes according to the light intensity of a specific wavelength, only the term of R1 can be detected as an electric signal. A resistance value change amount for the change in the light intensity (unit W) is as follows.

$$\frac{dR}{dW} = \left(\frac{R3}{R1+R2+R3}\right)^2 \times \frac{dR1}{dW}$$

As a result, it can be understood that the electric characteristics of the light having a specific wavelength do not change regardless of presence or absence of the pattern of connection between the isolated metal 1 and the electrode 5.

In the electromagnetic wave detector 180, by providing the metal pattern 30, the graphene connection wiring 6 can be stably formed, and the electromagnetic wave detector 180 in a satisfactory state can be obtained by preventing a physical influence from the surrounding.

Figure 20:
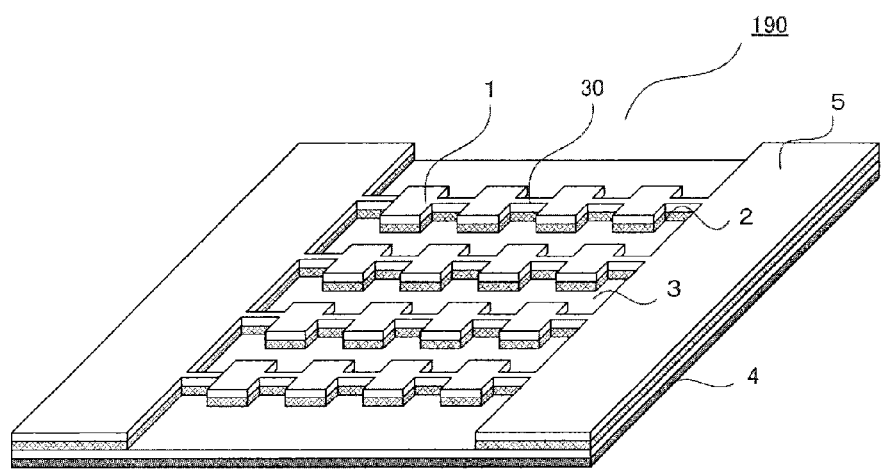
FIG. 20 is a perspective view of an electromagnetic wave detector according to Embodiment 5 of the present invention.

FIG. 20 is a perspective view of another electromagnetic wave detector according to Embodiment 5 of the present invention, the whole electromagnetic wave detector being denoted by 190. The electromagnetic wave detector 190 is different from the electromagnetic wave detector 110 shown in FIG. 13A in that the electromagnetic wave detector 190 has the metal pattern 30 of connection between the isolated metal 1 and the electrode 5.

In the electromagnetic wave detector 190, a change amount in the electric characteristics of the light having a specific wavelength can be increased by removing a part of the graphene layer 2, whereby sensitivity of the electromagnetic wave detector 190 is improved. Further, as described in Embodiment 3, by arranging the isolated metals 1 in series, a change amount in the electric characteristics of the light having a specific wavelength can be further increased.

Embodiment 6

Figure 21:
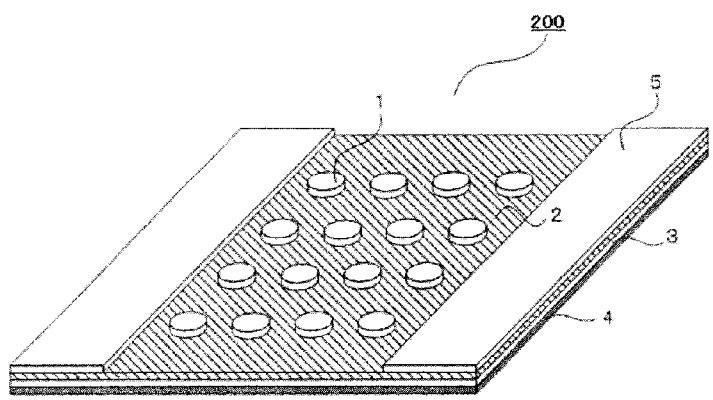
FIG. 21 is a perspective view of an electromagnetic wave detector according to Embodiment 6 of the present invention.

FIG. 21 is a perspective view of an electromagnetic wave detector according to Embodiment 6 of the present invention, the whole electromagnetic wave detector being denoted by 200. In the electromagnetic wave detector 200, a shape of the surface of isolated metals 1 parallel to the surface is not square but is circular. The isolated metals 1 may have an asymmetrical shape such as an ellipsis and a triangle, in addition to a circular shape.

In the multilayer structure in which the insulating layer 3 is sandwiched between the periodic pattern of the isolated metals 1 and the flat metal layer 4, the surface plasmon resonance and the waveguide mode in the insulating layer occur simultaneously. The waveguide mode in the insulating layer 3 is a mode of the light that is resonant inside the insulating layer 3. Therefore, the surface plasmon resonance is determined not by the period of the isolated metals 1 but by the size of the isolated metals 1. That is, in the case of the multilayer structure according to Embodiment 6 of the present invention, the size of the isolated metals 1 (a dimension in a plane parallel to the surface) determines the wavelengths of the absorption light and the radiation light. Similarly to the case where the isolated metal 1 is a square, a similar effect can be obtained when the isolated metal 1 is circular, elliptical, or triangular.

Embodiment 7

Figure 22:
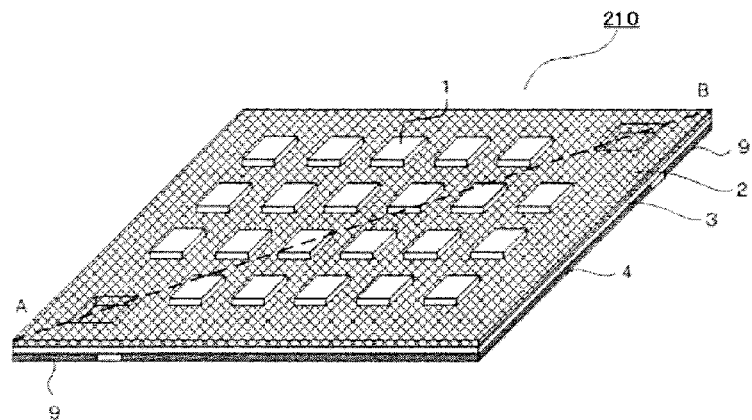
FIG. 22 is a perspective view of an electromagnetic wave detector according to Embodiment 7 of the present invention.

FIG. 22 is a perspective view of an electromagnetic wave detector according to Embodiment 7 of the present invention, the whole electromagnetic wave detector being denoted by

Figure 23:
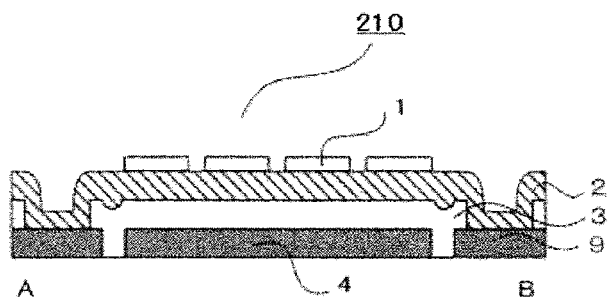
FIG. 23 is a sectional view of the electromagnetic wave detector according to Embodiment 7 of the present invention.

210. FIG. 23 is a sectional view of the electromagnetic wave detector 210 taken along A-B in FIG. 22.

In the electromagnetic wave detector 210 according to Embodiment 7, a lower-metal layer utilization wiring 9 is manufactured by separating a part of the metal layer 4 by patterning. Further, the graphene layer 2 and the lower-metal layer utilization wiring 9 are electrically connected to each other, by providing a contact hole in the insulating layer 3 on the lower-metal layer utilization wiring 9.

In the electromagnetic wave detector 210 according to Embodiment 7, processing steps after film-forming the graphene layer 2 can be decreased. It is possible to reduce deterioration of crystallinity of the graphene layer 2 that occurs each time the photoengraving step and steps such as dry etching and wet etching are performed. By decreasing the number of manufacturing steps, manufacturing cost can be lowered, and sensitivity of the electromagnetic wave detector 210 that detects light having a specific wavelength can be maintained.

Embodiment 8

Figure 24:
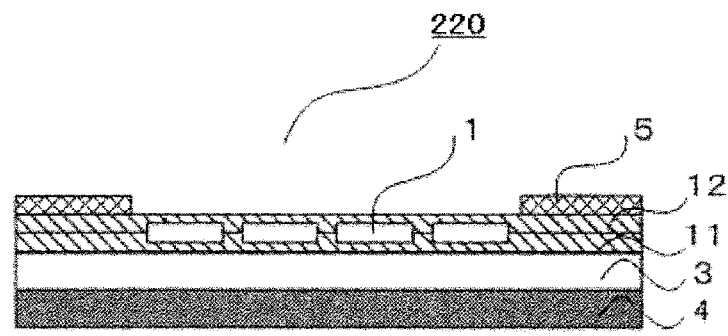
FIG. 24 is a sectional view of an electromagnetic wave detector according to Embodiment 8 of the present invention.

FIG. 24 is a sectional view of an electromagnetic wave detector according to Embodiment 8 of the present invention, the whole electromagnetic wave detector being denoted by 220. In the electromagnetic wave detector 220, a first graphene layer 11 is provided below the isolated metals 1, and a second graphene layer 12 is provided above the isolated metals 1. Other structures are the same as those of the electromagnetic wave detector 100.

According to the electromagnetic wave detector 220, a plurality of graphene layers (two layers of the first graphene layer 11 and the second graphene layer 12) are arranged on the periphery of the isolated metals 1. Therefore, the optical absorption rate can be improved, the change amount in the electric characteristic of light having a specific wavelength can be increased, and detection sensitivity can be improved.

Embodiment 9

Figure 25:
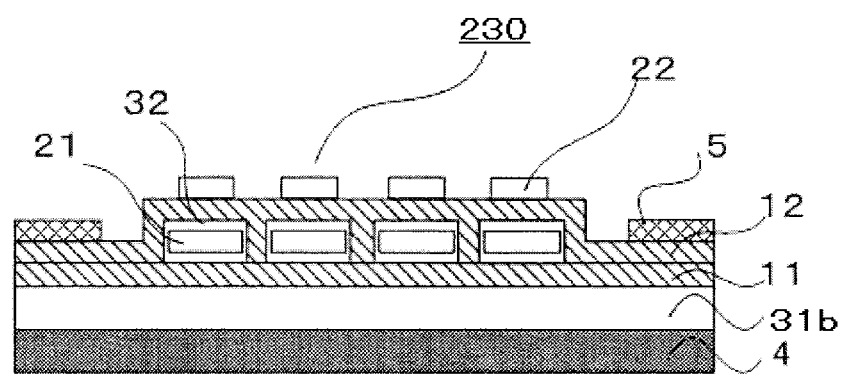
FIG. 25 is a sectional view of an electromagnetic wave detector according to Embodiment 9 of the present invention.

FIG. 25 is a sectional view of an electromagnetic wave detector according to Embodiment 9 of the present invention, the whole electromagnetic wave detector being denoted by 230. In the electromagnetic wave detector 230, there are arranged in order on the metal layer 4, a first insulating film 31, a first graphene layer 11, a first isolated metal 21 covered with a second insulating film 32, a second graphene layer 12, and a second isolated metal 22.

That is, in the electromagnetic wave detector 230, the second isolated metal 22, the second insulating film 32, and the first isolated metal 21 have a multilayer structure in which an insulating layer is sandwiched between a periodic pattern of metal layers and a flat metal layer. Therefore, when light is incident from above the second isolated metal 22, surface plasmon resonance and a waveguide mode in the insulating layer occur simultaneously. By this action, light components of a specific wavelength attributable to the size of the second isolated metal 22 are absorbed by the second graphene layer 12.

Next, the first isolated metal 21, the first insulating film 31, and the metal layer 4 have a multilayer structure in which an insulating layer is sandwiched between a periodic pattern of metal layers and a flat metal layer. Surface plasmon resonance and a waveguide mode in the insulating layer occur simultaneously. By this action, light components of a specific wavelength attributable to the size of the first isolated metal 21 are absorbed by the first graphene layer 11.

That is, in the electromagnetic wave detector 230, two specific wavelengths can be absorbed by one patch structure. Further, by forming a plurality of layers instead of two layers in the laminated structure, a photosensor having an arbitrary number of light absorption peaks can be obtained.

Embodiment 10

Figure 26:
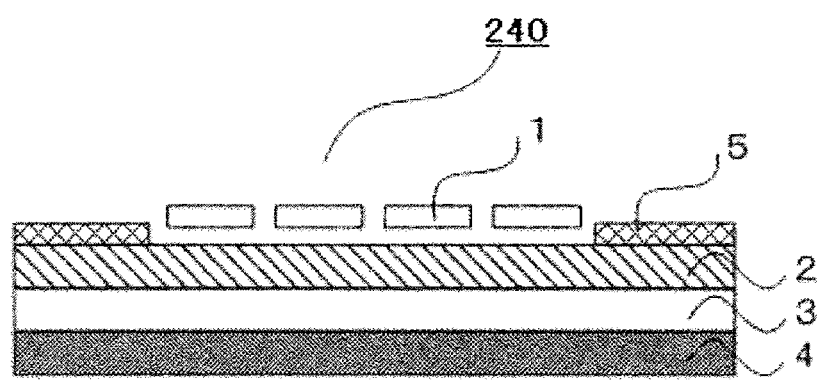
FIG. 26 is a sectional view of an electromagnetic wave detector according to Embodiment 10 of the present invention.

FIG. 26 is a sectional view of an electromagnetic wave detector according to Embodiment 10 of the present invention, the whole electromagnetic wave detector being denoted by 240. In the electromagnetic wave detector 240, the isolated metals 1 are formed in a hollow without making contact with the surface of the graphene layer 2. When an optical refraction index of the atmosphere is compared with that of an insulating film, it can be understood that the insulating film has a larger refraction index. In the multilayer structure in which the insulating layer 3 is sandwiched between the periodic pattern of the isolated metals 1 and the flat metal layer 4, the surface plasmon resonance and the waveguide mode in the insulating layer 3 occur simultaneously. The waveguide mode in the insulating layer 3 is a mode of the light that is resonant inside the insulating layer 3. The waveguide mode becomes stronger as the optical refraction index is larger. That is, a light confinement effect in the oxide film is larger on the periphery of the isolated metals 1.

In Embodiment 10, even when the isolated metals 1 are separated from the vicinity of the graphene layer 2, the light confinement effect in the insulating layer hardly changes. Therefore, because the influence of the isolated metals 1 to the photocurrent that flows in the graphene layer 2 becomes small, a higher-speed response becomes possible.

The hollow structure according to Embodiment 10 of the present invention may be formed by holding the isolated metals 1 by a structure that does not remarkably deteriorate the light confinement effect of the isolated metals 1. The hollow structure may also be formed by holding the isolated metals 1 with a film structure such as an oxide film.

Embodiment 11

Figure 27:
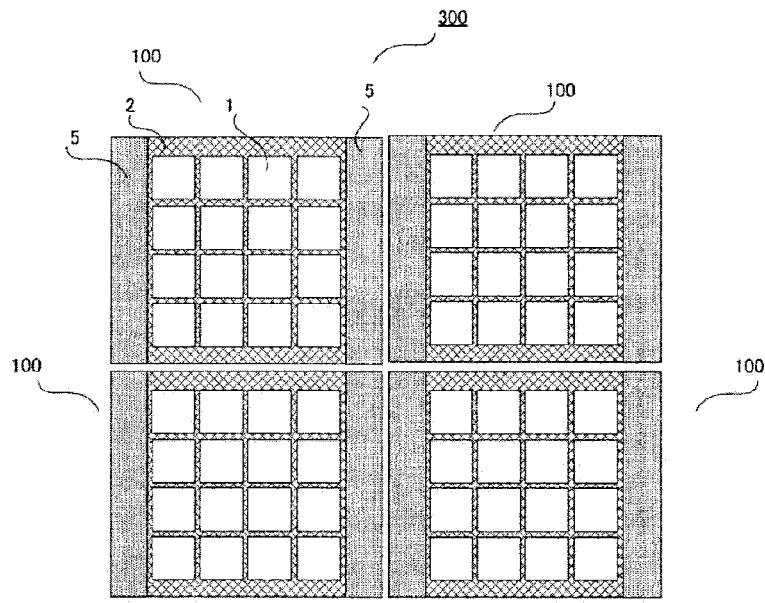
FIG. 27 is a top view of an electromagnetic wave detector array according to Embodiment 11 of the present invention.

FIG. 27 is a top view of an electromagnetic wave detector array according to Embodiment 11 of the present invention, the whole electromagnetic wave detector array being denoted by 300. The electromagnetic wave detector array 300 configures an image sensor by arranging, in a one-dimensional or two-dimensional array, a plurality of electromagnetic wave detectors (the electromagnetic wave detector 100, for example) in which the sizes of the isolated metals 1 are uniform out of the electromagnetic wave detectors described in Embodiments 1 to 10.

With such a configuration, it is possible to obtain an image sensor capable of detecting light intensity of incident light having a predetermined wavelength out of incident light. Preferably, on the outside of an electromagnetic wave detector array part, there are set a circuit that reads electric signals obtained from respective electromagnetic wave detectors, a matrix selection circuit, and the like.

Embodiment 12

Figure 28:
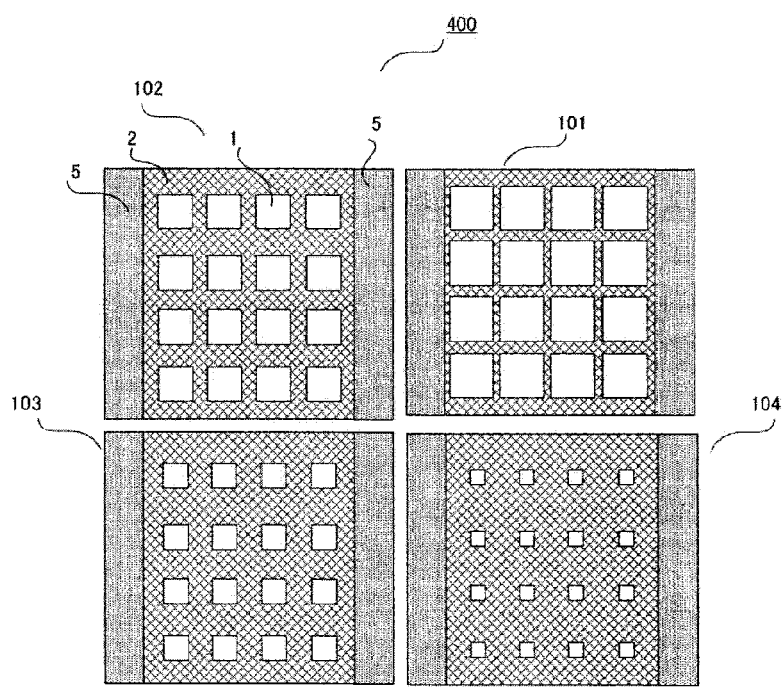
FIG. 28 is a top view of an electromagnetic wave detector array according to Embodiment 12 of the present invention.

FIG. 28 is a top view of an electromagnetic wave detector array according to Embodiment 12 of the present invention, the whole electromagnetic wave detector array being denoted by 400. The electromagnetic wave detector array 400 configures an image sensor by arranging, in a one-dimensional or two-dimensional array in a regular state, electromagnetic wave detectors 101, 102, 103, and 104 having the isolated metals 1 of different sizes out of the electromagnetic wave detectors described in Embodiments 1 to 10. As described above, by changing the size L of one side of the isolated metal 1 formed in an absorbing body of the electromagnetic wave detector, a detection wavelength of the sensor constituting a pixel can be changed. That is, by providing grooves having different depths in the absorbing body of each sensor, the electromagnetic wave detector array can be used as an imager that detects an image having incident light intensity information of wavelengths different depending on pixels.

Influences that the height h and the period s of the isolated metals 1 and the thickness t of the insulating layer 3 apply to the determination of the absorption wavelength are small. However, the height h, the period s, and the thickness t may be changed relative to the length L of one side. That is, an absorption rate in a desired wavelength can be maximized by optimizing S/L and by optimizing h/L and t/L. Consequently, by arraying pixels having different sensor structures in which at least one of L, s, h, and t is different, the electromagnetic wave detector array can be used as an image sensor capable of obtaining information having different wavelength information.

By arraying the pixels having different detection wavelengths as described above, a colored image can be obtained in the infrared wavelength region, similarly to the image sensor in the visible light region. For a usage other than the image sensor, the electromagnetic wave detector array can be used as an arrayed sensor for detecting a position of an object in a small number of pixels. Based on the present structure, an image sensor capable of detecting light intensity of a plurality of wavelengths can be obtained. Accordingly, a plurality of wavelengths can be imaged without using a color filter which has been necessary in a general CMOS sensor and the like.

Embodiment 13

Figure 29:
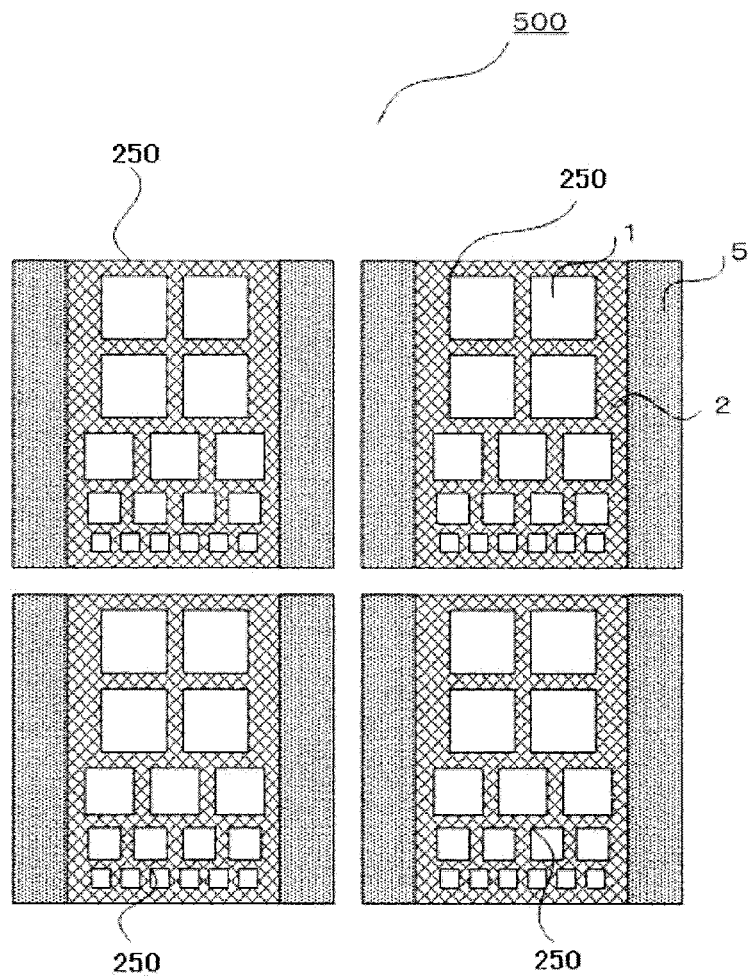
FIG. 29 is a top view of an electromagnetic wave detector array according to Embodiment 13 of the present invention.

FIG. 29 is a top view of an electromagnetic wave detector array according to Embodiment 13 of the present invention, the whole electromagnetic wave detector array being denoted by 500. The electromagnetic wave detector array 500 configures an image sensor by arranging, in a one-dimensional or two-dimensional array in a regular state, electromagnetic wave detectors 250 formed by arranging a plurality of kinds of isolated metals 1 of different sizes, out of the electromagnetic wave detectors described in Embodiments 1 to 10.

With such a structure, absorption of a multi-wavelength becomes possible in one electromagnetic wave detector 250. Accordingly, the electromagnetic wave detector array having a broad swift-current wavelength characteristic can be obtained.

Embodiment 14

Figure 30:
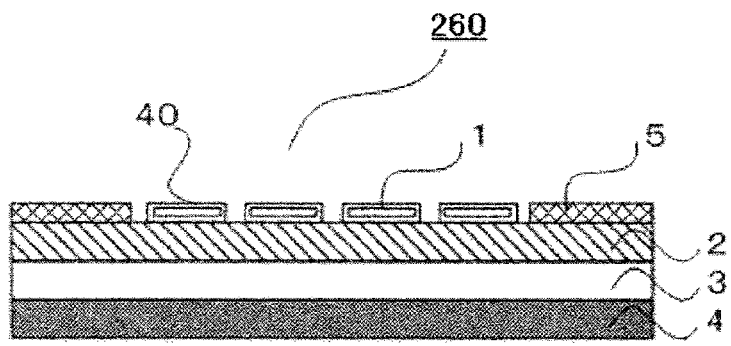
FIG. 30 is a sectional view of an electromagnetic wave detector according to Embodiment 14 of the present invention.

FIG. 30 is a sectional view of an electromagnetic wave detector according to Embodiment 14 of the present invention, the whole electromagnetic wave detector being denoted by 260. In the electromagnetic wave detector 260, an isolated metal insulating film 40 is set between the isolated metals 1 and the graphene layer 2, thereby electrically insulating the isolated metals 1 from the graphene layer 2. When the isolated metals 1 are electrically in contact with the graphene layer 2, a potential is generated in the isolated metals 1 at the time of taking out the electric signal from the electrodes 5. This potential has a possibility of giving an influence to the light confinement effect between the isolated metals 1 and the metal layer 4. Because the potential has a fine difference between a plurality of set isolated metals 1, there is a possibility of occurrence of a difference in the light confinement effect between the isolated metals 1. On the other hand, the electromagnetic wave detector 260 can solve these problems, and the electromagnetic wave detector 260 with stable detection intensity can be provided.

Embodiment 15

Figure 31:
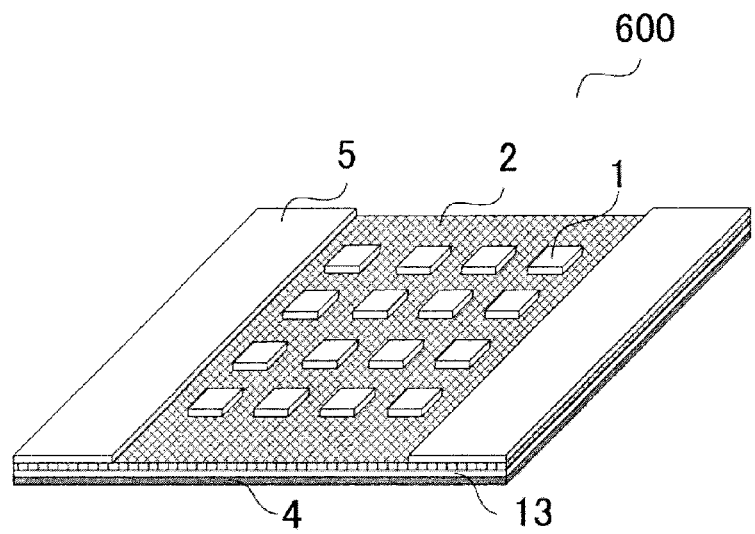
FIG. 31 is a perspective view of an electromagnetic wave detector according to Embodiment 15 of the present invention.
Figure 32:
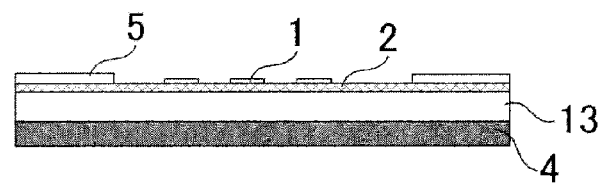
FIG. 32 is a sectional view of the electromagnetic wave detector according to Embodiment 15 of the present invention.

FIG. 31 is a perspective view of an electromagnetic wave detector according to Embodiment 15 of the present invention, the whole electromagnetic wave detector being denoted by 600, and FIG. 32 is a sectional view of the electromagnetic wave detector 600.

The electromagnetic wave detector 600 is different from the electromagnetic wave detector 100 according to Embodiment 1 of the present invention in that the graphene layer 2 is arranged on the semiconductor layer 13. The graphene layer 2 forms a Schottky junction with the semiconductor layer 13. The electrodes 5 and the graphene layer 2 are electrically connected to each other. The graphene layer 2 is connected to the electric circuit for taking out a change in a photocurrent of an external bias and the like, via the electrodes 5. As a reading method of the electric signal, an incident electromagnetic wave can be detected by detecting a current amount change and a voltage value change between the electrodes 5 and the metal layer 4.

Interaction of the semiconductor layer 13, the graphene layer 2, and the isolated metals 1 will be described in detail in Embodiment 16.

Embodiment 16

Figure 33:
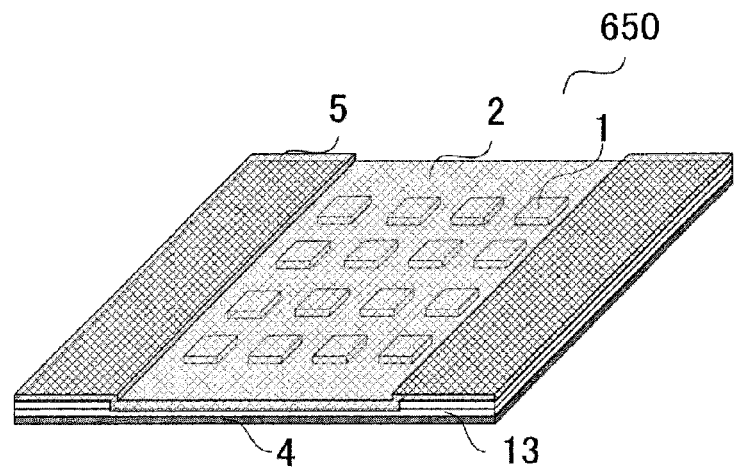
FIG. 33 is a perspective view of an electromagnetic wave detector according to Embodiment 16 of the present invention.
Figure 34:
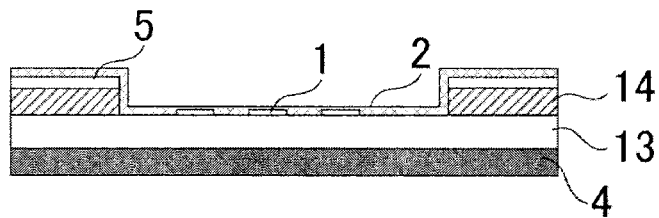
FIG. 34 is a sectional view of the electromagnetic wave detector according to Embodiment 16 of the present invention.

FIG. 33 is a perspective view of an electromagnetic wave detector according to Embodiment 16 of the present invention, the whole electromagnetic wave detector being denoted by 650, and FIG. 34 is a sectional view of the electromagnetic wave detector 650.

The electromagnetic wave detector 650 is different from the electromagnetic wave detector 100 according to Embodiment 1 of the present invention in that the graphene layer 2 is arranged on the semiconductor layer 13 and the isolated metals 1. Particularly, in the electromagnetic wave detector 650, after the metal layer 4, the semiconductor layer 13, the insulating layer 14, the electrodes 5, and the isolated metals 1 are formed, the separately-prepared graphene layer 2 is bonded to the top. Therefore, the graphene layer 2 of a satisfactory quality that does not receive the influence of the manufacturing process can be used, and light can be absorbed more highly efficiently.

The graphene layer 2 forms a Schottky junction with the semiconductor layer 13. Preferably, the graphene layer 2 and the electrodes 5 are satisfactorily electrically connected. Preferably, post-processing such as lamp annealing and pre-processing such as sputter etching and wet processing are performed when preparing the graphene layer 2. The electric circuit for taking out a change in a photocurrent of an external bias and the like is connected to the graphene layer 2 via the electrodes 5. For example, as a reading method of the electric signal, an incident electromagnetic wave can be detected by detecting a current amount change and a voltage value change between the electrodes 5 and the metal layer 4.

Interaction of the semiconductor layer 13, the graphene layer 2, and the isolated metals 1 of the electromagnetic wave detector 650 will be described with reference to FIG. 35. The semiconductor layer 13 is made of silicon herein. A normal thickness of about a few 100 μm for a substrate is assumed as a thickness of silicon. However, the thickness of silicon in this case does not give a large influence to the effect. The thickness h of the isolated metal 1 was 200 nm. FIG. 36 shows a result of obtaining a transmission factor by the electromagnetic field analysis when the length L of one side is 1.0 μm, 1.5 μm, and 2.0 μm, respectively, and when the period S is 3 μm.

FIG. 36 is a graph of the transmission characteristics, obtained by the electromagnetic field analysis, of the electromagnetic wave detector 650 according to Embodiment 16 of the present invention. The horizontal axis represents a wavelength of incident light, and the vertical axis represents a transmission factor. As can be seen from FIG. 36, attenuation of the transmission factor appears near 10 µm. The attenuation of the transmission factor is due to the plasmon resonance of the isolated metals 1. It can be understood that in the structure in which only the isolated metals 1 are formed on the silicon, the plasmon resonance is determined not by the length S of one side but by the period S. An attenuation rate becomes larger as L becomes large relative to S. This indicates that when L is larger than S, the plasmon resonance is also large. Particularly, this structure is also referred to as a metamaterial because the resonance wavelength is larger than S. Further, in the electromagnetic wave detector 650, because the plasmon resonance occurs in the isolated metals 1, incidence angle dependence is small. Therefore, the resonance wavelength does not greatly change even when the incidence angle changes.

Figure 35:
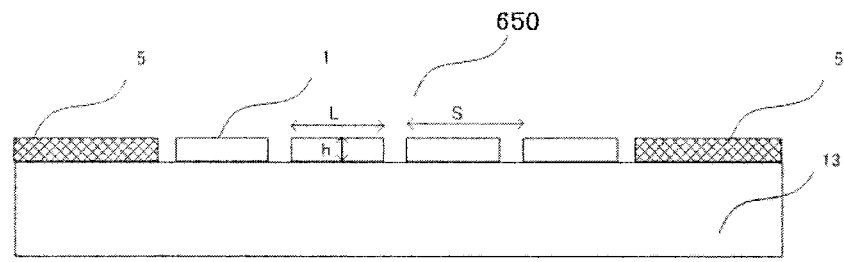
FIG. 35 is a sectional view of an electromagnetic wave detector according to Embodiment 16 of the present invention.
Figure 36:
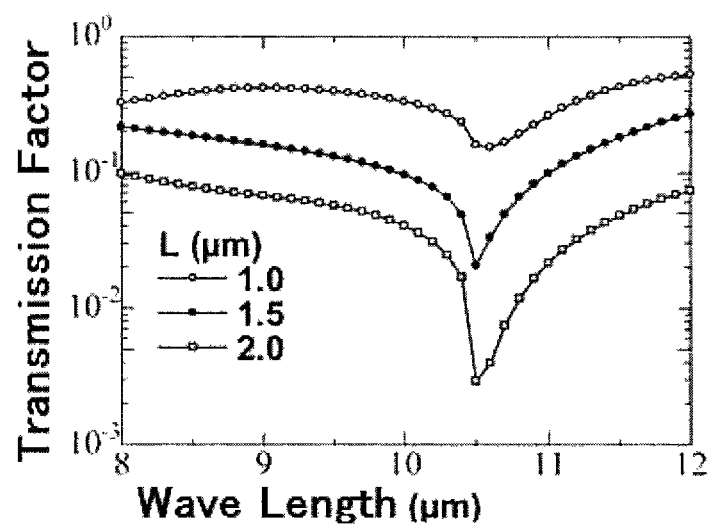
FIG. 36 shows a transmission factor in a structure shown in FIG. 35.
Figure 37:
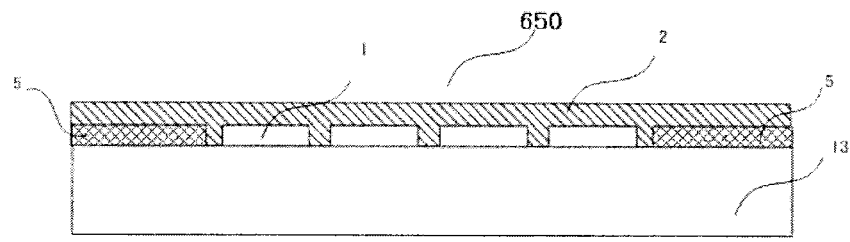
FIG. 37 is a sectional view of a structure obtained by introducing graphene into the structure shown in FIG. 35.
Figure 38:
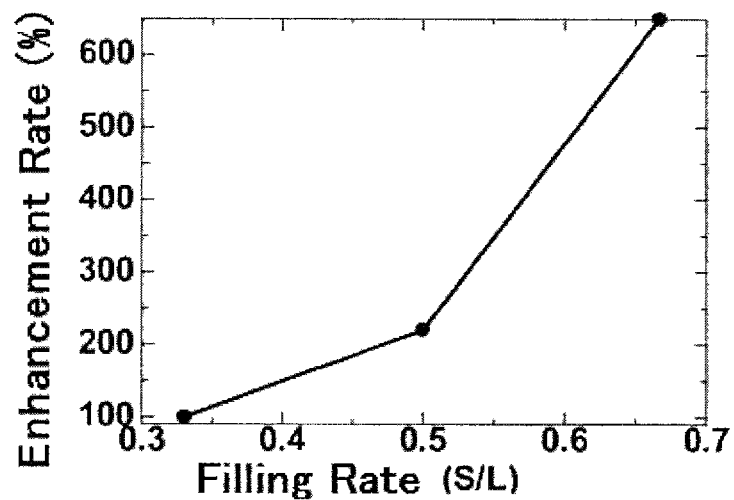
FIG. 38 is a diagram for explaining an enhancement effect of plasmon resonance by graphene.

Next, as shown in FIG. 37, a sample in which the graphene layer 2 is film-formed on the structure shown in FIG. 35 was actually manufactured, and the transmission factor was measured. Then, a ratio of the transmission factor in the structure (FIG. 37) in which graphene was film-formed to the transmission factor in the structure (FIG. 35) without graphene (an amplification rate of the transmission factor) was obtained. In FIG. 38, the vertical axis shows an enhancement rate of the transmission factor, and the horizontal axis shows a filling rate (a filling rate is defined as L/S) of the structure.

As can be seen from FIG. 38, when the filling rate L/S is larger, the enhancement effect of the transmission factor becomes large. For example, it can be understood that when the filling factor is equal to or higher than 50%, the enhancement rate is 200% or more. That is, FIG. 38 shows that the plasmon resonance is enhanced when the graphene layer 2 is in contact with the silicon (the semiconductor layer 13). As described above, together with the result of FIG. 36, the enhancement effect by graphene becomes larger as the plasmon resonance is larger. This can be said as the result of interaction between the plasmon resonance and graphene.

As described above, the plasmon resonance is greatly enhanced by using the isolated metals 1, the graphene layer 2, and the semiconductor layer 13. Consequently, detection sensitivity can be increased by using the electromagnetic wave detector 650 (similarly, the electromagnetic wave detector 600).

Further, the structure alone in FIG. 31 and FIG. 33 can also be used for on-chip analysis and an analysis filter for refractive index and gas analysis.

Assume that a wave number of the surface plasmon is $k_{sp}$, a dielectric constant of a metal is $\varepsilon_1$, and a dielectric constant of a dielectric substance is $\varepsilon_2$. Then, a dispersion relation of the surface plasmon is generally expressed by the following equation.

$$k_{sp} = \frac{\omega}{c}\sqrt{\frac{\varepsilon_1 \varepsilon_2}{\varepsilon_1 + \varepsilon_2}}$$

In the equation, $\overline{\omega}$ is a frequency, and c is a vacuum optical speed. That is, the equation becomes a resonance condition for exciting the surface plasmon between the dielectric substance and the metal.

As described above, the surface plasmon resonance wavelength is determined by the dielectric constant of the metal and the surrounding medium. That is, because the resonance wavelength sensitively changes depending on the surrounding substance of the isolated metals 1, the surrounding substance can be analyzed. Specifically, the electromagnetic wave detector 650 can be used for a filter in the analysis of an organic material in a biotechnology field, a gas analysis having a specific absorption peak, and the like.

As described above, the plasmon resonance is enhanced by the interaction between graphene and the plasmon resonance. Therefore, when the electromagnetic wave detector 650 is used for an on-chip analysis sensor and an analysis transmission filter, there is a significant effect that the sensitivity increases than that of the electromagnetic wave detector having a conventional structure. Particularly, in the structure of the present invention, because the incidence angle dependence is low, the influence to the resonance wavelength is small even when the angle of the incident light changes, and the influence of the object to be analyzed is greatly reflected. Therefore, the analysis precision becomes high as compared with that of the on-chip analysis sensor and the gas analysis transmission filter using the normal surface plasmon. Further, because the mechanism for holding the incidence angle accurately constant is not necessary, the structure can be made compact as the analysis device. Further, the number of assembling steps can be decreased.

Embodiment 17

Figure 39:
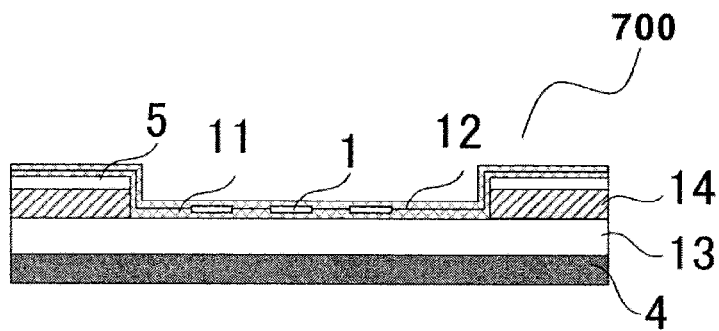
FIG. 39 is a sectional view of an electromagnetic wave detector according to Embodiment 17 of the present invention.

FIG. 39 is a sectional view of an electromagnetic wave detector according to Embodiment 17 of the present invention, the whole electromagnetic wave detector being denoted by 700. In the electromagnetic wave detector 700, the first graphene layer 11 is provided below the isolated metals 1, and the second graphene layer 12 is provided above the isolated metals 1. Other structures are the same as those of the electromagnetic wave detector 600 in Embodiment 15.

In the electromagnetic wave detector 700 according to Embodiment 17 of the present invention, two graphene layers (the first graphene layer 11 and the second graphene layer 12) are arranged on the periphery of the isolated metals 1. Therefore, the optical absorption rate can be further improved, and a change amount in the electric characteristics of the light having a specific polarization component and a specific wavelength component can be increased.

Embodiment 18

FIG. 40 is a sectional view of an electromagnetic wave detector according to Embodiment 18 of the present invention, the whole electromagnetic wave detector being denoted by 800.

The electromagnetic wave detector 800 is different from the electromagnetic wave detector 100 according to Embodiment 1 in that the graphene layer 2 is arranged on a ferroelectric layer 15. The electrodes 5 and the graphene layer 2 are electrically connected to each other. As ferroelectric materials, PZT ($PbZr_xTi_{1-x}O_3$), SBT ($SrBi_2Ta_2O_9$), and the like are used, and these materials have a polarization characteristic. The ferroelectric materials have a crystalline structure referred to as a perovskite structure, and polarization values change depending on an electric field applied to the ferroelectric materials. The electric field applied to the ferroelectric layer 15 changes depending on a potential change of the graphene layer 2 by incidence of an electromagnetic wave, and the polarization value of the ferroelectric layer 15 changes. The electromagnetic wave detector 800 can detect the incident electromagnetic wave by detecting the change in the polarization value.

When a transition metal dichalcogenide layer is used in place of the semiconductor layer 13, the insulating layer 14, and the ferroelectric layer 15, photoelectric conversion efficiency can also be increased because a heterojunction is formed between the graphene layer and the transition metal dichalcogenide layer.

To simply show a detection method of the electromagnetic wave, FIG. 40 exemplifies a detection method of measuring a short-circuit current between the electrodes 5 and the metal layer 4. However, other detection method may also be used.

Next, a manufacturing method of the electromagnetic wave detector 800 according to Embodiment 18 of the present invention will be described with reference to FIGS. 41A to 41G. FIGS. 41A to 41G are sectional views of a manufacturing process of the electromagnetic wave detector 800, and the manufacturing method includes the following steps 1 to 7.

Step 1: As shown in FIG. 41A, the flat metal layer 4 made of Au, Ag, Cu, Al, Ni, Cr, Ti, or the like is formed. The metal layer 4 may be formed on a flat substrate of Si or the like, or the metal layer 4 may be independently formed. After the metal layer 4 is formed on a flat substrate of Si or the like, the metal layer 4 may be formed independently by removing the substrate. A portion that is not used as the electromagnetic wave detector may be patterned in an arbitrary shape.

Step 2: As shown in FIG. 41B, the ferroelectric layer 15 made of PZT ($PbZr_xTi_{1-x}O_3$), SBT ($SrBi_2Ta_2O_9$), and the like is formed on the metal layer 4. The ferroelectric layer 15 may be film-formed by any one of sputtering, CVD, and a zol-gel method. In this case, preferably, a surface of the ferroelectric layer 15 is formed to be flat and parallel to the surface of the metal layer 4. A flattening step such as CMP polishing and heat treatment may also be implemented.

Step 3: As shown in FIG. 41C, the graphene layer 2 is deposited on the insulating layer 3. In this case, the graphene layer 2 may be film-formed by a method such as epitaxial growth, or the graphene layer film-formed in advance may be bonded to the insulating layer 3.

Step 4: As shown in FIG. 41D, a pattern of the photoresist 20 is formed on the graphene layer 2 by using the method such as photoengraving and EB drawing, and the electrode 5 made of Au, Ag, Cu, Al, Ni, Cr, Ti, or the like is deposited on the pattern of the photoresist 20.

Step 5: As shown in FIG. 41E, the electrodes 5 are formed by lifting off the pattern of the photoresist 20. In this case, preferably, the electrodes 5 are electrically connected to the graphene layer 2 in a satisfactory state. For this purpose, it is preferable to perform post-processing such as annealing, and pre-processing such as sputter etching and wet processing.

Step 6: As shown in FIG. 41F, a resist pattern 21 is formed on the graphene layer 2 by using the method such as photoengraving and EB drawing, and a metal layer made of Au, Ag, Cu, Al, Ni, Cr, Ti, or the like is deposited on the resist pattern 21.

Step 7: As shown in FIG. 41G, the isolated metals 1 are formed by lifting off the resist pattern 21. The electromagnetic wave detector 800 shown in FIG. 40 is completed by the above steps.

Embodiment 19

Figure 42:
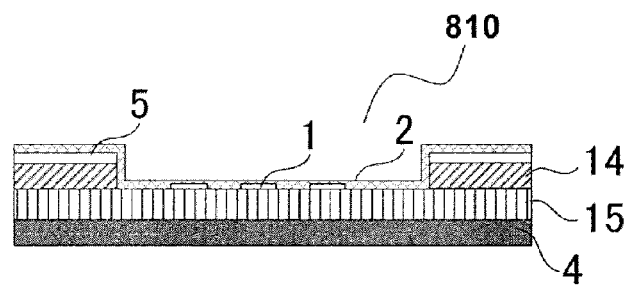
FIG. 42 is a sectional view of an electromagnetic wave detector according to Embodiment 19 of the present invention.

FIG. 42 is a sectional view of an electromagnetic wave detector according to Embodiment 19 of the present invention, the whole electromagnetic wave detector being denoted by 810.

The electromagnetic wave detector 810 is different from the electromagnetic wave detector 800 in Embodiment 18 in that the graphene layer 2 is arranged on the ferroelectric layer 15 and the isolated metals. The electromagnetic wave detector 810 according to the present embodiment is manufactured by forming the metal layer 4, the ferroelectric layer 15, the insulating layer 14, the electrodes 5, and the isolated metals 1, and then bonding the separately-prepared graphene layer 2 on the top. Therefore, the electromagnetic wave detector 810 can use the graphene layer 2 of a satisfactory quality that does not receive the influence of the manufacturing process, and can absorb light more efficiently. Preferably, the graphene layer 2 and the electrodes 5 are satisfactorily electrically connected. Preferably, a post-processing such as lamp annealing and a pre-processing such as sputter etching and wet processing are performed.

The electric field applied to the ferroelectric layer 15 changes depending on a potential change of the graphene layer 2 by incidence of an electromagnetic wave, and the polarization value of the ferroelectric layer 15 changes. The electromagnetic wave detector 810 can detect the incident electromagnetic wave by detecting the change in the polarization value.

Embodiment 20

Figure 43:
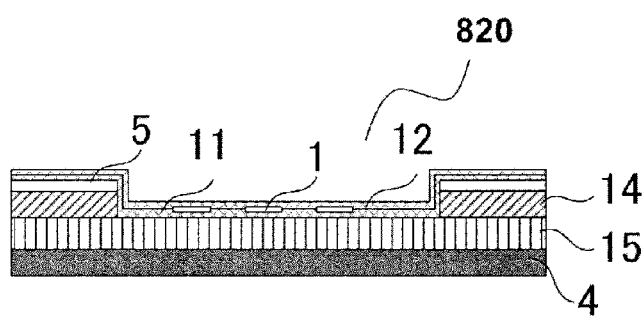
FIG. 43 is a sectional view of an electromagnetic wave detector according to Embodiment 20 of the present invention.

FIG. 43 is a sectional view of an electromagnetic wave detector according to Embodiment 20 of the present invention, the whole electromagnetic wave detector being denoted by 820.

In the electromagnetic wave detector 820 according to Embodiment 20 of the present invention, the first graphene layer 11 is provided below the isolated metals 1, and the second graphene layer 12 is provided above the isolated metals 1. Other structures are the same as those of the electromagnetic wave detector 800 in Embodiment 18. In the electromagnetic wave detector 820 according to the present embodiment, a plurality of graphene layers (two layers of the first graphene layer 11 and the second graphene layer 12) are arranged on the periphery of the isolated metals 1. Therefore, the optical absorption rate can be improved, and a change amount in the electric characteristics of the light having a specific polarization component and a specific wavelength component can be increased.

In the electromagnetic wave detectors 800, 810, and 820 according to Embodiments 18 to 20, when the ferroelectric layer 15 is a monocrystal, a larger change in the polarization value of the ferroelectric layer 15 can be obtained, and the electromagnetic wave detector can have higher sensitivity.

Embodiment 21

Figure 44:
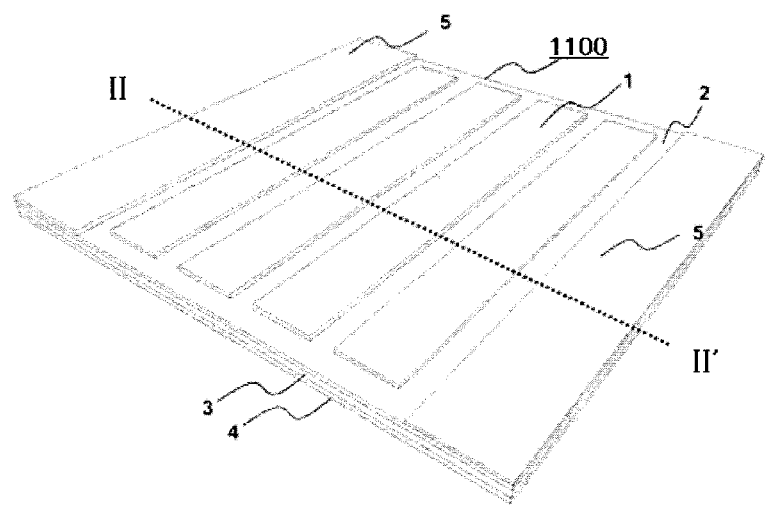
FIG. 44 is a perspective view of an electromagnetic wave detector according to Embodiment 21 of the present invention.
Figure 45:
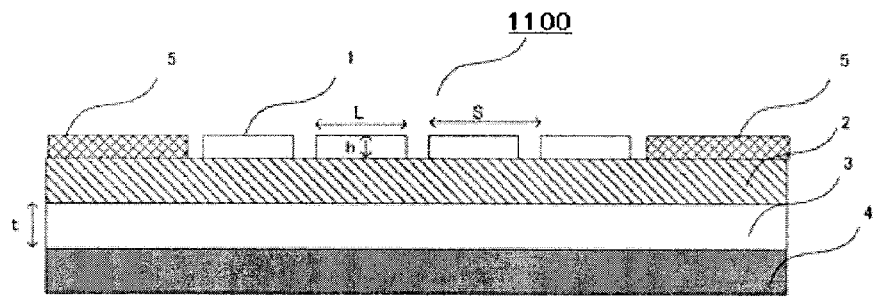
FIG. 45 is a sectional view of the electromagnetic wave detector according to Embodiment 21 of the present invention, taken along II-II'.
Figure 46:
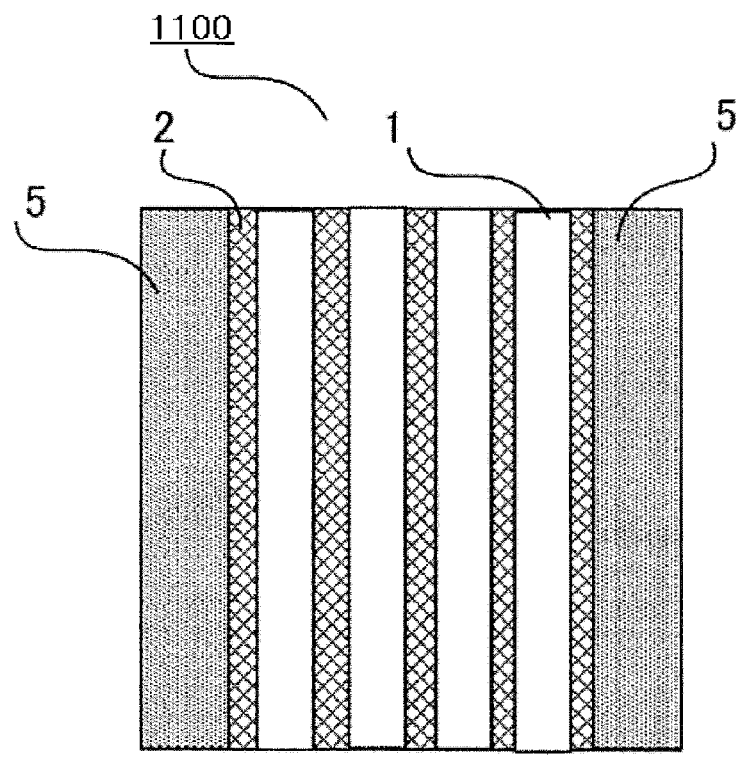
FIG. 46 is a top view of an incident surface of the electromagnetic wave detector according to Embodiment 21 of the present invention.

FIG. 44 is a perspective view of an electromagnetic wave detector according to Embodiment 21 of the present invention, the whole electromagnetic wave detector being denoted by 1100. FIG. 45 is a sectional view of the electromagnetic wave detector taken along II-II' in FIG. 44 (a cross section perpendicular to the longitudinal direction of the isolated metals 1 in a stripe shape). FIG. 46 is a plan view of the electromagnetic wave detector in FIG. 45 when viewed from an upper surface (also referred to as a "surface" or an "incident surface").

As shown in FIGS. 44 to 46, particularly, as shown in FIG. 45, the electromagnetic wave detector 1100 includes the metal layer 4 formed on a substrate (not shown), the insulating layer 3 having a thickness t provided on an upper surface of the metal layer 4, the graphene layer 2 provided on an upper surface of the insulating layer 3, and the isolated metals 1 arranged on the graphene layer 2 one-dimensionally to have the period S. Each isolated metal 1 is formed in a stripe shape (rectangular) having a length L in one side in the short-side direction (a short side) and a thickness h. The length in the longitudinal direction (a long side) is not limited as long as it is larger than L. On the other hand, two electrodes 5 are arranged, on the graphene layer 2, at opposite positions with the isolated metals 1 therebetween. The electrodes 5 are terminals for reading electric signals, and the dimension and the shape thereof are not particularly limited.

The graphene layer 2 may be in a single layer or two or more layers. When the lamination number of the graphene layer 2 is increased, the optical absorption rate increases. Two arbitrary laminated layers may have a laminate structure in which orientations of lattice vectors do not coincide in a hexagonal lattice, that is, crystal orientations are displaced, or a laminate structure in which lattice vectors completely coincide with each other.

The substrate on which the metal layer 4 is formed may be a semiconductor substrate or the like as long as it can hold the electromagnetic wave detector according to the present invention. Alternatively, a high-resistance silicon substrate having an insulation property, or a substrate having an increased insulation property by forming a thermal oxide film may be used as appropriate.

The number of the isolated metals 1 is not restricted to those shown in FIGS. 44 to 46, and can be appropriately selected.

The isolated metals 1 and the metal layer 4 are made of metal. Particularly, it is preferable that the isolated metals 1 and the metal layer 4 are formed of metal that can easily generate surface plasmon resonance, or formed of metal having high reflectance in a target waveform in the infrared wavelength region and the like. For example, the isolated metals 1 and the metal layer 4 are formed of Au, Ag, Cu, Al, Ni, Cr, or the like. That is, materials having a negative dielectric constant are preferable. However, when a metal with a large loss is used, wavelength selectivity, that is, monochromaticity may be degraded, such as spread of a half-value width in the absorption rate characteristics. Accordingly, a kind of metal is appropriately selected depending on a half-value width of a required detection wavelength. On the contrary, by using a metal with a large loss, it is possible to provide broad absorption, such as detection of a broad wavelength region.

Preferably, the insulating layer 3 is formed of an insulation substance such as silicon oxide ($SiO_2$), silicon nitride (SiN), aluminum oxide, nickel oxide, and silicon. A similar effect can be obtained by use of a semiconductor material such as Si and GaAs.

Figure 47:
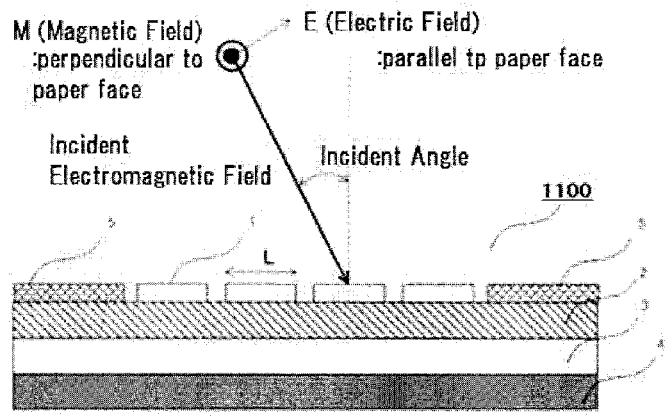
FIG. 47 is a view showing a relation between a direction of striped isolated metals of the electromagnetic wave detector and a direction of an electric field of an incident electromagnetic wave according to Embodiment 21 of the present invention.

Next, an operation principle of the electromagnetic wave detector 1100 according to Embodiment 21 of the present invention will be described. When light (an electromagnetic wave) is incident to the electromagnetic wave detector 1100, the incident electromagnetic wave having an electric field component perpendicular to the longitudinal direction of the isolated metals 1 generates main resonance, because the patterns of the isolated metals 1 periodically formed on the incidence surface are arranged one-dimensionally. On the other hand, the incident electromagnetic wave (referred to as TE polarization) having a parallel electric field component does not generate resonance, or the resonance becomes weaker than that of the incident electromagnetic wave having a perpendicular electric field component (referred to as TM polarization). FIG. 47 generally shows this relation added to the sectional view of FIG. 45. The electromagnetic wave detector 1100 mainly absorbs the light in the polarization direction (the TM polarization) having an electric field component parallel to a striped plane (a paper surface) perpendicular to the longitudinal direction and having an electromagnetic field component perpendicular to the paper surface. However, the electromagnetic wave detector 1100 hardly absorbs the TE polarization. Accordingly, the polarization angle can be separated.

When the length in the longitudinal direction is sufficiently long as compared with L, the incident electromagnetic wave having the parallel electric field component is not absorbed without substantially generating resonance. Accordingly, only the polarization in a specific direction can be absorbed. A specific polarization selection effect will be described in detail later by using an electromagnetic field calculation. That is, the light having a resonant wavelength is selected out of the incident light. Further, the light in a waveguide mode guided by the insulating layer 3 is further selected out of the selected light.

Next, resonance occurs in the insulating layer 3 sandwiched between the isolated metals 1 and the metal layer 4. Light having a resonance wavelength is also selected herein. In this case, because the insulating layer 3 is very thin as compared with a wavelength of the incident light, resonance in a thickness direction of the insulating layer 3 does not become dominant. Consequently, practically, resonance in the L direction in a short direction of the isolated metals 1 becomes dominant. Because the graphene layer is a monoatomic layer, its effect as a structure is weak with respect to the incident electromagnetic wave, and the influence to the optical resonance phenomenon can be ignored. Resonance is particularly strong at the edge portion of the isolated metals 1. Therefore, regarding the absorption characteristics, a similar effect can be obtained in the case of the present embodiment in which the graphene layer 2 is below the isolated metals 1 and in the case of other embodiments in which the graphene layer 2 is above the isolated metals 1.

The above-described resonance occurs on the incident surface side of the electromagnetic wave detector 1100. This is particularly referred to as pseudo surface plasmon resonance, in view of the surface plasmon resonance, plasmon resonance, or resonance on a metal surface other than a visible region to a near infrared wavelength region as wavelength regions in which surface plasmon polariton generally occurs. However, in recent years, handling these resonance phenomena as surface plasmon or plasmon regardless of a wavelength region has become the mainstream. Similarly, in a sense that a specific wavelength is controlled by a structure equal to or smaller than a normal wavelength, these resonance phenomena are also referred to as a metamaterial or a plasmonic metamaterial. However, essentially, absorptions occur by specific resonance formed by the surface of the isolated metals 1 and by the isolated metals 1 and the metal layer 4, as described above. Therefore, these names are not distinguished herein, and are handled as the same from a phenomenon aspect. Herein, these resonances are referred to as surface plasmon resonance, plasmon resonance, or simply resonance.

Figure 48A:
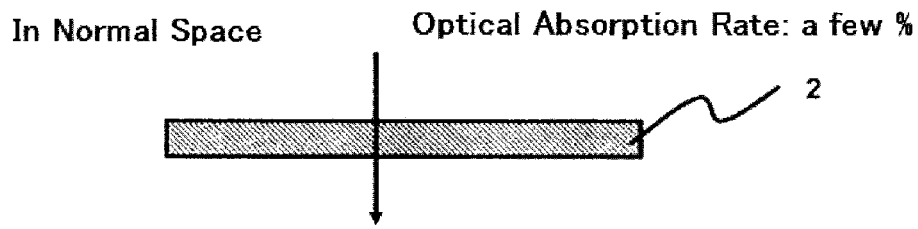
FIG. 48A is a view for explaining light absorption in graphene in normal electromagnetic wave incidence according to Embodiment 21 of the present invention.
Figure 48B:
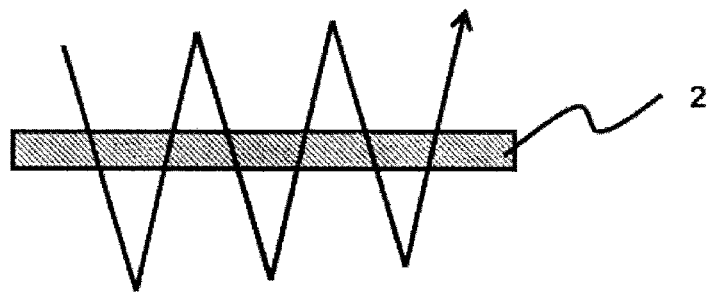
FIG. 48B is a view for explaining light absorption in graphene in a resonator according to Embodiment 21 of the present invention.

As described above, light is strongly localized on the periphery of the isolated metals 1, based on plasmon resonance in a specific wavelength. In this case, because the graphene layer 2 below the isolated metals 1 is arranged in the resonator, the graphene layer 2 can finally absorb all the localized light. As indicated by an analysis result described later, the light near the isolated metals 1 is localized by substantially 100 percent. Accordingly, the optical absorption rate of the graphene layer in the normal light incidence as shown in FIG. 48A is normally 2.3%, whereas the electromagnetic wave is repeatedly made incident to the graphene layer 2 in the resonator, as shown in FIG. 48B. Therefore, in the graphene layer 2 set in the resonator, all (100%) of the localized light can be finally absorbed. Consequently, sensitivity increases based on substantial increase in an output photocurrent. In the operating state of the detector, the detector detects the photocurrent generated by the electromagnetic wave incidence to the graphene layer 2. At this time, the detector operates when the electrodes 5 on both ends of a photocurrent generation path of the graphene layer 2 are either with or without an external bias. Normally, detection efficiency of a generated carrier can be increased by bias application.

An electric circuit for taking out a change in the photocurrent of the external bias and the like is connected to the graphene layer 2 via the electrode 5. As a reading method of an electric signal, for example, when a voltage is applied between the two-terminal electrodes 5, the amount of conducted current changes based on an electric signal which is a change in resistance value in the graphene layer 2. By detecting the change in the current amount, the incident electromagnetic wave can be detected. A change amount of a voltage value may be measured by adding a circuit for passing a constant current between the two-terminal electrodes 5.

Further, an electric signal may be taken out by forming a transistor structure obtained by combining the metal layer 4 as a gate terminal with the two-terminal electrodes 5. A further larger electric field can be generated by applying a voltage to the metal layer 4, and a carrier generated by the incidence of an electromagnetic wave can be detected highly efficiently. Further, a potential change of the graphene layer 2 due to the incidence of the electromagnetic wave may be taken out by the electrode 5 provided with only one terminal.

In the embodiments described below, to simplify the detection method, detection of an electric resistance between the two-terminal electrodes 5 as shown in FIG. 44 will be described as a representative example. However, other detection method can also be used.

The film thickness h of the isolated metal 1 will be described next. When the film thickness h becomes large, resonance also occurs in the thickness direction. Therefore, resonance also occurs in a height direction. Accordingly, incidence angle dependence of detection efficiency becomes large. As a result, light other than a vertical incidence is not absorbed in a specific wavelength, and there is a tendency that a detection output is lowered. That is, it is preferable to make the film thickness h as small as possible by satisfying at least h<L (a length of a short side of the isolated metal 1).

A lower limit of the film thickness h will be described.

$$\delta = (2/\mu\sigma\overline{\omega})^{1/2}$$

where, $\mu$ and $\sigma$ are a transmission factor and electric conductivity of the isolated metal 1, respectively, and
$\overline{\omega}$ is an angular frequency of an electromagnetic wave having a detection wavelength For the detection wavelength, when the film thickness h is about two times or more than a skin depth (from about a few 10 nm to about a few 100 nm in the infrared wavelength region, although the thickness changes depending on a wavelength) expressed by the above equation, it can be generally said that leakage of incident light is sufficiently small. Therefore, a minimum film thickness of the film thickness h must satisfy the above condition. As indicated by the following analysis, in the infrared wavelength region, sufficient absorption occurs when the film thickness h is about a few 10 nm to 100 nm or more, and the film thickness h of about 200 nm is sufficient. Thus, when the film thickness of the isolated metal 1 is small, the surface plasmon resonance occurs mainly in the in-plane direction of the isolated metal 1, and a wavelength of the absorbed incident light is determined by the size of the isolated metal 1.

On the other hand, when the film thickness h becomes large and becomes larger than ¼ of L, resonance also occurs in a film thickness direction (a direction perpendicular to the in-plane direction), and the incidence angle dependence of the absorption characteristics becomes large. Further, because a resonance direction is not at one position, a problem occurs in that the absorption wavelength becomes a multi-wavelength.

As described above, when the film thickness of the isolated metal 1 is very small, the absorption wavelength is determined mainly by resonance in the in-plane direction. As a result, the incidence angle dependence of the absorption wavelength becomes small. Consequently, even when the incidence angle changes, little change occurs in the absorption characteristics such as the absorption wavelength and the absorption rate.

For example, when the film thickness of the isolated metal 1 is 500 nm and relatively large, but is equal to or smaller than ¼ of the wavelength of incident light, the incidence angle dependence of the absorption wavelength occurs but the wavelength of the absorption light and radiation light is not affected on the other hand. Therefore, when light is perpendicularly incident to the electromagnetic wave detector 1100, the film thickness of the isolated metal 1 may be relatively large as long as the film thickness of the isolated metal 1 is under the condition of ¼ or smaller of the wavelength of the incident light.

Similarly, for the insulating layer 3, in order to avoid the occurrence of resonance in a film thickness direction (a direction perpendicular to the surface of the insulating layer 3), it is preferable that the optical length of target light in the insulating layer is smaller than ¼ of L. In the infrared wavelength region, for example, the film thickness t of the insulating layer 3 is preferably equal to or smaller than 200 nm. The optical length is a wavelength of light in a substance, determined by a refractive index or a dielectric constant. In order to form a cavity between the isolated metal 1 and the metal layer 4, the cavity needs to be larger than about two times the value determined from the evanescent wavelength (a skin depth) of the metal.

On the other hand, the metal layer 4 needs to have a thickness in which the incident light and the radiation light cannot be transmitted. As described above, the film thickness of the metal layer 4 is preferably about two times or more of the skin depth of the wavelengths of such light.

In the multilayer structure that has an insulating layer (the insulating layer 3, for example) sandwiched between a periodic pattern of metal layers (the isolated metals 1, for example) and a flat metal layer (the metal layer 4, for example), the surface plasmon resonance and a waveguide mode in the insulating layer occur simultaneously. The waveguide mode in the insulating layer is a mode of the light that is resonant inside the insulating layer. Therefore, the surface plasmon resonance is determined not by the period of the metal layer but by the size of the metal layer. That is, in the case of the multilayer structure according to Embodiment 21 of the present invention, the size L of the metal layer (the isolated metals 1, for example) determines the wavelength of the absorption light.

Further, resonance is generated in the in-plane direction of the metal layer (the isolated metal 1, for example) by sufficiently decreasing the film thickness of the metal layer (the isolated metal 1, for example) relative to the wavelength of the target light, and also by using the waveguide mode in the insulating layer 3 of a small thickness. Therefore, the influence of resonance in a depth direction (a thickness direction) is small. Consequently, it is possible to absorb or detect a wavelength of incident light having small incidence angle dependence and having a larger incidence angle.

As described above, in the electromagnetic wave detector 1100 according to Embodiment 21 of the present invention, the wavelength (the absorption wavelength) of the light which is absorbed out of the incident light is determined by a three-layer structure of the isolated metals 1, the insulating layer 3, and the metal layer 4. Further, a specific polarization angle at which the light is absorbed is selected by a longitudinal direction of the isolated metals 1.

Figure 49:
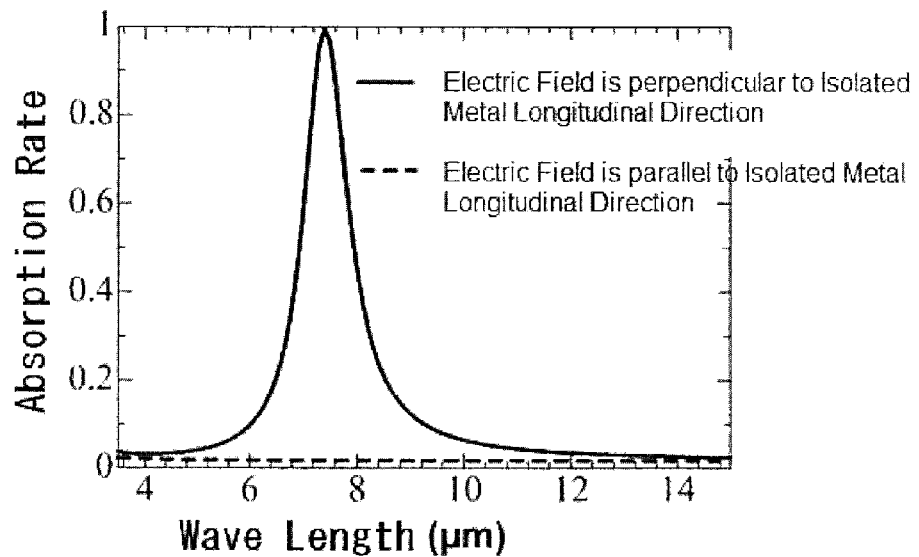
FIG. 49 shows a polarization characteristic in electromagnetic wave absorption of the electromagnetic wave detector according to Embodiment 21 of the present invention.

FIG. 49 is a graph showing absorption characteristics of the electromagnetic wave detector 1100 according to Embodiment 21 of the present invention. The horizontal axis shows a wavelength of incident light, and the vertical axis shows an absorption rate. In the electromagnetic wave detector 1100 used for the electromagnetic field analysis, the isolated metals 1 have a stripe shape and a thickness of 50 nm, and the length L of the short side is 1.0 μm. A thickness of the metal layer 4 is 200 nm. Materials of both the isolated metals 1 and the metal layer 4 are Au. The insulating layer 3 is formed of silicon oxide ($SiO_2$) having a thickness of 100 nm. The period S of the isolated metals 1 was 4.0 The absorption rate when the electric field component of the incident electromagnetic wave is perpendicular to or parallel to the longitudinal direction of the isolated metals 1 was obtained by electromagnetic field analysis.

As can be seen from FIG. 49, when the electric field component of the incident electromagnetic wave is perpendicular to the longitudinal direction of the isolated metals 1, strong absorption occurs, and the absorption wavelength is near 7.5 μm. However, the incident electromagnetic wave having a parallel electric field component is hardly absorbed. In this manner, it is possible to identify the polarization.

Figure 50:
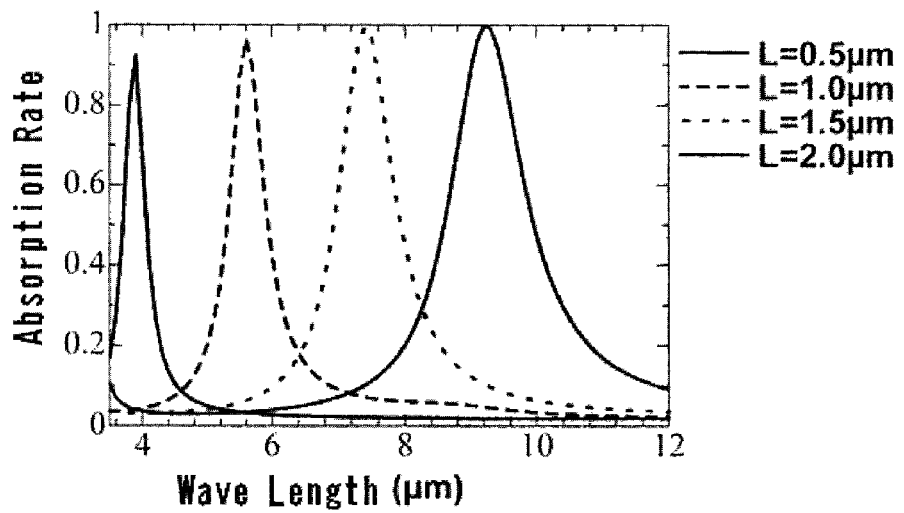
FIG. 50 shows electromagnetic wave absorption characteristics of the electromagnetic wave detector according to Embodiment 21 of the present invention.

Similarly to FIG. 49, FIG. 50 shows absorption characteristics when only the length L of the short side of the isolated metals 1 are changed. Similarly to FIG. 49, the incident electromagnetic wave having a parallel electric field component is hardly absorbed.

As can be seen from FIG. 50, the wavelength of the absorption wave is controlled substantially in proportion to the length L of the isolated metals 1. Because the resonance is determined by the size of the isolated metal 1, the relation between the absorption wavelength and L hardly changes even when the period S is changed.

Figure 51:
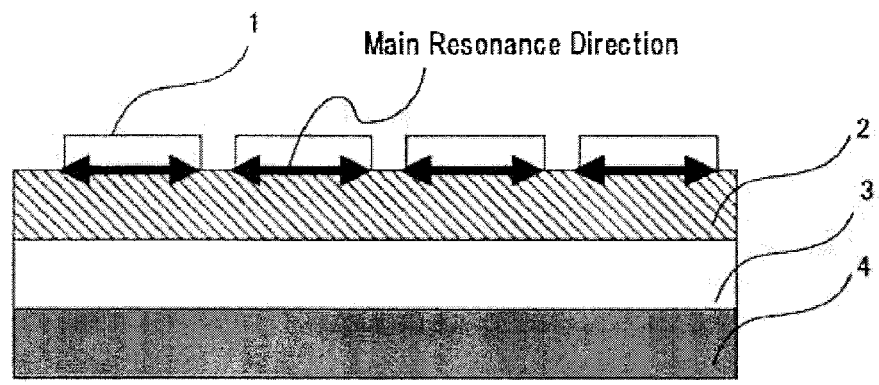
FIG. 51 is a view for explaining surface plasmon resonance according to Embodiment 21 of the present invention.
Figure 52:
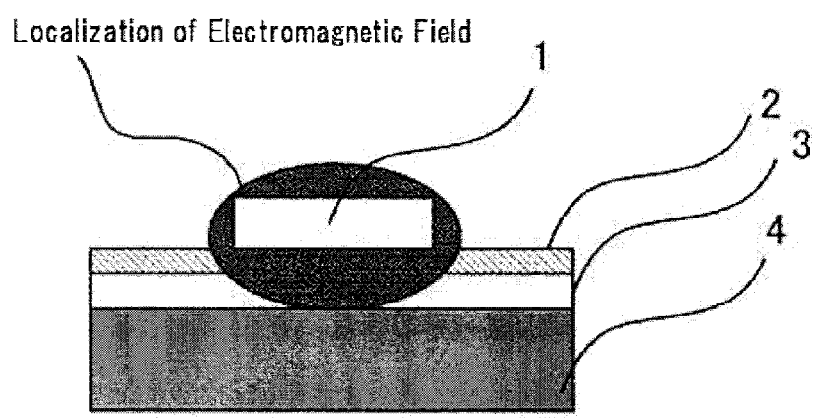
FIG. 52 is a view for explaining surface plasmon resonance according to Embodiment 21 of the present invention.

From these results, it has been verified that main resonance occurs on the plane of the isolated metals 1 in a short L direction as shown in FIG. 51, and that the electromagnetic field is localized near the isolated metals 1 as shown in FIG. 52. However, the period S is set smaller than the absorption wavelength. This is because in wavelength smaller than the period S, the incident electromagnetic wave may be reflected by refraction, and absorption does not occur or becomes weak. That is, sufficient absorption can be obtained when the following relations are satisfied.

$\lambda ab \infty L$ $\lambda ab > S$

As described above, when the isolated metals 1 arranged in a constant period are used, the absorption wavelength becomes larger than the period. Therefore, it becomes possible to minimize the value of the number of frequency×the period that is necessary to achieve sufficient absorption. That is, the size of the electromagnetic wave detector 1100 can be minimized.

In the electromagnetic wave detector 1100, the film thicknesses of the isolated metals 1 and the insulating layer 3 are set to a small level where resonance in the film thickness direction will not occur. However, when these film thicknesses are set large as described above, the surface plasmon resonance occurs also in the film thickness direction of the isolated metals 1 and in the film thickness direction of the insulating layer 3, in addition to the resonance in the in-plane direction of the isolated metals 1, and the resonance becomes three-dimensional. As a result, a change also occurs in the resonance wavelength, and the absorption wavelength changes. On the other hand, when the film thicknesses of the isolated metals 1 and the like are increased, incidence angle dependence of the absorption wavelength occurs. Therefore, for example, when the incidence angle dependence can be ignored as in the case where the incidence angle of the incident light is always in a perpendicular direction, the resonance wavelength can be changed by increasing the film thicknesses of the isolated metals 1 and the insulating layer 3.

As described above, in the electromagnetic wave detector 1100 according to Embodiment 21 of the present invention, the light having the wavelength determined by the size of the isolated metals 1 can be absorbed by the incidence surface. That is, an absorption spectrum can be freely determined, and detection of an arbitrary electromagnetic wave becomes possible.

Next, a manufacturing method of the electromagnetic wave detector 1100 according to Embodiment 21 of the present invention will be described with reference to FIGS. 53A to 53G. FIGS. 53A to 53G are sectional views of a manufacturing process of the electromagnetic wave detector 1100, taken along II-II' in FIG. 44. The manufacturing method includes the following steps 1 to 7.

Figure 53A:
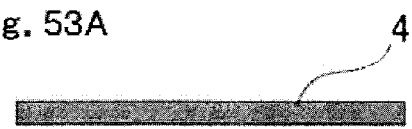
FIGS. 53A to 53G are sectional views of a manufacturing process of the electromagnetic wave detector according to Embodiment 21 of the present invention.

Step 1: As shown in FIG. 53A, the flat metal layer 4 made of Au, Ag, Cu, Al, Ni, Cr, or the like is formed. The metal layer 4 may be formed on a flat substrate of Si or the like, or the metal layer 4 may be independently formed. After the metal layer 4 is formed on a flat substrate of Si or the like, the metal layer 4 may be formed independently by removing the substrate. A portion that is not used as the electromagnetic wave detector may be patterned in an arbitrary shape.

Figure 53E:
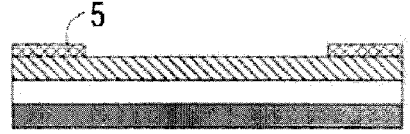
Figure 53B:
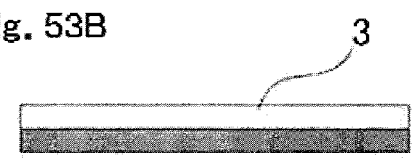

Step 2: As shown in FIG. 53B, the insulating layer 3 made of silicon oxide ($SiO_2$), silicon nitride (SiN), aluminum oxide, nickel oxide, or silicon, for example, is formed on the metal layer 4. In this case, the surface of the insulating layer 3 is preferably formed flat and parallel to the surface of the metal layer 4. A flattening step such as CMP polishing and heat treatment may be implemented.

Figure 53F:
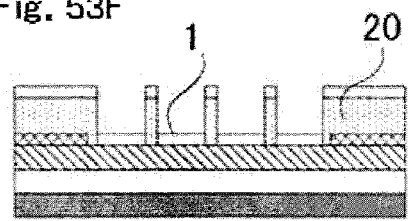
Figure 53C:
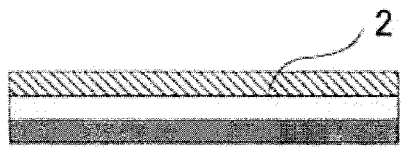

Step 3: As shown in FIG. 53C, the graphene layer 2 is deposited on the insulating layer 3. In this case, the graphene layer 2 may be film-formed by a method such as epitaxial growth, or the graphene layer film-formed in advance may be bonded to the insulating layer 3.

Figure 53G:
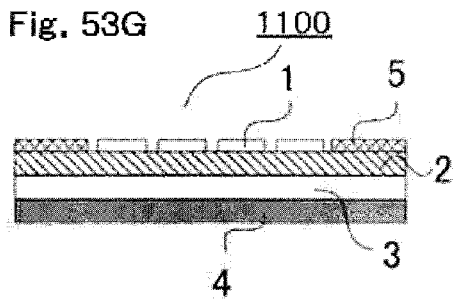
Figure 53D:
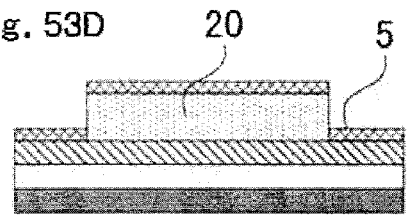

Step 4: As shown in FIG. 53D, a photoresist 20 is formed on the graphene layer 2 by using a method such as photoengraving and EB drawing, and the electrode 5 made of Au, Ag, Cu, Al, Ni, Cr, or the like is deposited on the photoresist 20.

Step 5: As shown in FIG. 53E, the electrodes 5 are formed by lifting off the photoresist 20. In this case, preferably, the electrodes 5 are electrically connected to the graphene layer 2 in a satisfactory state. For this purpose, it is preferable to perform post-processing such as lamp annealing, and pre-processing such as sputter etching and wet processing.

Step 6: As shown in FIG. 53F, the photoresist 20 is formed on the graphene layer 2 by using the method such as photoengraving and EB drawing, and the metal layer made of Au, Ag, Cu, Al, Ni, Cr, or the like is deposited on the photoresist 20.

Step 7: As shown in FIG. 53G, the isolated metals 1 are formed by lifting off the pattern of the photoresist 20.

The electromagnetic wave detector 1100 shown in FIG. 44 and FIG. 45 is completed by the above steps.

Figure 54A:
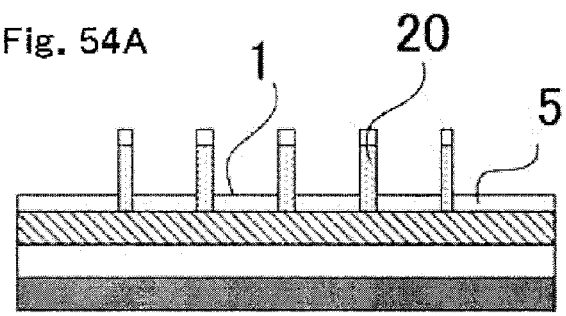
FIGS. 54A and 54B are sectional views of the manufacturing process of the electromagnetic wave detector according to Embodiment 21 of the present invention.
Figure 54B:
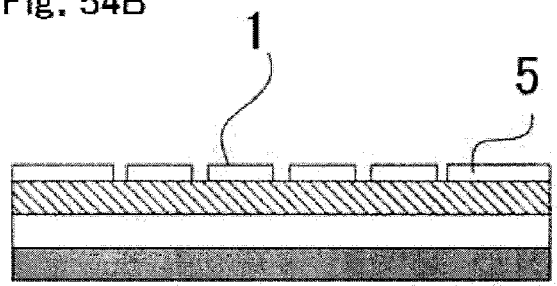
Figure 55A:
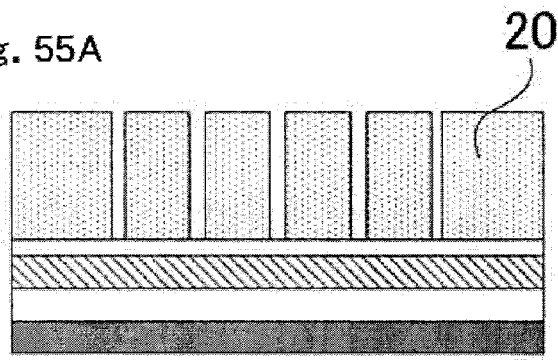
FIGS. 55A and 55B are sectional views of the manufacturing process of the electromagnetic wave detector according to Embodiment 21 of the present invention.
Figure 55B:
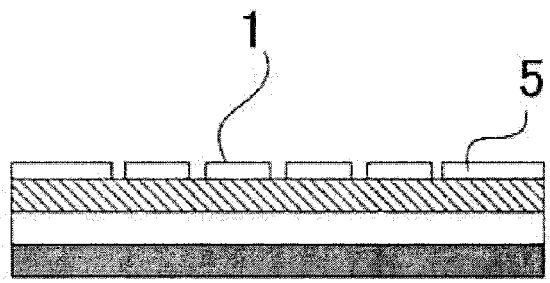

In the present invention, it is sufficient as long as the insulating layer 3 and the graphene layer 2 are formed on the metal layer 4, and the electrodes 5 and the isolated metals 1 are arranged on the graphene layer 2. The manufacturing method is not limited to the steps 1 to 7. For example, as shown in FIGS. 54A and 54B, a metal is deposited on the photoresist 20 which is formed on the graphene layer 2 (FIG. 54A), and the electrodes 5 and the isolated metals 1 may be simultaneously formed by lifting-off (FIG. 54B). Further, as shown in FIGS. 55A and 55B, a metal is deposited on the graphene layer 2, and a pattern of the photoresist 20 is formed on the metal (FIG. 55A). The metal is etched by using the pattern of the photoresist 20 as a mask, and then the electrodes 5 and the isolated metals 1 may be simultaneously formed by removing the photoresist 20 (FIG. 55B).

In the electromagnetic wave detector 1100 according to Embodiment 21 of the present invention, by causing the light to be incident on the isolated metals 1 formed in a stripe shape (a slit shape), only the light having the polarization component in the direction orthogonal to a long-side direction of the isolated metals 1 can be confined around the isolated metals 1. Such light having the specific polarization component is absorbed by the graphene layer 2, and the absorption rate of the light becomes substantially 100% based on light absorption characteristics of the graphene. As a result, the electric resistance value changes. By detecting the change in the electric resistance value with the electrodes 5, the intensity of an arbitrary polarization component and the wavelength component of the incident light can be taken out as an electric signal.

Together with the electromagnetic wave detector 1100, an output amplifier circuit that uses graphene may be provided in an adjacent part or a lower layer part of the electromagnetic wave detector 1100. With this provision, as compared with a transistor made of a generally-used Si semiconductor material, the output amplifier circuit can be configured by a transistor that can operate at a higher speed, and a high-performance electromagnetic wave detector can be realized.

By using graphene for transistors of peripheral circuits such as a reading circuit, high-speed reading and simplification of a manufacturing process become possible.

Embodiment 22

Figure 56A:
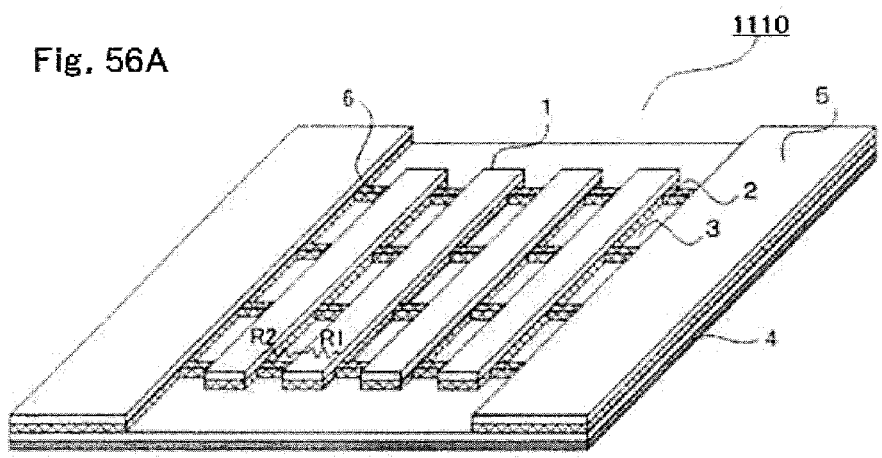
FIGS. 56A and 56B are perspective views of an electromagnetic wave detector according to Embodiment 22 of the present invention.

FIG. 56A is a perspective view of an electromagnetic wave detector 1110 according to Embodiment 22 of the present invention. The electromagnetic wave detector 1110 is different from the electromagnetic wave detector 1100 according to Embodiment 21 in that the graphene layer 2 is not arranged in a sheet shape, but the graphene layer 2 is partly processed to be used as a graphene connection wiring 6. That is, the graphene layer 2 is provided in only lower parts of the isolated metals 1 and the electrodes 5, and in portions of the graphene connection wirings 6 that connect the isolated metals 1 and the electrodes 5.

Figure 56B:
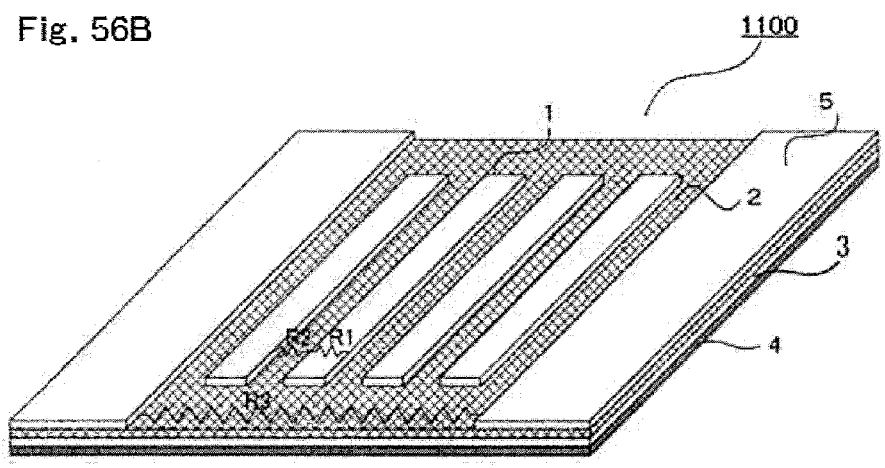

The electromagnetic wave detector 1110 shown in FIG. 56A can be obtained by forming the isolated metals 1, and then removing a part of the graphene layer 2 by a photoengraving step, for example. FIG. 56B is a conceptual view about the electric resistance value that is observed between two electrodes 5, in the electromagnetic wave detector 1100 according to Embodiment 21.

In the electromagnetic wave detector 1100 according to Embodiment 21 shown in FIG. 56B, a resistance value of the graphene layer 2 arranged below the isolated metals 1 is denoted by R1, a resistance value between the isolated metal 1 and the isolated metal 1 is denoted by R2, and a resistance value of a portion where the isolated metals 1 are not arranged is denoted by R3. At this time, when one isolated metal 1 is arranged, a resistance value between the electrodes 5 can be expressed as follows.

$$R = \frac{(R1 + R2)R3}{R3 + R2 + R1}$$

Because only the electric resistance value of the graphene layer 2 near the isolated metals 1 changes according to the light intensity of a specific wavelength, only the term of R1 can be detected as an electric signal. A resistance value change amount for the change in the light intensity (unit W) is as follows.

$$\frac{dR}{dW} = \left(\frac{R3}{R1 + R2 + R3}\right)^2 \frac{dR1}{dW}$$

On the other hand, in the electromagnetic wave detector 1110 according to Embodiment 22 shown in FIG. 56A, when a resistance value of the graphene layer 2 arranged below the isolated metals 1 is denoted by R1 and a resistance value of the graphene connection wiring 6 between the isolated metal 1 and the isolated metal 1 is denoted by R2, a resistance value between the electrodes 5 when one isolated metal 1 is arranged can be expressed as follows.

$$R = R1 + R2$$

Therefore, the following relation is obtained.

$$\frac{dR}{dW} = \frac{dR1}{dW}$$

That is, the electromagnetic wave detector 1110 according to Embodiment 22 shown in FIG. 56A can obtain stronger electric signal intensity to the specific wavelength and the polarization component of the incident light, and the electromagnetic wave detector 1110 having high sensitivity can be obtained.

In Embodiment 22, a shape of the graphene connection wiring 6 is sufficient as long as the graphene layers 2 arranged below the electrodes 5 and the isolated metals 1 are connected to each other, and is not limited to the shape shown in FIG. 56A. For example, the wiring width of the graphene connection wirings 6 may be increased, or a plurality of thin graphene connection wirings 6 may be set.

In Embodiment 22, the graphene connection wirings 6 are formed by processing the graphene layer 2. However, it is sufficient as long as the graphene layers 2 arranged below the electrodes 5 and the isolated metals 1 are connected to each other. A wiring layer other than the graphene layer 2 may also be separately formed.

Figure 57:
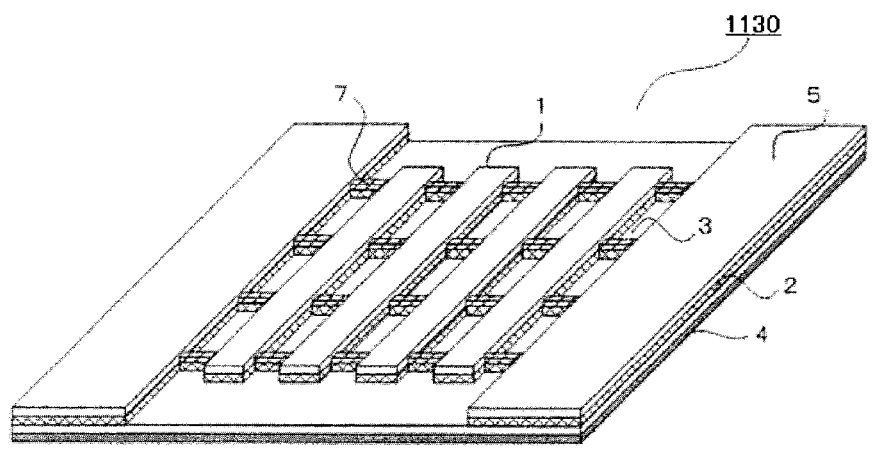
FIG. 57 is a perspective view of an electromagnetic wave detector according to Embodiment 22 of the present invention.

FIG. 57 is a perspective view of another electromagnetic wave detector according to Embodiment 22 of the present invention, the whole electromagnetic wave detector being denoted by 1130. In the electromagnetic wave detector 1130, a graphene connection wiring protection film 7 is provided on the graphene connection wiring 6. The graphene connection wiring protection film 7 is made of a silicon nitride film or a silicon oxide film, for example.

By providing the graphene connection wiring protection film 7 in this manner, the graphene connection wiring 6 can be stably formed. In addition, the graphene connection wiring 6 can be protected from a physical influence from the surrounding. Therefore, the electromagnetic wave detector 1130 in a satisfactory state can be obtained.

Embodiment 23

Figure 58:
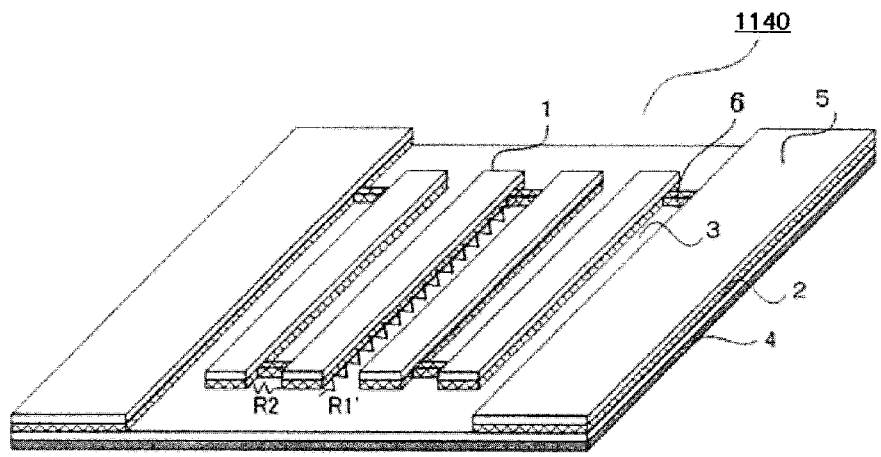
FIG. 58 is a perspective view of an electromagnetic wave detector according to Embodiment 23 of the present invention.

FIG. 58 is a perspective view of an electromagnetic wave detector according to Embodiment 23 of the present invention, the whole electromagnetic wave detector being denoted by 1140. In the electromagnetic wave detector 1140, the isolated metals 1 and the graphene connection wiring 6 are connected in series, and a current is applied toward the long-side direction of the isolated metals 1. In the electromagnetic wave detector 1140, a resistance value in the long-side direction of the graphene layer 2 arranged below the isolated metals 1 is denoted by R1', and a resistance value of the graphene connection wiring 6 between the isolated metal 1 and the isolated metal 1 is denoted by R2'. When n isolated metals 1 are connected in series, a resistance value R between the electrodes 5 can be expressed as follows.

$$R = n \times R1' + n \times R2$$

Therefore, the following relation is obtained.

$$\frac{dR}{dW} = n \frac{dR1'}{dW}$$

R1' is sufficiently high as compared with the resistance value R1 in the short-side direction of the graphene layer 2, and the temperature change rate of the graphene layer 2 has the same values in the long-side direction and the short-side direction. As a result, a temperature change amount must be large. That is, the electromagnetic wave detector 1140 according to Embodiment 23 can obtain strong electric signal intensity to the specific wavelength and the polarization component of the incident light, and the electromagnetic wave detector 1140 having high sensitivity can be obtained.

Embodiment 24

Figure 59:
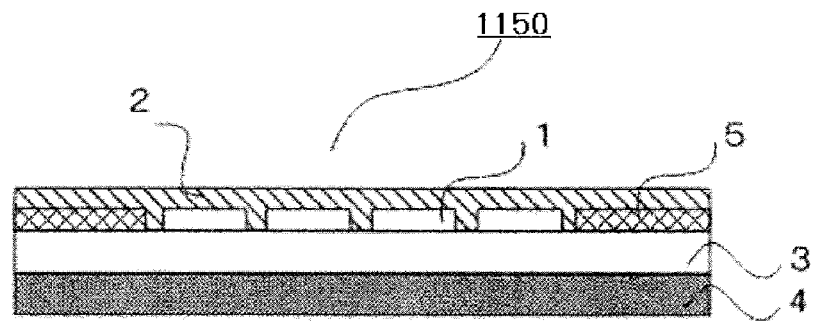
FIG. 59 is a sectional view of an electromagnetic wave detector according to Embodiment 24 of the present invention.

FIG. 59 is a sectional view of an electromagnetic wave detector according to Embodiment 24 of the present invention, the whole electromagnetic wave detector being denoted by 1150. The electromagnetic wave detector 1150 is different from the electromagnetic wave detector 1100 in that the graphene layer 2 is arranged above the isolated metals 1 and the electrodes 5 while the electromagnetic wave detector 100 has the graphene layer 2 arranged below the isolated metals 1 and the electrodes 5. The electromagnetic wave detector 1150 according to Embodiment 24 is obtained by forming the metal layer 4, the insulating layer 3, the electrodes 5, and the isolated metals 1, and then forming the graphene layer 2 by epitaxial growth, for example. Alternatively, graphene may be formed by transferring in advance the graphene that is film-formed by CVD on a copper foil or the like. Optical characteristics of the electromagnetic wave detector 1150 are equivalent to those already described in Embodiment 1, and therefore will not be described herein.

The graphene layer 2 has a possibility of generating a defect as the process proceeds such as the photoengraving step and etching steps of dry etching and wet etching. However, in the manufacturing process according to Embodiment 24, the formation of such a defect can be ignored because the graphene layer 2 is formed last. That is, there is no constraint such as a need for avoiding an additional step of protecting the graphene layer 2 with the resist and the like and a step of not causing damage to the graphene layer 2. Therefore, there is an effect that the preparation becomes simple, and the graphene layer 2 can be maintained in high quality.

Further, the graphene layer 2 can be formed as a high-quality film by epitaxial growth utilizing an atom structure of a metal film surface. Accordingly, the electromagnetic wave detector 1150 having satisfactory characteristics can be obtained, and the electromagnetic wave detector 1150 that obtains electric signal intensity to the specific wavelength and the polarization component of the incident light can be obtained.

Figure 60:
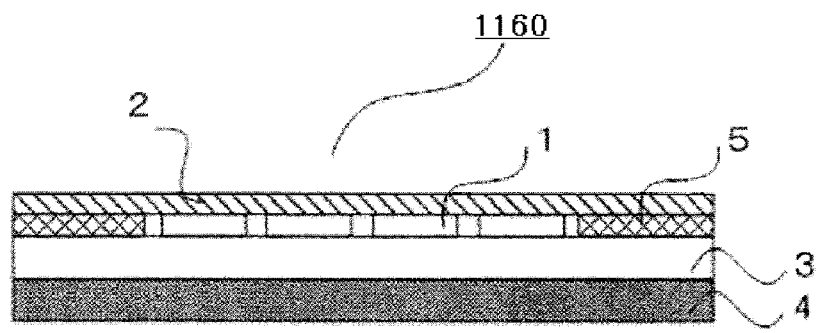
FIG. 60 is a sectional view of an electromagnetic wave detector according to Embodiment 24 of the present invention.

FIG. 60 is a sectional view of another electromagnetic wave detector according to Embodiment 24 of the present invention, the whole electromagnetic wave detector being denoted by 1160. The electromagnetic wave detector 1160 is manufactured by forming the metal layer 4, the insulating layer 3, the electrodes 5, and the isolated metals 1, and then bonding the separately-prepared graphene layer 2 to the isolated metals 1. At this time, preferably, the graphene layer 2 and the electrodes 5 are satisfactorily electrically connected. Preferably, post-processing such as lamp annealing and pre-processing such as sputter etching and wet processing are performed.

Preferably, the interval between the isolated metals 1 and the graphene layer 2 is small. This is because when the interval between the isolated metals 1 and the graphene layer 2 is smaller, confined light can be efficiently absorbed. However, when the sensitivity is sufficient, the graphene layer 2 and the isolated metals 1 do not need to be in complete contact with each other.

Figure 61:
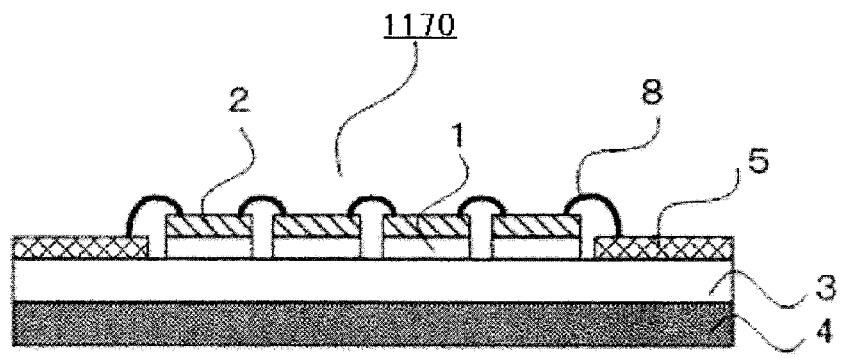
FIG. 61 is a sectional view of an electromagnetic wave detector according to Embodiment 24 of the present invention.

FIG. 61 is a sectional view of another electromagnetic wave detector according to Embodiment 25 of the present invention, the whole electromagnetic wave detector being denoted by 1170. In the electromagnetic wave detector 1170, electric connection between the electrode 5 and the graphene layer 2 on the isolated metal 1, and electric connection between the graphene layers 2 on the isolated metals 1 are performed by a connection wiring 8 other than the graphene layer 2 such as a metal film and a wire bond.

Embodiment 25

Figure 62:
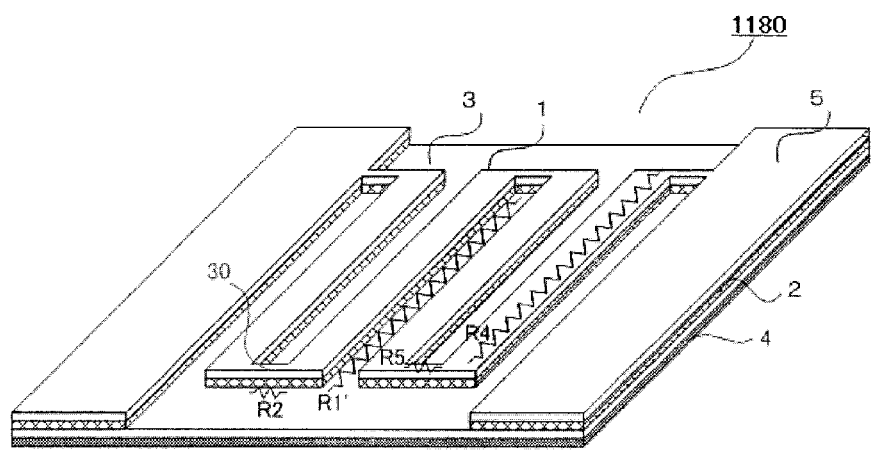
FIG. 62 is a perspective view of an electromagnetic wave detector according to Embodiment 25 of the present invention.

FIG. 62 is a perspective view of an electromagnetic wave detector according to Embodiment 25 of the present invention, the whole electromagnetic wave detector being denoted by 1180. The electromagnetic wave detector 1180 is different from the electromagnetic wave detector 1100 in that the electromagnetic wave detector 1180 has a metal pattern 30 of connection between the isolated metal 1 and the electrodes 5.

In the electromagnetic wave detector 1180, below the metal pattern 30, the isolated metal 1 is processed to prevent deterioration of crystallinity generated in the graphene layer 2.

In the electromagnetic wave detector 1180, a resistance value in the long-side direction of the graphene layer 2 arranged below the isolated metals 1 is denoted by R1', and a resistance value of the graphene connection wiring 6 between the isolated metal 1 and the isolated metal 1 is denoted by R2, a resistance value of the isolated metals 1 is denoted by R4, and a resistance value between the isolated metals 1 is denoted by R5. At this time, when one isolated metal 1 is arranged, a resistance value between the electrodes 5 can be expressed as follows.

$$R = \frac{(R1' + R2)(R4 + R5)}{R1' + R2 + R4 + R5}$$

Because the sheet resistance of the graphene layer 2 is sufficiently small as compared with the sheet resistance of the isolated metal, the following approximation is established.

$$R \cong \frac{(R1' + R2)(R4 + R5)}{(R4 + R5)}$$
$$= R1' + R2$$

Because only the electric resistance value of the graphene layer 2 arranged near the isolated metals 1 changes according to the light intensity of the specific polarization component, only the term of R1' can be detected as an electric signal. A resistance value change amount for the change in the light intensity (unit W) is as follows.

$$\frac{dR}{dW} = \frac{dR1'}{dW}$$

As a result, it can be understood that the electric characteristic change amount of the specific wavelength and the polarization component of the incident light do not change regardless of presence or absence of a pattern of connection between the isolated metal 1 and the electrode 5.

In the electromagnetic wave detector 1180, by providing the metal pattern 30, the graphene connection wiring 6 can be stably formed, and the electromagnetic wave detector 1180 in a satisfactory state can be obtained by preventing a physical influence from the surrounding.

Embodiment 26

Figure 63:
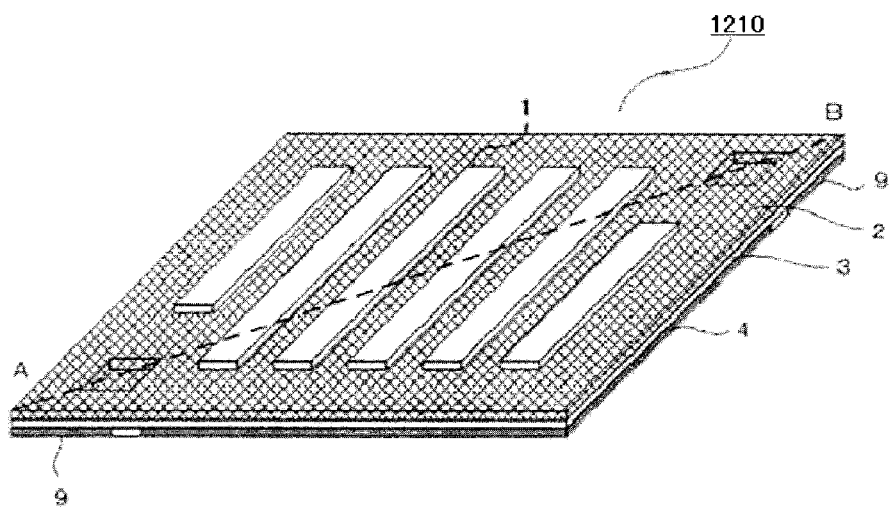
FIG. 63 is a perspective view of an electromagnetic wave detector according to Embodiment 26 of the present invention.
Figure 64:
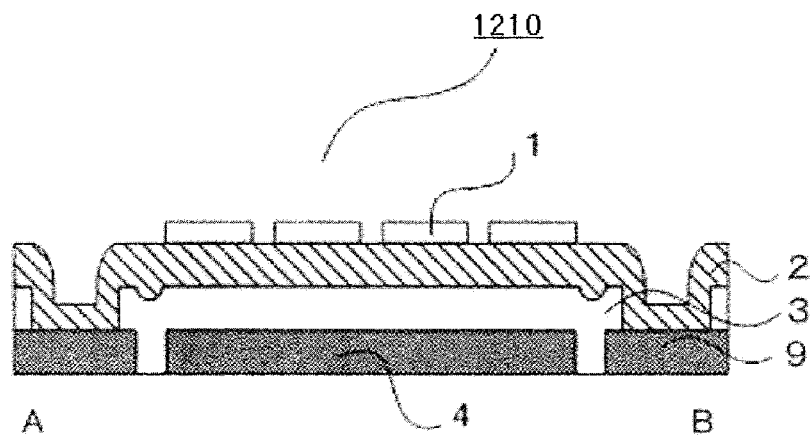
FIG. 64 is a sectional view of an electromagnetic wave detector according to Embodiment 26 of the present invention.

FIG. 63 is a perspective view of an electromagnetic wave detector according to Embodiment 26 of the present invention, the whole electromagnetic wave detector being denoted by 1210. FIG. 64 is a sectional view of the electromagnetic wave detector 1210 taken along A-B in FIG. 63.

In the electromagnetic wave detector 1210 according to Embodiment 26, a lower-metal layer utilization wiring 9 is manufactured by separating a part of the metal layer 4 by patterning. Further, the graphene layer 2 and the lower-metal layer utilization wiring 9 are electrically connected to each other, by providing a contact hole in the insulating layer 3 on the lower-metal layer utilization wiring 9.

In the electromagnetic wave detector 1210 according to Embodiment 26, processing steps after film-forming the graphene layer 2 can be decreased. It is possible to reduce deterioration of crystallinity of the graphene layer 2 that occurs at each time the photoengraving step and steps such as dry etching and wet etching are performed. By decreasing the number of manufacturing steps, manufacturing cost can be lowered, and detection sensitivity to the incident light having a specific polarization component and specific wavelength component can be maintained.

Embodiment 27

Figure 65:
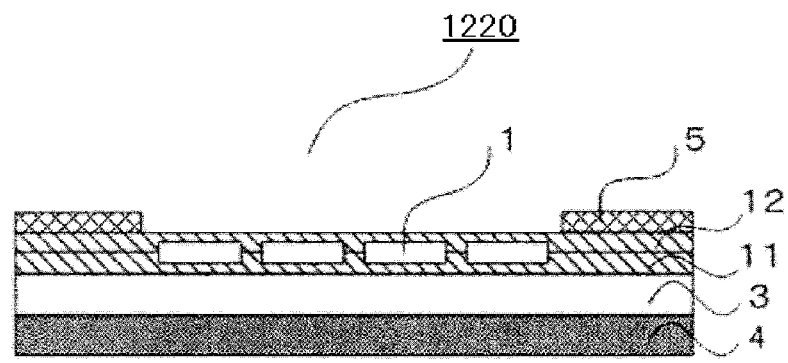
FIG. 65 is a sectional view of an electromagnetic wave detector according to Embodiment 27 of the present invention.

FIG. 65 is a perspective view of an electromagnetic wave detector according to Embodiment 27 of the present invention, the whole electromagnetic wave detector being denoted by 1220. In the electromagnetic wave detector 1220, the first graphene layer 11 is provided below the isolated metals 1, and the second graphene layer 12 is provided above the isolated metals 1. Other structures are the same as those of the electromagnetic wave detector 1100.

In the electromagnetic wave detector 1220, a plurality of graphene layers (two layers of the first graphene layer 11 and the second graphene layer 12) are arranged on the periphery of the isolated metals 1. Therefore, the optical absorption rate can be improved, and a change amount in the electric characteristics of the light having a specific polarization component and a specific wavelength component can be increased.

Embodiment 28

Figure 66:
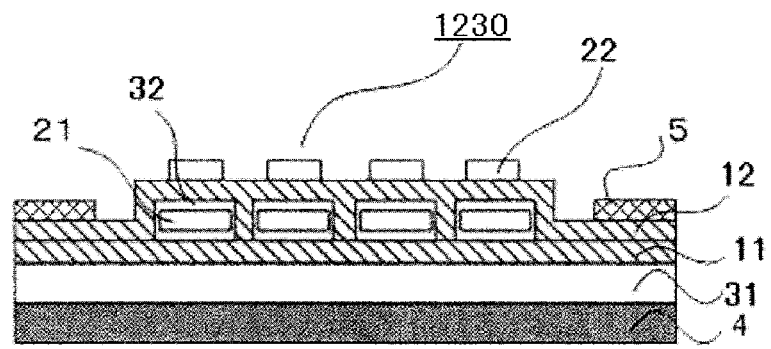
FIG. 66 is a sectional view of an electromagnetic wave detector according to Embodiment 28 of the present invention.

FIG. 66 is a sectional view of an electromagnetic wave detector according to Embodiment 28 of the present invention, the whole electromagnetic wave detector being denoted by 1230. In the electromagnetic wave detector 1230, there are arranged in order on the metal layer 4, the first insulating film 31, the first graphene layer 11, the first isolated metal 21 covered with the second insulating film 32, the second graphene layer 12, and the second isolated metal 22.

That is, in the electromagnetic wave detector 1230, the second isolated metal 22, the second insulating film 32, and the first isolated metal 21 have a multilayer structure in which an insulating layer is sandwiched between a periodic pattern of metal layers and a flat metal layer. Therefore, when light is incident from above the second isolated metal 22, surface plasmon resonance and a waveguide mode in the insulating layer occur simultaneously. By this action, a specific wavelength and a polarization component of the incident light attributable to the size of the second isolated metal 22 are absorbed by the second graphene layer 12.

Next, the first isolated metal 21, the first insulating film 31, and the metal layer 4 have a multilayer structure in which an insulating layer is sandwiched between a periodic pattern of metal layers and a flat metal layer. Surface plasmon resonance and a waveguide mode in the insulating layer occur simultaneously. By this action, a light component of a specific wavelength and polarization attributable to the size of the first isolated metal 21 is absorbed by the first graphene layer 11.

That is, in the electromagnetic wave detector 1230, two specific wavelengths can be absorbed by one patch structure. Further, by forming a plurality of layers instead of two layers in the laminated structure, a photosensor having an arbitrary number of light absorption peaks can be obtained.

Embodiment 29

Figure 67:
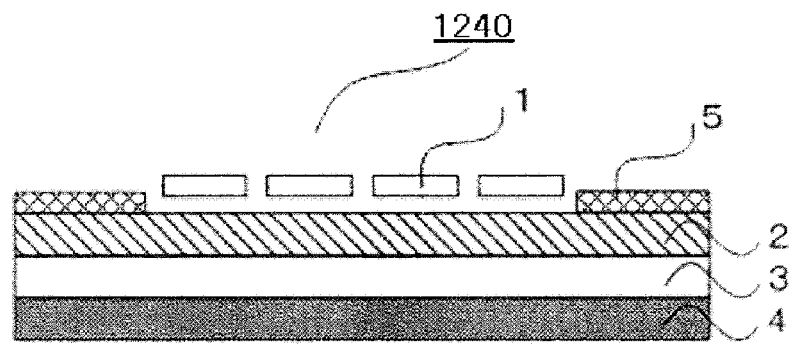
FIG. 67 is a sectional view of an electromagnetic wave detector according to Embodiment 29 of the present invention.

FIG. 67 is a sectional view of an electromagnetic wave detector according to Embodiment 29 of the present invention, the whole electromagnetic wave detector being denoted by 1240. In the electromagnetic wave detector 1240, the isolated metals 1 are formed in a hollow without making contact with the surface of the graphene layer 2. When an optical refraction index of the atmosphere is compared with that of an insulating film, it can be understood that the insulating film has a larger refraction index. In the multilayer structure in which the insulating layer 3 is sandwiched between the periodic pattern of the isolated metals 1 and the flat metal layer 4, the surface plasmon resonance and the waveguide mode in the insulating layer 3 occur simultaneously. The waveguide mode in the insulating layer 3 is a mode of the light that is resonant inside the insulating layer 3. The waveguide mode becomes stronger as the optical refraction index is larger. That is, a light confinement effect in the oxide film is larger on the periphery of the isolated metals 1.

In Embodiment 29, even when the isolated metals 1 are separated from the vicinity of the graphene layer 2, the light confinement effect in the insulating layer hardly changes. Therefore, because the influence of the isolated metals 1 to the photocurrent that flows in the graphene layer 2 becomes small, a higher-speed response becomes possible.

The hollow structure according to Embodiment 29 of the present invention may be formed by holding the isolated metals 1 in a hollow by a structure having a dimension to a degree which does not remarkably deteriorate the light confinement effect of the isolated metals 1. For example, when a structure for hollow the isolated metals 1 in a hollow is formed of the same material as that of the isolated metals 1 above the graphene layer 2 on both ends in the longitudinal direction (a long side) of the isolated metals 1, addition of a large number of steps is not necessary. The hollow structure may be formed by holding the isolated metals 1 in a hollow by a film structure such as an oxide film.

Embodiment 30

Figure 68:
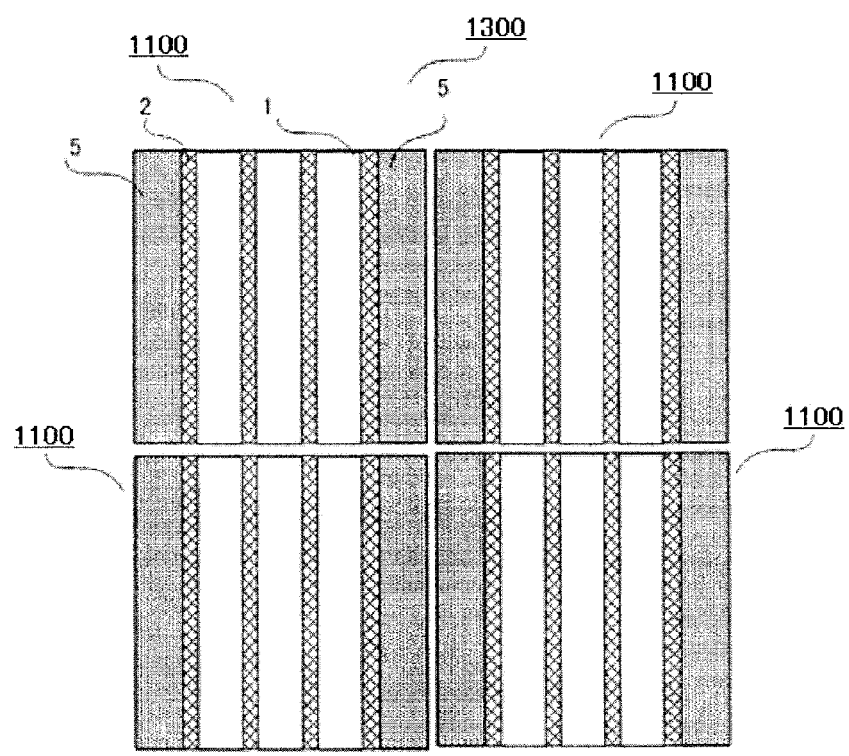
FIG. 68 is a top view of an electromagnetic wave detector array according to Embodiment 30 of the present invention.

FIG. 68 is a top view of an electromagnetic wave detector array according to Embodiment 30 of the present invention, the whole electromagnetic wave detector array being denoted by 1300. The electromagnetic wave detector array 1300 configures an image sensor by arranging, in a one-dimensional or two-dimensional array, a plurality of electromagnetic wave detectors (the electromagnetic wave detector 1100, for example) in which the sizes of the isolated metals 1 are uniform out of the electromagnetic wave detectors described in Embodiments 21 to 30.

With such a configuration, it is possible to obtain an image sensor capable of detecting light intensity of incident light having specific polarity component and a predetermined wavelength component out of incident light. Preferably, on the outside of an electromagnetic wave detector array part, there are set a circuit that reads electric signals obtained from respective electromagnetic wave detectors, a matrix selection circuit, and the like.

Embodiment 31

Figure 69A:
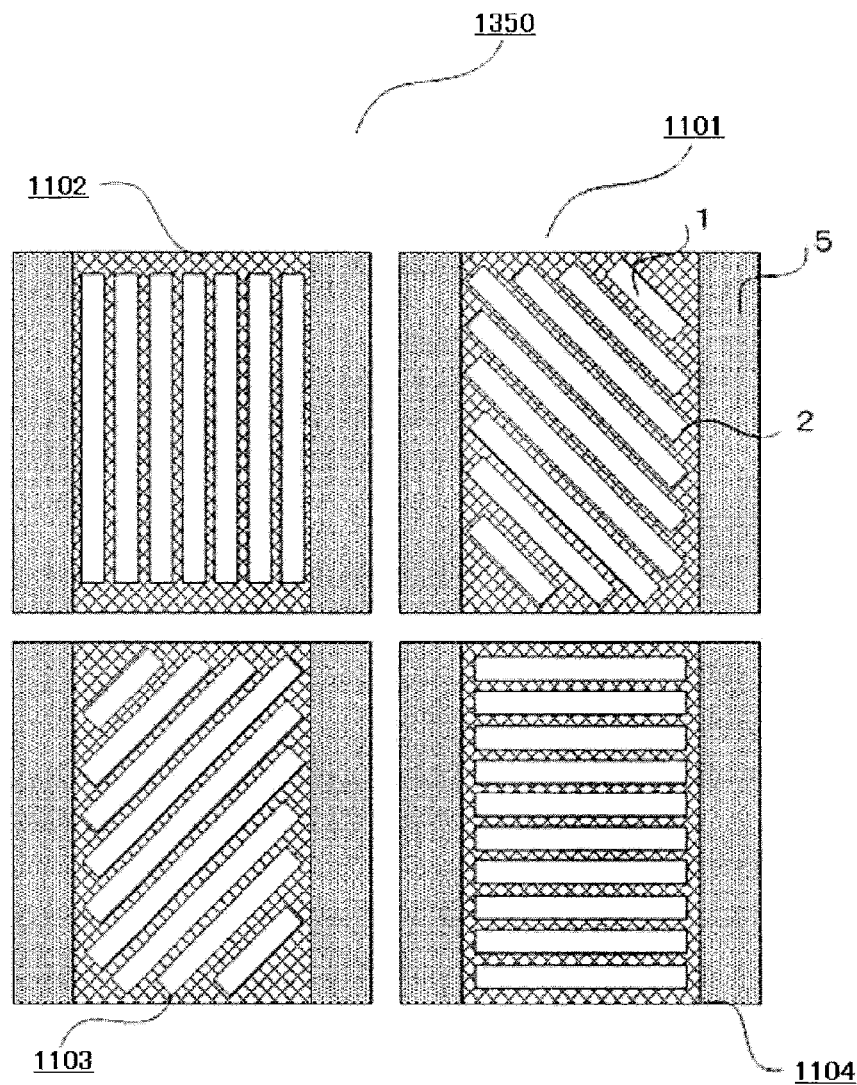
FIG. 69A is a top view of an electromagnetic wave detector array according to Embodiment 31 of the present invention.

FIG. 69A is a top view of an electromagnetic wave detector array according to Embodiment 31 of the present invention, the whole electromagnetic wave detector array being denoted by 1350. The electromagnetic wave detector array 1350 configures an image sensor, by arranging in a one-dimensional or two-dimensional array in a regular state, electromagnetic wave detectors 1101, 1102, 1103, and 1104 that are formed by differentiating angles (in a longitudinal direction) of the isolated metals 1, out of the electromagnetic wave detectors described in Embodiments 21 to 29. As shown in FIG. 69A, arrangement of the isolated metals 1 in a stripe shape are in four directions (0°, 45°, 90°, and 135°), each different by 45°.

Figure 69B:
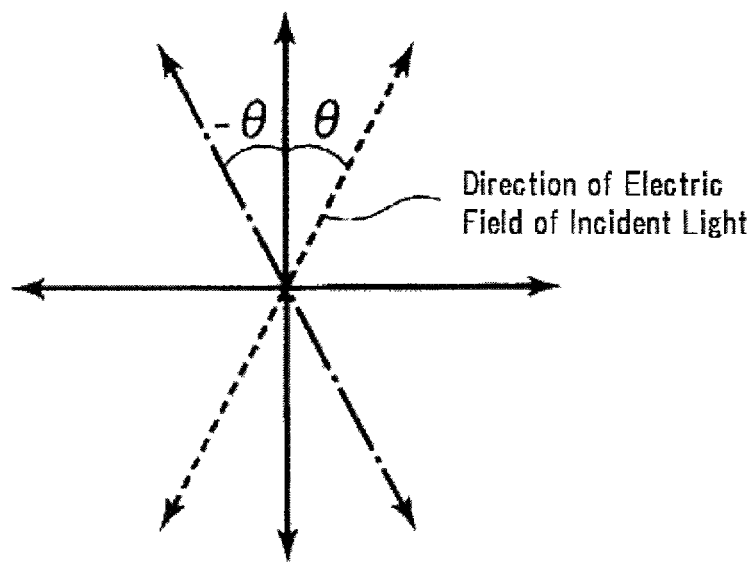
FIG. 69B is an explanatory diagram of a polarization angle calculation method in the electromagnetic wave detector array according to Embodiment 31 of the present invention.
Figure 69C:
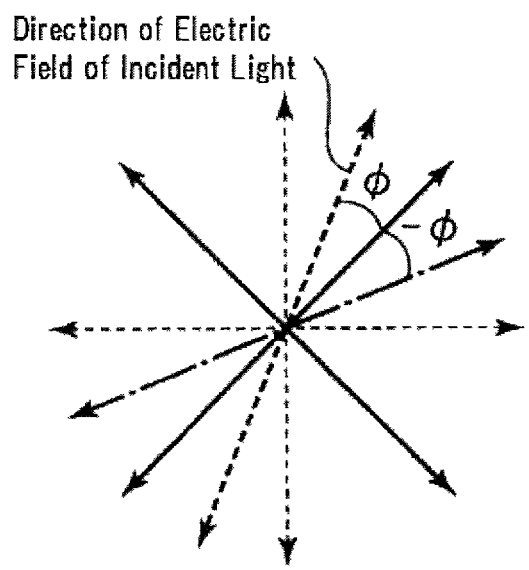
FIG. 69C is an explanatory diagram of the polarization angle calculation method in the electromagnetic wave detector array according to Embodiment 31 of the present invention.

When the four electromagnetic wave detectors 1101, 1102, 1103, and 1104 are configured as one unit, this unit can detect polarization. FIG. 69B and FIG. 69C show a mechanism of the unit. In FIG. 69B and FIG. 69C, as is clear from the symmetry, a polarization angle of the incident light is uniquely determined by an orthogonal coordinate system (indicated by solid lines in FIG. 69B, and by broken lines in FIG. 69C) formed by the electromagnetic wave detectors 1102 and 1104, and an orthogonal coordinate system (indicated by solid lines in FIG. 69C) formed by the electromagnetic wave detectors 1101 and 1103. Therefore, the polarization angle can be obtained by building the following algorithms (1) to (3) into a reading circuit that reads the electric characteristics of the electromagnetic wave detector array 1350 (a thermal infrared sensor).

(1) A polarization angle detected by the electromagnetic wave detectors 1102 and 1104 becomes θ or −θ (see FIG. 69B).

(2) A polarization angle detected by the electromagnetic wave detectors 1101 and 1103 becomes Φ or −Φ (see FIG. 69C).

(3) When 45−φ>0, the polarization angle is θ, and when 45−Φ<0, the polarization angle is −θ.

In this manner, by setting as one unit the four electromagnetic wave detectors forming the one-dimensional period structure that forms different orthogonal coordinate systems, the polarization angle can be obtained without rotating the electromagnetic wave detector array 1350. Similarly, the polarization angle can also be calculated by three arrangements 0°, 45°, and 90°. Accordingly, a plurality of waveforms can be imaged without a polarization filter and a polarization filter drive system which have been conventionally necessary in a generally manufactured CMOS sensor and the like.

Embodiment 32

Figure 70:
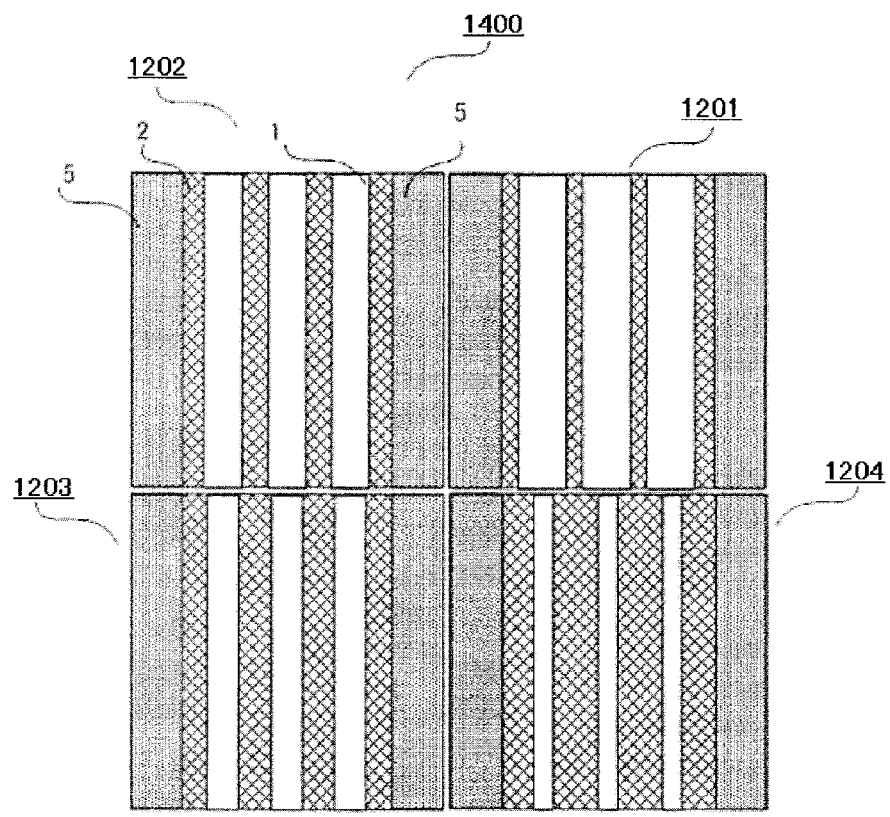
FIG. 70 is a top view of an electromagnetic wave detector array according to Embodiment 32 of the present invention.

FIG. 70 is a top view of an electromagnetic wave detector array according to Embodiment 32 of the present invention, the whole electromagnetic wave detector array being denoted by 1400. An electromagnetic wave detector array sensor configures an image sensor by arranging, in a one-dimensional or two-dimensional array, electromagnetic wave detectors 1201 to 1204 that are formed by changing lengths of the short sides of the isolated metals 1 out of the electromagnetic wave detectors described in Embodiments 21 to 29. Accordingly, decomposition and absorption of multi-wave components in the incident light becomes possible in one electromagnetic wave detector array 1400. Consequently, the electromagnetic wave detector array having wavelength selectivity can be obtained.

Embodiment 33

Figure 71:
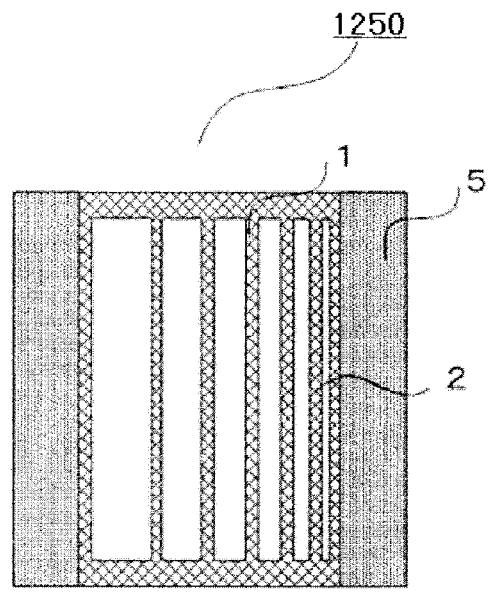
FIG. 71 is a top view of an electromagnetic wave detector according to Embodiment 33 of the present invention.

FIG. 71 is a top view of an electromagnetic wave detector array according to Embodiment 33 of the present invention, the whole electromagnetic wave detector being denoted by 1250. In the electromagnetic wave detector 1250, a plurality of isolated metals 1 having different short-side lengths are arranged in a regular state in the same electromagnetic wave detector, out of the electromagnetic wave detectors described in Embodiments 21 to 29.

In such a structure, light having various wavelength components in a single polarization component can be detected by one electromagnetic wave detector 1250. Accordingly, the electromagnetic wave detector 1250 can be obtained which can detect light intensity of a plurality of kinds of polarization components having an absorption band in the multi-wavelength out of the incident light. As a result, a plurality of waveforms can be imaged without a polarization filter and a polarization filter drive system which have been conventionally necessary in a general CMOS sensor and the like.

Embodiment 34

Figure 72:
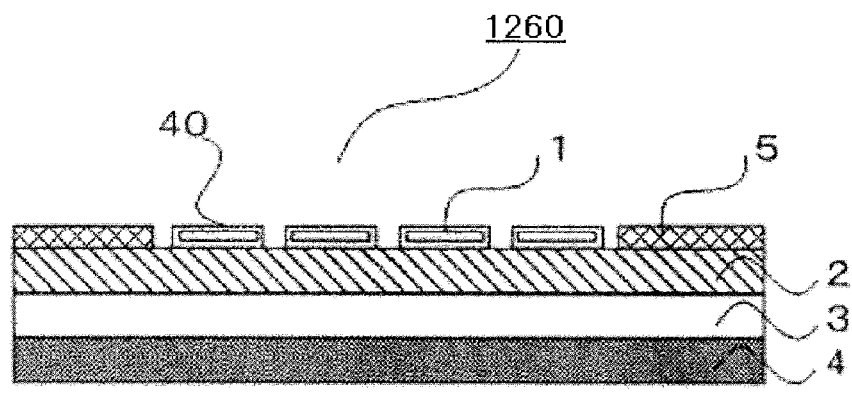
FIG. 72 is a sectional view of an electromagnetic wave detector according to Embodiment 34 of the present invention.

FIG. 72 is a sectional view of an electromagnetic wave detector according to Embodiment 34 of the present invention, the whole electromagnetic wave detector being denoted by 1260. In the electromagnetic wave detector 1260, an isolated metal insulating film 40 is set between the isolated metals 1 and the graphene layer 2, thereby electrically insulating the isolated metals 1 from the graphene layer 2. When the isolated metals 1 are electrically in contact with the graphene layer 2, a potential is generated in the isolated metals 1 at the time of taking out the electric signal from the electrodes 5. This potential has a possibility of giving an influence to the light confinement effect between the isolated metals 1 and the metal layer 4. Because the potential has a fine difference between a plurality of set isolated metals 1, there is a possibility of occurrence of a difference in the light confinement effect between the isolated metals 1. On the other hand, the electromagnetic wave detector 1260 can solve these problems, and the electromagnetic wave detector 1260 with stable detection intensity can be provided.

Embodiment 35

Figure 73:
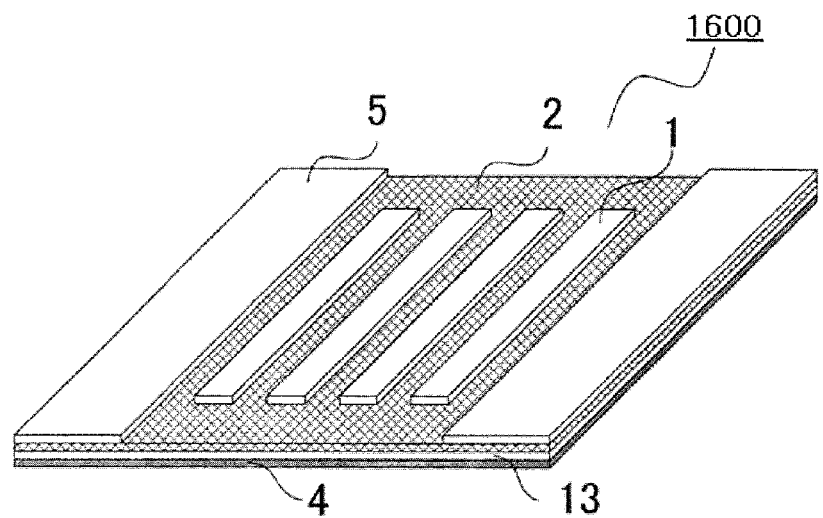
FIG. 73 is a perspective view of an electromagnetic wave detector according to Embodiment 35 of the present invention.
Figure 74:
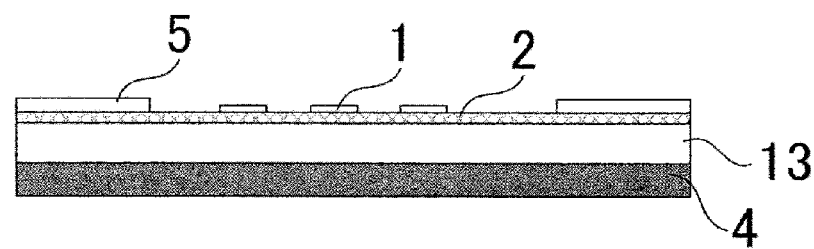
FIG. 74 is a sectional view of the electromagnetic wave detector according to Embodiment 35 of the present invention.

FIG. 73 is a perspective view of an electromagnetic wave detector according to Embodiment 35 of the present invention, the whole electromagnetic wave detector being denoted by 1600, and FIG. 74 is a sectional view of the electromagnetic wave detector 1600.

The electromagnetic wave detector 1600 is different from the electromagnetic wave detector 1100 according to Embodiment 21 of the present invention in that the graphene layer 2 is arranged on the semiconductor layer 13. The graphene layer 2 forms a Schottky junction with the semiconductor layer 13. The electrodes 5 and the graphene layer 2 are electrically connected to each other. The electric circuit for taking out a change in a photocurrent of an external bias and the like is connected to the graphene layer 2 via the electrodes 5. As a reading method of the electric signal, an incident electromagnetic wave can be detected by detecting a current amount change and a voltage value change between the electrodes 5 and the metal layer 4. Interaction of the semiconductor layer 13, the graphene layer 2, and the isolated metals 1 will be described in detail in Embodiment 36.

Embodiment 36

Figure 75:
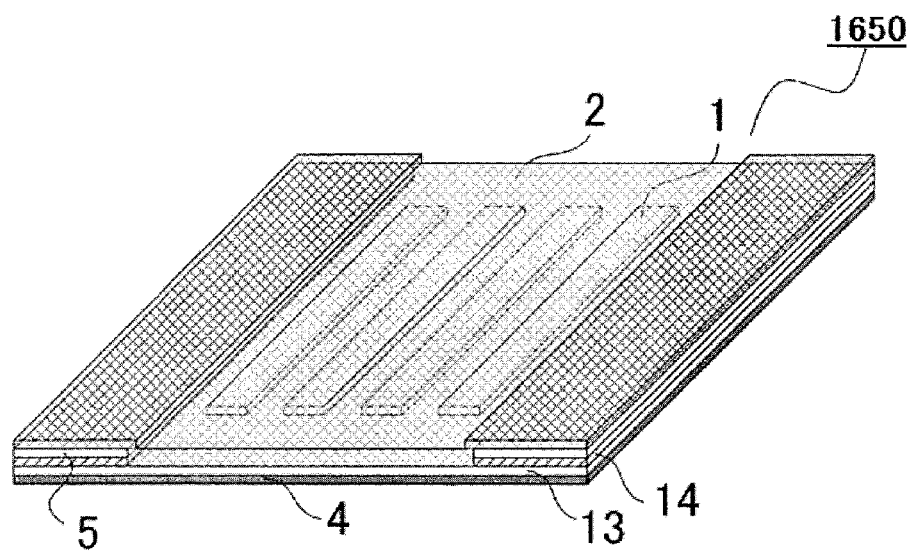
FIG. 75 is a perspective view of an electromagnetic wave detector according to Embodiment 36 of the present invention.
Figure 76:
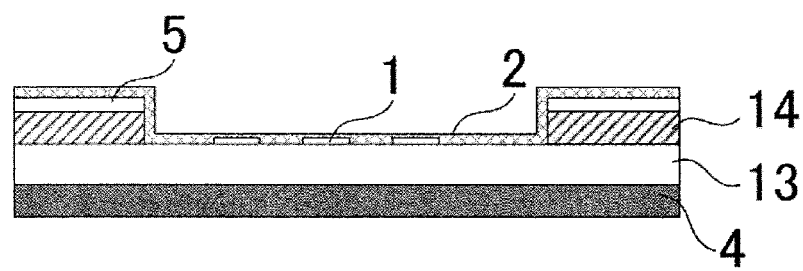
FIG. 76 is a sectional view of the electromagnetic wave detector according to Embodiment 36 of the present invention.

FIG. 75 is a perspective view of an electromagnetic wave detector according to Embodiment 36 of the present invention, the whole electromagnetic wave detector being denoted by 1650, and FIG. 76 is a sectional view of the electromagnetic wave detector 1650.

The electromagnetic wave detector 1650 is different from the electromagnetic wave detector 1100 according to Embodiment 21 of the present invention in that the graphene layer 2 is arranged on the semiconductor layer 13 and the isolated metals 1. Particularly, in the electromagnetic wave detector 1650, after the metal layer 4, the semiconductor layer 13, the insulating layer 14, the electrodes 5, and the isolated metals 1 are formed, the separately-prepared graphene layer 2 is bonded to the top. Therefore, the graphene layer 2 of a satisfactory quality that does not receive the influence of the manufacturing process can be used, and light can be absorbed more highly efficiently.

The graphene layer 2 forms a Schottky junction with the semiconductor layer 13. Preferably, the graphene layer 2 and the electrodes 5 are satisfactorily electrically connected. Preferably, post-processing such as lamp annealing and pre-processing such as sputter etching and wet processing are performed when preparing the graphene layer 2. The electric circuit for taking out a change in a photocurrent of an external bias and the like is connected to the graphene layer 2 via the electrodes 5. For example, as a reading method of the electric signal, an incident electromagnetic wave can be detected by detecting a current amount change and a voltage value change between the electrodes 5 and the metal layer 4.

Interaction of the semiconductor layer 13, the graphene layer 2, and the isolated metals 1 of the electromagnetic wave detector 1650 will be described with reference to FIG. 77. The semiconductor layer 13 is made of silicon herein. A normal thickness of about a few 100 µm for a substrate is assumed as a thickness of silicon. However, the thickness of silicon in this case does not give a large influence to the effect. The thickness h of the isolated metal 1 was 200 nm. FIG. 78 shows a result of obtaining a transmission factor by the electromagnetic field analysis when the length L of one side is 1.0 µm, 1.5 µm, and 2.0 µm, respectively, and when the period S is 3 µm.

FIG. 78 is a graph of the transmission characteristics, obtained by the electromagnetic field analysis, of the electromagnetic wave detector 1650 according to Embodiment 36 of the present invention. The horizontal axis shows a wavelength of incident light, and the vertical axis shows a transmission factor. As can be seen from FIG. 78, attenuation of the transmission factor appears near 10 µm. The attenuation of the transmission factor is due to the plasmon resonance of the isolated metals 1. It can be understood that in the structure in which only the isolated metals 1 are formed on the silicon, the plasmon resonance is determined not by the length S of one side but by the period S. An attenuation rate becomes larger as L becomes large relative to S. This indicates that when L is larger than S, the plasmon resonance is also large. Particularly, this structure is also referred to as a metamaterial because the resonance wavelength is larger than S. Further, in the electromagnetic wave detector 1650, because the plasmon resonance occurs in the isolated metals 1, incidence angle dependence is small. Therefore, the resonance wavelength does not greatly change even when the incidence angle changes.

Figure 77:
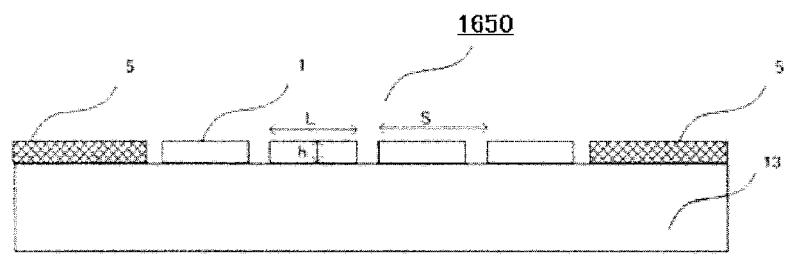
FIG. 77 is a sectional view of the electromagnetic wave detector according to Embodiment 36 of the present invention.
Figure 78:
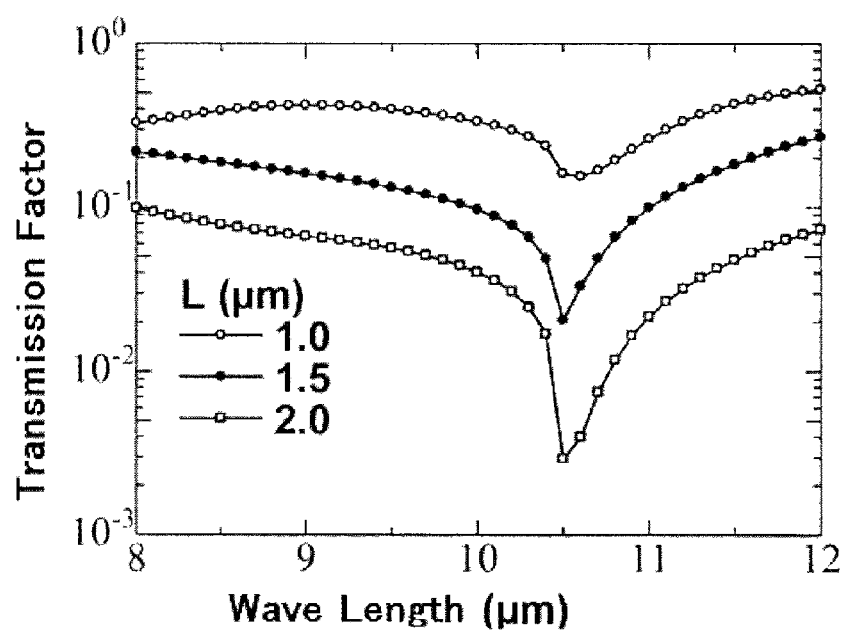
FIG. 78 shows a transmission factor in a structure shown in FIG. 77.
Figure 79:
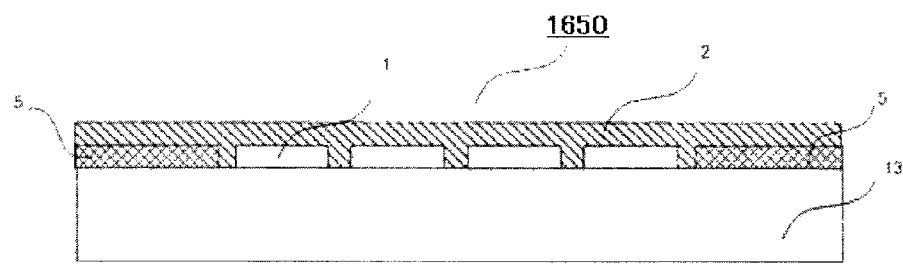
FIG. 79 is a sectional view of a structure obtained by introducing graphene into the structure shown in FIG. 77.
Figure 80:
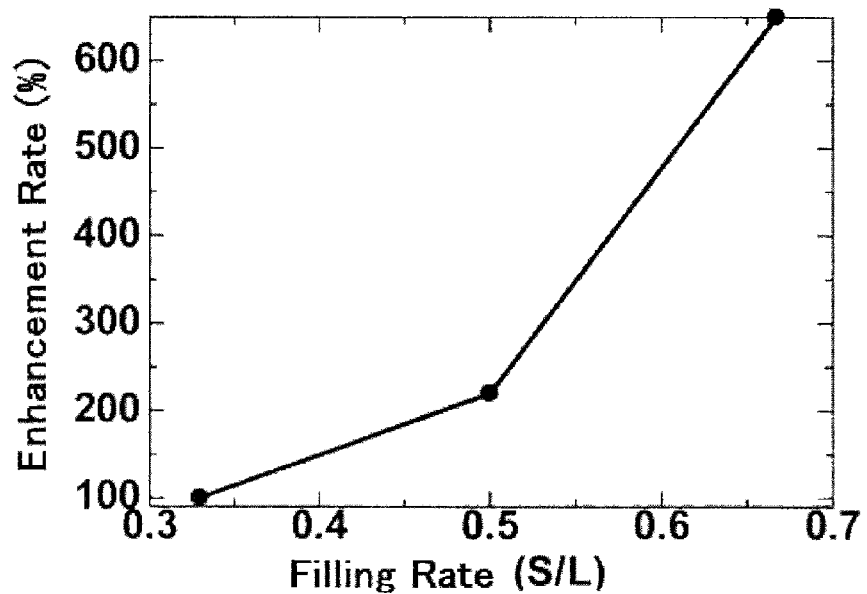
FIG. 80 is a diagram for explaining an enhancement effect of plasmon resonance by graphene.

Next, as shown in FIG. 79, a sample in which the graphene layer 2 is film-formed on the structure shown in FIG. 77 was actually prepared, and the transmission factor was measured. Then, a ratio of the transmission factor in the structure (FIG. 77) in which graphene was film-formed to the transmission factor in the structure (FIG. 79) without graphene (an amplification rate of the transmission factor) was obtained. In FIG. 80, a vertical axis shows an enhancement rate of the transmission factor, and a horizontal axis shows a filling rate (a filling rate is defined as L/S) of the structure.

As can be seen from FIG. 80, when the filling rate L/S is larger, the enhancement effect of the transmission factor becomes large. For example, it can be understood that when the filling factor is equal to or higher than 50%, the enhancement rate is 200% or more. That is, FIG. 80 shows that the plasmon resonance is enhanced when the graphene layer 2 is in contact with the silicon (the semiconductor layer 13). As described above, together with the result of FIG. 78, the enhancement effect by graphene becomes larger as the plasmon resonance is larger. This can be said as the result of interaction between the plasmon resonance and graphene.

As described above, the plasmon resonance is greatly enhanced by using the isolated metals 1, the graphene layer 2, and the semiconductor layer 13. Consequently, detection sensitivity can be increased by using the electromagnetic wave detector 1650 (similarly, the electromagnetic wave detector 1600).

Further, the structure alone in FIG. 73 and FIG. 75 can also be used for on-chip analysis and an analysis filter for refractive index and gas analysis.

Assume that a wave number of the surface plasmon is $k_{sp}$, a dielectric constant of a metal is $\varepsilon_1$, and a dielectric constant of a dielectric substance is $\varepsilon_2$. Then, a dispersion relation of the surface plasmon is generally expressed by the following equation.

$$k_{sp} = \frac{\omega}{c}\sqrt{\frac{\varepsilon_1 \varepsilon_2}{\varepsilon_1 + \varepsilon_2}}$$

In the equation, $\overline{\omega}$ is a frequency, and c is a vacuum optical speed. That is, the equation becomes a resonance condition for exciting the surface plasmon between the dielectric substance and the metal.

As described above, the surface plasmon resonance wavelength is determined by the dielectric constant of the metal and the surrounding medium. That is, because the resonance wavelength sensitively changes depending on the surrounding substance of the isolated metals 1, the surrounding substance can be analyzed. Specifically, the electromagnetic wave detector 1650 can be used for a filter in the analysis of an organic material in a biotechnology field, a gas analysis having a specific absorption peak, and the like.

As described above, the plasmon resonance is enhanced by the interaction between graphene and the plasmon resonance. Therefore, when the electromagnetic wave detector 1650 is used for an on-chip analysis sensor and an analysis transmission filter, there is a significant effect that the sensitivity increases than that of the electromagnetic wave detector having a conventional structure. Particularly, in the structure of the present invention, because the incidence angle dependence is low, the influence to the resonance wavelength is small even when the angle of the incident light changes, and the influence of the object to be analyzed is greatly reflected. Therefore, the analysis precision becomes high as compared with that of the on-chip analysis sensor and the gas analysis transmission filter using the normal surface plasmon. Further, because the mechanism for holding the incidence angle accurately constant is not necessary, the structure can be made compact as the analysis device. Further, the number of assembling steps can be decreased.

Embodiment 37

Figure 81:
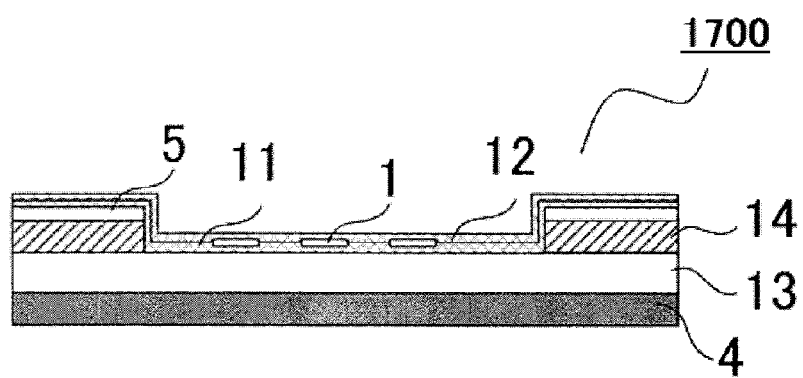
FIG. 81 is a sectional view of an electromagnetic wave detector according to Embodiment 37 of the present invention.

FIG. 81 is a sectional view of an electromagnetic wave detector according to Embodiment 37 of the present invention, the whole electromagnetic wave detector being denoted by 1700. In the electromagnetic wave detector 1700, the first graphene layer 11 is provided below the isolated metals 1, and the second graphene layer 12 is provided above the isolated metals 1. Other structures are the same as those of the electromagnetic wave detector 1600 in Embodiment 35.

In the electromagnetic wave detector 1700 according to Embodiment 37 of the present invention, two graphene layers (the first graphene layer 11 and the second graphene layer 12) are arranged on the periphery of the isolated metals 1. Therefore, the optical absorption rate can be further improved, and a change amount in the electric characteristics of the light having a specific polarization component and a specific wavelength component can be increased.

Embodiment 38

Figure 82:
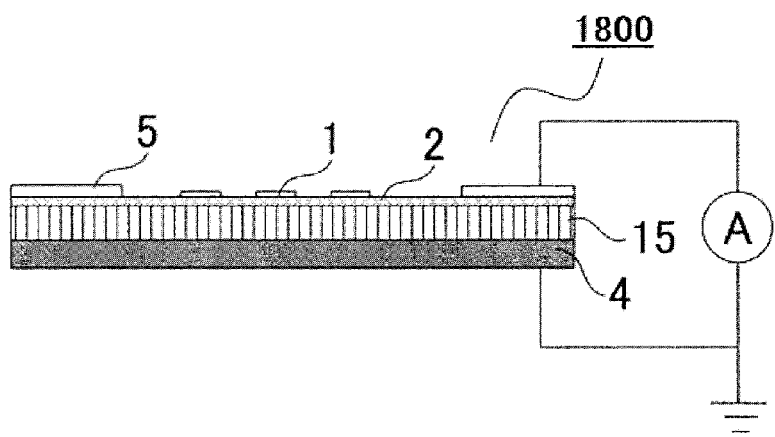
FIG. 82 is a sectional view of an electromagnetic wave detector according to Embodiment 38 of the present invention.

FIG. 82 is a sectional view of an electromagnetic wave detector according to Embodiment 38 of the present invention, the whole electromagnetic wave detector being denoted by 1800.

The electromagnetic wave detector 1800 is different from the electromagnetic wave detector 1100 according to Embodiment 21 in that the graphene layer 2 is arranged on a ferroelectric layer 15. The electrodes 5 and the graphene layer 2 are electrically connected to each other. As ferroelectric materials, PZT ($PbZr_xTi_{1-x}O_3$), SBT ($SrBi_2Ta_2O_9$), and the like are used, and these materials have a polarization characteristic. The ferroelectric materials have a crystalline structure referred to as a perovskite structure, and polarization values change depending on an electric field applied to the ferroelectric materials. The electric field applied to the ferroelectric layer 15 changes depending on a potential change of the graphene layer 2 by incidence of an electromagnetic wave, and the polarization value of the ferroelectric layer 15 changes. By detecting the change in the polarization value, the incident electromagnetic wave can be detected.

To simply show a detection method of the electromagnetic wave, FIG. 82 exemplifies a detection method of measuring a short-circuit current between the electrodes 5 and the metal layer 4. However, other detection method may also be used.

Next, a manufacturing method of the electromagnetic wave detector 1800 according to Embodiment 38 of the present invention will be described with reference to FIGS. 83A to 83G. FIGS. 83A to 83G are sectional views of a manufacturing process of the electromagnetic wave detector 1800, and the manufacturing method includes the following steps 1 to 7.

Figure 83A:
FIGS. 83A to 83G are sectional views of a manufacturing process of the electromagnetic wave detector according to Embodiment 38 of the present invention.

Step 1: As shown in FIG. 83A, the flat metal layer 4 made of Au, Ag, Cu, Al, Ni, Cr, Ti, or the like is formed. The metal layer 4 may be formed on a flat substrate of Si or the like, or the metal layer 4 may be independently formed. After the metal layer 4 is formed on a flat substrate of Si or the like, the metal layer 4 may be formed independently by removing the substrate. A portion that is not used as the electromagnetic wave detector may be patterned in an arbitrary shape.

Figure 83B:
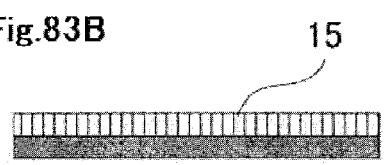

Step 2: As shown in FIG. 83B, the ferroelectric layer 15 made of PZT ($PbZr_xTi_{1-x}O_3$), SBT ($SrBi_2Ta_2O_9$), and the like is formed on the metal layer 4. The ferroelectric layer 15 may be film-formed by any one of a sputtering method, a MOCVD method, a zol-gel method, and an aerosol deposition method. In this case, preferably, a surface of the ferroelectric layer 15 is formed to be flat and parallel to the surface of the metal layer 4. A flattening step such as CMP polishing and heat treatment may also be implemented.

Figure 83C:
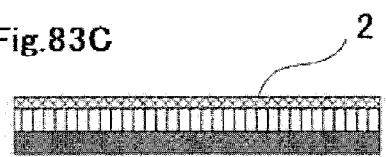

Step 3: As shown in FIG. 83C, the graphene layer 2 is deposited on the insulating layer 3. In this case, the graphene layer 2 may be film-formed by a method such as epitaxial growth, or the graphene layer film-formed in advance may be bonded to the insulating layer 3.

Figure 83D:
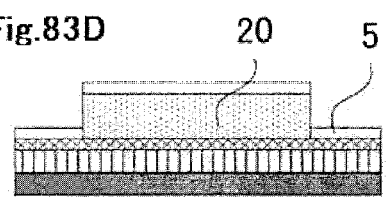

Step 4: As shown in FIG. 83D, the photoresist 20 is formed on the graphene layer 2 by using the method such as photoengraving and EB drawing, and the electrode 5 made of Au, Ag, Cu, Al, Ni, Cr, Ti, or the like is deposited on the photoresist 20.

Figure 83E:

Step 5: As shown in FIG. 83E, the electrodes 5 are formed by lifting off the photoresist 20. In this case, preferably, the electrodes 5 are electrically connected to the graphene layer 2 in a satisfactory state. For this purpose, it is preferable to perform post-processing such as lamp annealing, and pre-processing such as sputter etching and wet processing.

Figure 83F:
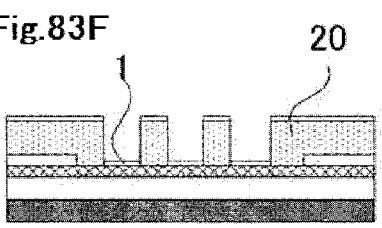

Step 6: As shown in FIG. 83F, the photoresist 20 is formed on the graphene layer 2 by using the method such as photoengraving and EB drawing, and a metal layer made of Au, Ag, Cu, Al, Ni, Cr, Ti, or the like is deposited on the photoresist 20.

Figure 83G:
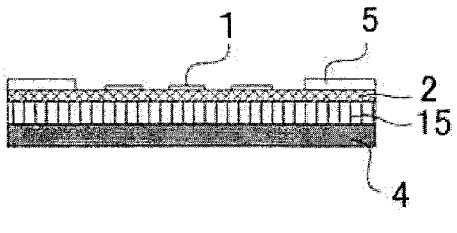

Step 7: As shown in FIG. 83G, the isolated metals 1 are formed by lifting off the pattern of the photoresist 20. The electromagnetic wave detector 1800 shown in FIG. 82 is completed by the above steps.

Embodiment 39

Figure 84:
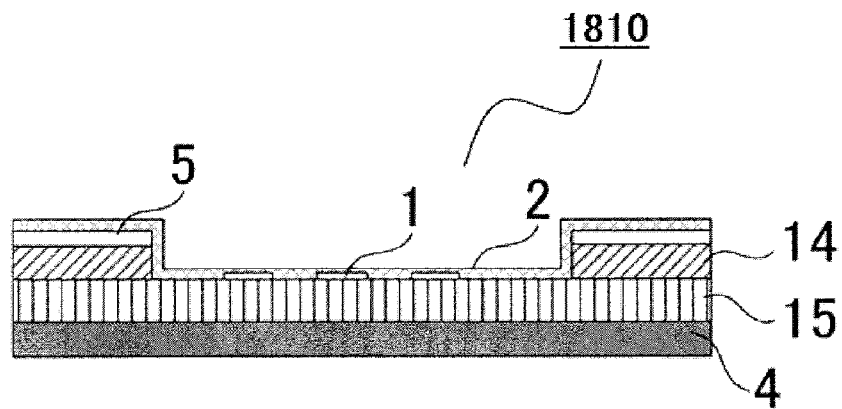
FIG. 84 is a sectional view of an electromagnetic wave detector according to Embodiment 39 of the present invention.

FIG. 84 is a sectional view of an electromagnetic wave detector according to Embodiment 39 of the present invention, the whole electromagnetic wave detector being denoted by 1810.

The electromagnetic wave detector 1810 is different from the electromagnetic wave detector in Embodiment 38 in that the graphene layer 2 is arranged on the ferroelectric layer 15 and the isolated metals. The electromagnetic wave detector 1810 according to the present embodiment is manufactured by forming the metal layer 4, the ferroelectric layer 15, the insulating layer 14, the electrodes 5, and the isolated metals 1, and then bonding the separately-prepared graphene layer 2. Therefore, the electromagnetic wave detector 1810 can use the graphene layer 2 of a satisfactory quality that does not receive the influence of the manufacturing process, and can absorb light more efficiently. Preferably, the graphene layer 2 and the electrodes 5 are satisfactorily electrically connected. Preferably, post-processing such as lamp annealing and pre-processing such as sputter etching and wet processing are performed.

The electric field applied to the ferroelectric layer 15 changes depending on a potential change of the graphene layer 2 by incidence of an electromagnetic wave, and the polarization value of the ferroelectric layer 15 changes. The electromagnetic wave detector 1810 can detect the incident electromagnetic wave by detecting the change in the polarization value.

Embodiment 40

Figure 85:
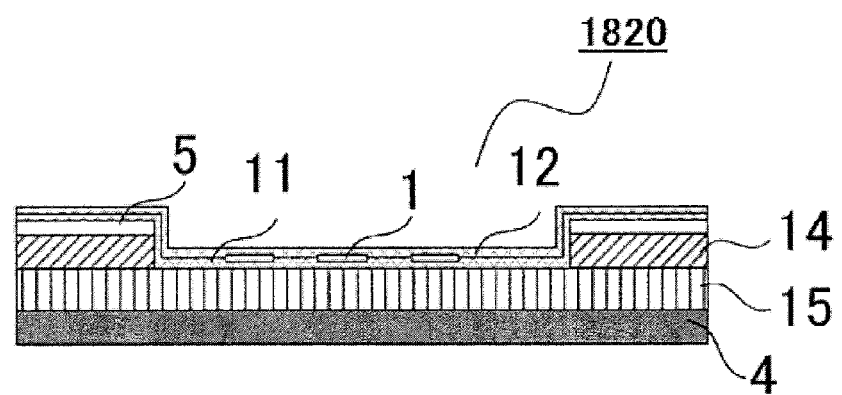
FIG. 85 is a sectional view of an electromagnetic wave detector according to Embodiment 40 of the present invention.

FIG. 85 is a sectional view of an electromagnetic wave detector according to Embodiment 40 of the present invention, the whole electromagnetic wave detector being denoted by 1820.

In the electromagnetic wave detector 1820 according to Embodiment 40 of the present invention, the first graphene layer 11 is provided below the isolated metals 1, and the second graphene layer 12 is provided above the isolated metals 1. Other structures are the same as those of the electromagnetic wave detector 1800 in Embodiment 38. In the electromagnetic wave detector 1820 according to Embodiment 40, two graphene layers (the first graphene layer 11 and the second graphene layer 12) are arranged on the periphery of the isolated metals 1. Therefore, the optical absorption rate can be improved, and a change amount in the electric characteristics of the light having a specific polarization component and a specific wavelength component can be increased.

In the electromagnetic wave detectors 1800, 1810, and 1820 according to Embodiments 38 to 40, when the ferroelectric layer 15 is a monocrystal, a larger change in the polarization value of the ferroelectric layer 15 can be obtained, and the electromagnetic wave detector can have higher sensitivity.

What is claimed is:

1. An electromagnetic wave detector detecting incident light by converting the incident light into an electric signal, the electromagnetic wave detector comprising:
   a flat metal layer formed on a supporting substrate;
   an intermediate layer formed on the metal layer;
   a graphene layer formed on the intermediate layer;
   isolated metals periodically formed on the graphene layer; and
   electrodes arranged oppositely on both sides of the isolated metals, wherein
   depending on a size of a planar shape of each of the isolated metals, light having a predetermined wavelength at which a surface plasmon occurs is determined out of the incident light, and the light having the predetermined wavelength is absorbed to detect a change in the electric signal generated in the graphene layer, and
   the intermediate layer is sandwiched between the isolated metals and the flat metal layer.

2. The electromagnetic wave detector according to claim 1, wherein the intermediate layer is a material for waveguiding surface plasmon resonance, and is made of any of materials of a dielectric substance, a semiconductor, transition metal dichalcogenide, and a ferroelectric substance.

3. The electromagnetic wave detector according to claim 1, wherein the isolated metals are respectively arranged in two-dimensional directions at predetermined periods.

4. The electromagnetic wave detector according to claim 1, wherein
   the isolated metals are arranged in a one-dimensional direction,
   long sides of the isolated metals are arranged parallel to each other so as to absorb only polarization that has an electric field component perpendicular to the long sides of the isolated metals out of the incident light,
   the isolated metals have sizes in which surface plasmon resonance that is resonant to a wavelength of absorbed incident light occurs, and
   the electromagnetic wave detector detects a change in the electric signal generated in the graphene layer by absorbing light having a predetermined wavelength in specific polarization.

5. The electromagnetic wave detector according to claim 1, wherein the graphene layer is two or more layers, and crystal orientations of the layers coincide or do not coincide.

6. The electromagnetic wave detector according to claim 1, wherein the electromagnetic wave detector has a region in which the graphene layer is not formed, in a region other than below the isolated metals.

7. The electromagnetic wave detector according to claim 1, wherein a shape of each of the isolated metals in a plane parallel to an incidence surface of the incident light is circular, square, elliptical, triangular, or rectangular.

8. The electromagnetic wave detector according to claim 1, comprising a plurality of the isolated metals that are different from each other in at least one of a size, a period, a thickness of the isolated metal, and a thickness of the intermediate layer.

9. An electromagnetic wave detector array that has a plurality of the electromagnetic wave detectors according to claim 1 arranged in an array form.

10. The electromagnetic wave detector array according to claim 9, wherein at least two electromagnetic wave detectors are different from each other in at least one of a size, a period, a thickness of the isolated metal, and a thickness of the intermediate layer.

11. The electromagnetic wave detector according to claim 1, wherein the isolated metals are arranged at predetermined periods so as to meet the following conditions:

$$\lambda ab \approx n \times L$$

$$\lambda ab > S$$

where λab is an absorption wavelength, n is a positive real number, L is a length of one side of the isolated metal, and S is a period of the isolated metal.

12. An electromagnetic wave detector detecting incident light by converting the incident light into an electric signal, the electromagnetic wave detector comprising:
a flat metal layer formed on a supporting substrate;
an intermediate layer formed on the metal layer;
isolated metals periodically formed on the intermediate layer;
electrodes arranged oppositely on both sides of the isolated metals; and
a graphene layer formed on the intermediate layer so as to cover the isolated metals and the electrodes, wherein
depending on a size of a planar shape of each of the isolated metals, light having a predetermined wavelength at which surface plasmon occurs is determined among the incident light, and the light having the predetermined wavelength is absorbed to detect a change in the electric signal generated in the graphene layer, and
the intermediate layer is sandwiched between the isolated metals and the flat metal layer.

13. The electromagnetic wave detector according to claim 12, wherein the intermediate layer is a material for waveguiding surface plasmon resonance, and is made of any of materials of a dielectric substance, a semiconductor, transition metal dichalcogenide, and a ferroelectric substance.

14. The electromagnetic wave detector according to claim 12, wherein the isolated metals are respectively arranged in two-dimensional directions at predetermined periods.

15. The electromagnetic wave detector according to claim 12, wherein
the isolated metals are arranged in a one-dimensional direction,
long sides of the isolated metals are arranged parallel to each other so as to absorb only polarization that has an electric field component perpendicular to the long sides of the isolated metals out of the incident light,
the isolated metals have sizes in which surface plasmon resonance that is resonant to a wavelength of absorbed incident light occurs, and
the electromagnetic wave detector detects a change in the electric signal generated in the graphene layer by absorbing light having a predetermined wavelength in specific polarization.

16. The electromagnetic wave detector according to claim 12, wherein the graphene layer is two or more layers, and crystal orientations of the layers coincide or do not coincide.

17. The electromagnetic wave detector according to claim 12, wherein a shape of each of the isolated metals in a plane parallel to an incidence surface of the incident light is circular, square, elliptical, triangular, or rectangular.

18. The electromagnetic wave detector according to claim 12, comprising a plurality of the isolated metals that are different from each other in at least one of a size, a period, a thickness of the isolated metal, and a thickness of the intermediate layer.

19. An electromagnetic wave detector array that has a plurality of the electromagnetic wave detectors according to claim 12 arranged in an array form.

20. The electromagnetic wave detector according to claim 12, wherein the isolated metals are arranged at predetermined periods so as to meet the following conditions:

$$\lambda ab \approx n \times L$$

$$\lambda ab > S$$

where λab is an absorption wavelength, n is a positive real number, L is a length of one side of the isolated metal, and S is a period of the isolated metal.

* * * * *